United States Patent
Iwamoto et al.

(10) Patent No.: US 7,135,944 B2
(45) Date of Patent: Nov. 14, 2006

(54) BRANCHING FILTER HAVING BOTH SAW LADDER AND DUAL MODE FILTERS, AND ELECTRONIC APPARATUS USING THE BRANCHING FILTER

(75) Inventors: Yasuhide Iwamoto, Kawasaki (JP); Shogo Inoue, Kawasaki (JP); Osamu Ikata, Yokohama (JP); Jun Tsutsumi, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 516 days.

(21) Appl. No.: 10/474,513

(22) PCT Filed: Oct. 17, 2002

(86) PCT No.: PCT/JP02/10781

§ 371 (c)(1),
(2), (4) Date: Oct. 22, 2003

(87) PCT Pub. No.: WO03/055067

PCT Pub. Date: Jul. 3, 2003

(65) Prior Publication Data

US 2004/0155730 A1    Aug. 12, 2004

(30) Foreign Application Priority Data

Dec. 21, 2001 (JP) ............................. 2001-390706
May 10, 2002 (JP) ............................. 2002-134770

(51) Int. Cl.
*H03H 9/72* (2006.01)
*H03H 9/64* (2006.01)

(52) U.S. Cl. ..................................... 333/133; 333/193

(58) Field of Classification Search ................ 333/133, 333/193, 195
See application file for complete search history.

(56) References Cited

U.S. PATENT DOCUMENTS

| | | | | |
|---|---|---|---|---|
| 5,859,473 | A | 1/1999 | Ikata et al. | 257/723 |
| 5,874,869 | A | 2/1999 | Ueda et al. | 333/193 |
| 6,150,900 | A | 11/2000 | Kadota et al. | 333/133 |
| 7,038,551 | B1* | 5/2006 | Kearns | 331/133 |
| 2003/0214369 | A1* | 11/2003 | Kearns | 333/133 |
| 2004/0075511 | A1* | 4/2004 | Inoue et al. | 333/133 |

FOREIGN PATENT DOCUMENTS

| | | |
|---|---|---|
| DE | 19818038 | 11/1999 |
| JP | 5-3417 A | 1/1993 |
| JP | 5-167388 A | 7/1993 |
| JP | 7-66679 A | 3/1995 |
| JP | 7-226607 A | 8/1995 |
| JP | 9-321574 A | 12/1997 |

(Continued)

OTHER PUBLICATIONS

International Search Report PCT/ISA/210 dated Nov. 26, 2002.

*Primary Examiner*—Barbara Summons
(74) *Attorney, Agent, or Firm*—Arent Fox PLLC

(57) ABSTRACT

A duplexer includes two surface acoustic wave filter having different band center frequencies, and a phase matching circuit that matches the phases of the two surface acoustic wave filters to each other. In this duplexer, one of the two surface acoustic wave filters is a ladder type surface acoustic wave filter, while the other one of the two surface acoustic wave filters includes two or more dual-mode type surface acoustic wave filters that are connected in parallel.

36 Claims, 41 Drawing Sheets

FOREIGN PATENT DOCUMENTS

| | | |
|---|---|---|
| JP | 10-117123 A | 5/1998 |
| JP | 10-126213 | 5/1998 |
| JP | 10-261936 A | 9/1998 |
| JP | 11-330905 A | 11/1999 |
| JP | 11-340772 A | 12/1999 |
| JP | 2000-49565 | 2/2000 |
| JP | 2000-188522 A | 7/2000 |
| JP | 2000-315936 A | 11/2000 |
| JP | 2000-349591 A | 12/2000 |
| JP | 2001-189639 | 7/2001 |
| JP | 448616 B | 8/2001 |
| JP | 449965 B | 8/2001 |
| JP | 2001-308672 | 11/2001 |
| JP | 2001-320260 A | 11/2001 |

\* cited by examiner

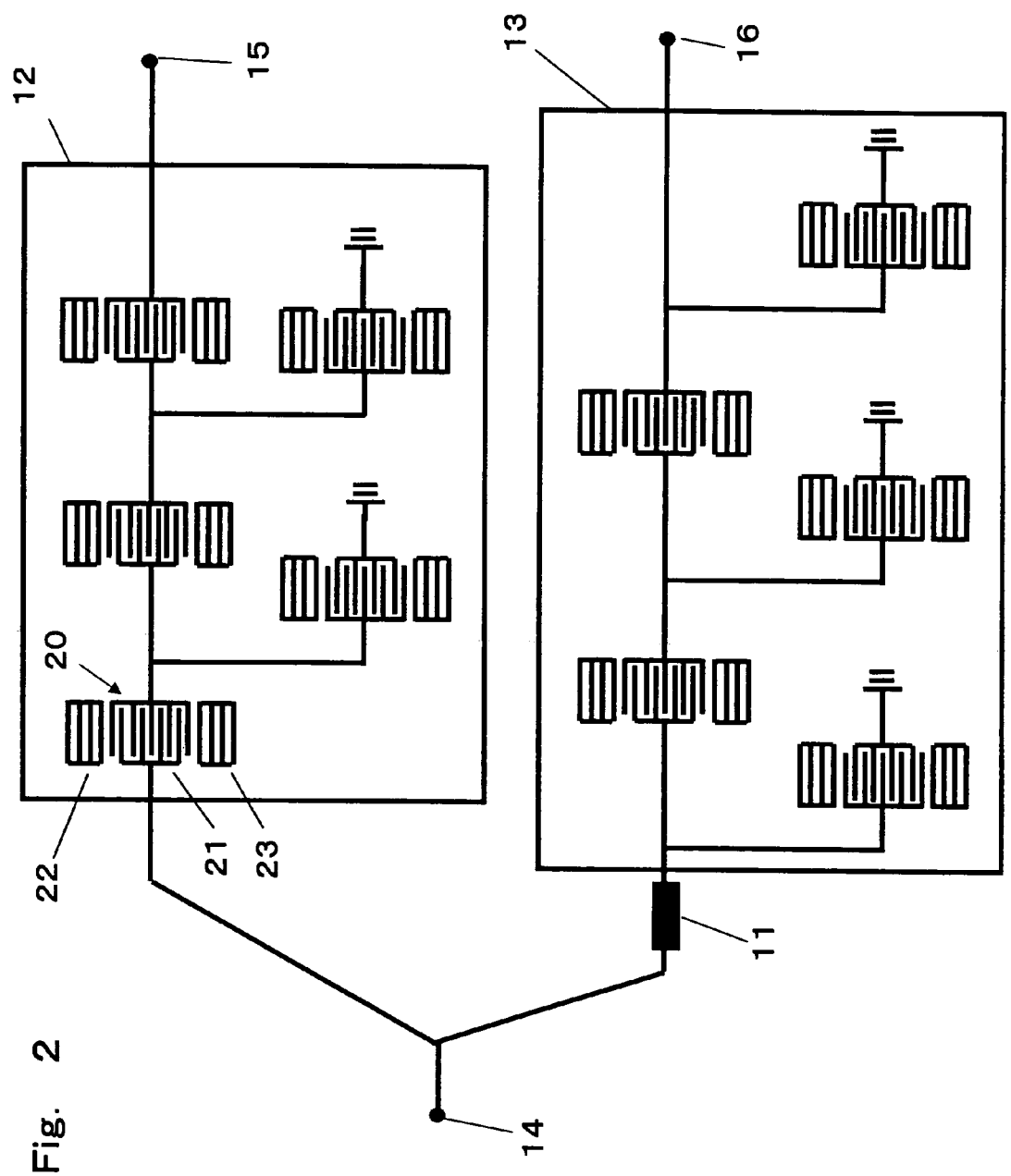

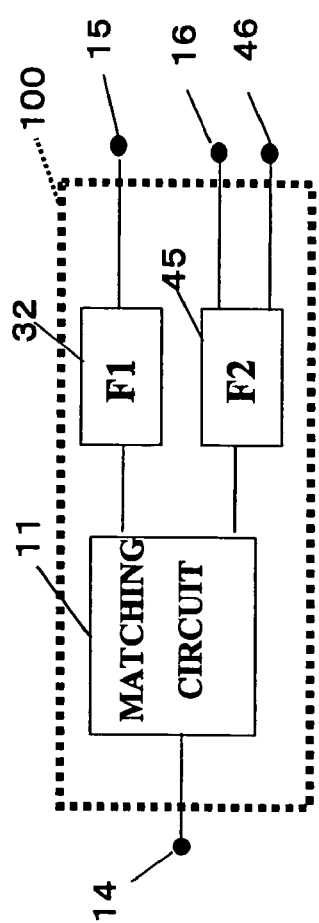
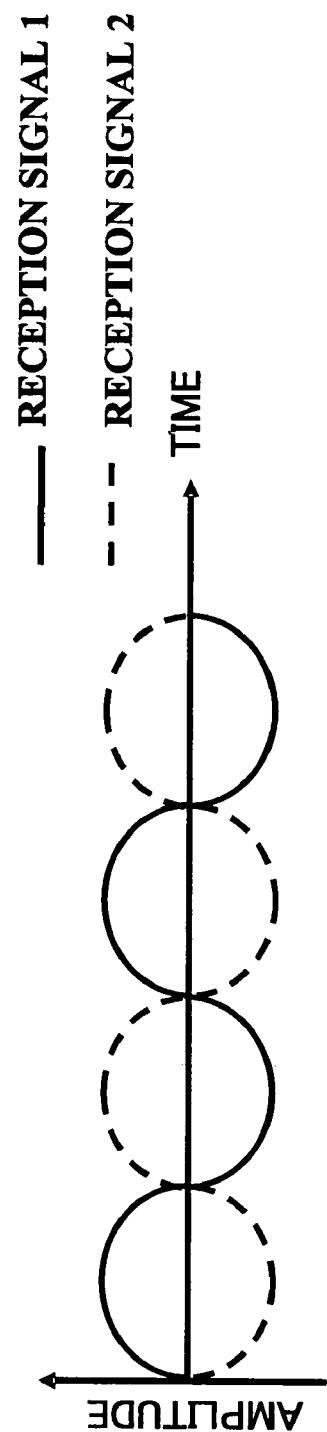
Fig. 7A
Fig. 7B

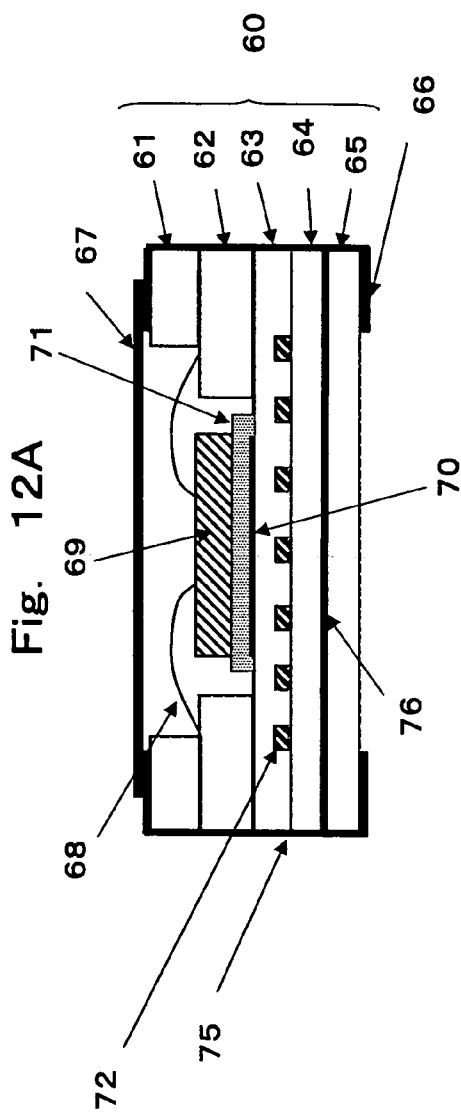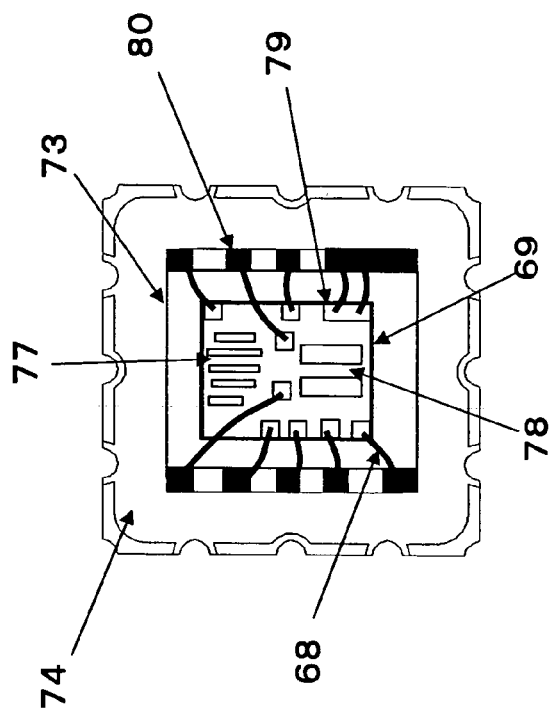

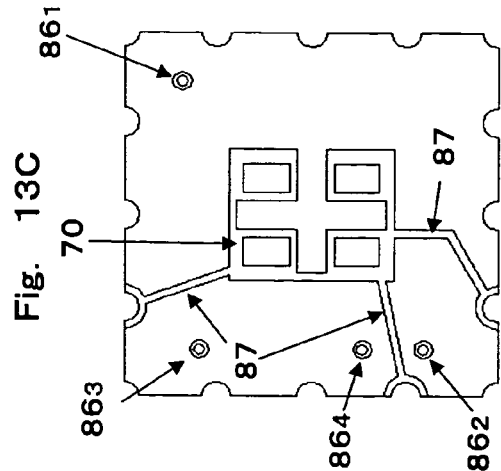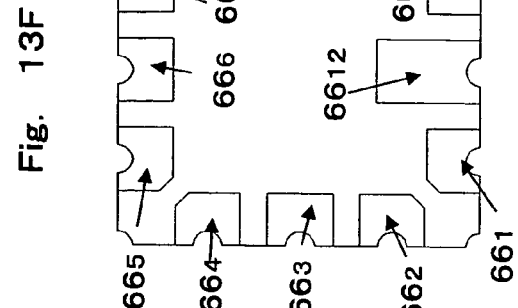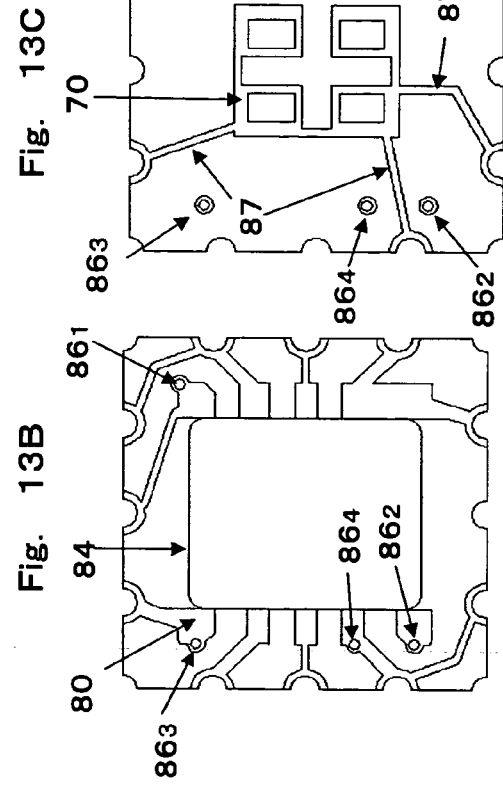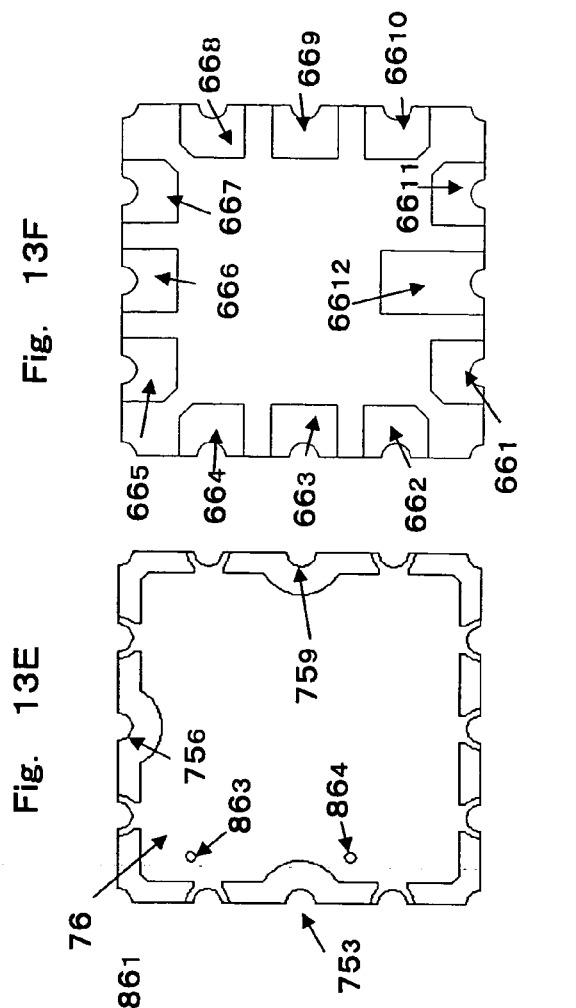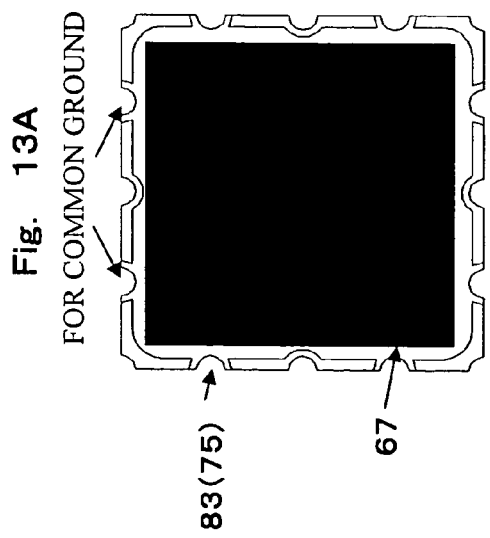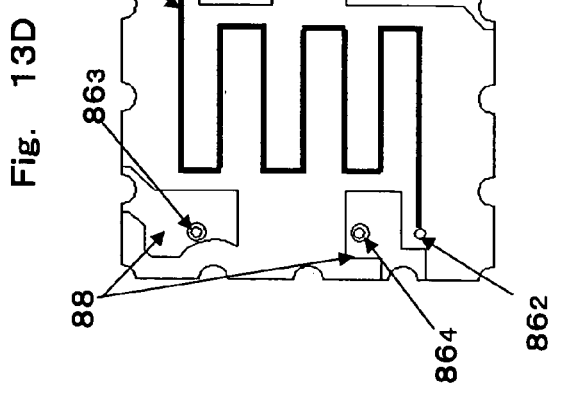

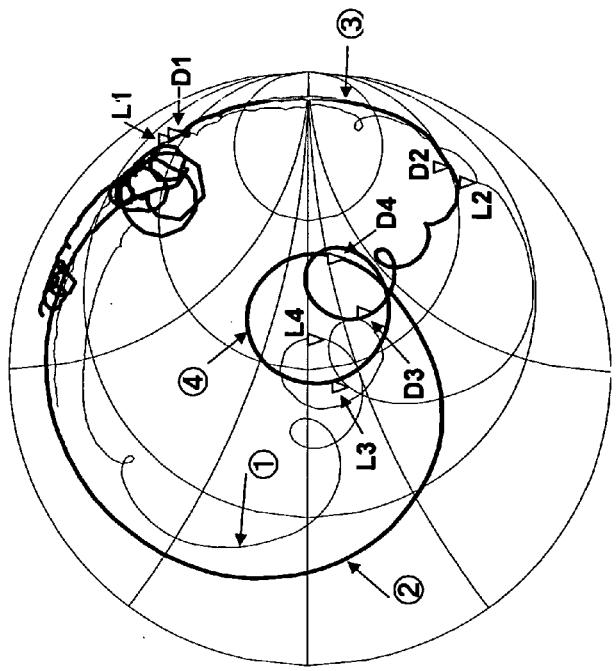
Fig. 15B AFTER PHASE ROTATION
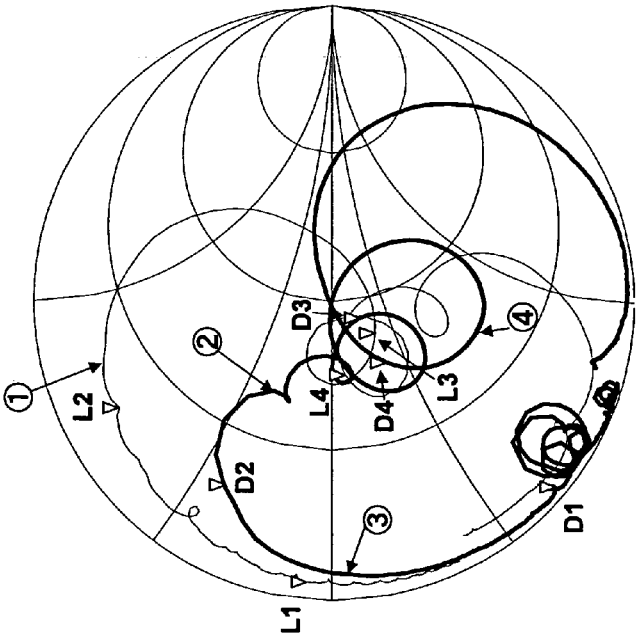
Fig. 15A BEFORE PHASE ROTATION

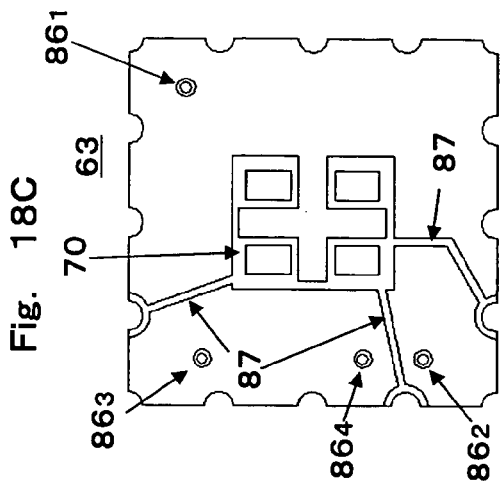
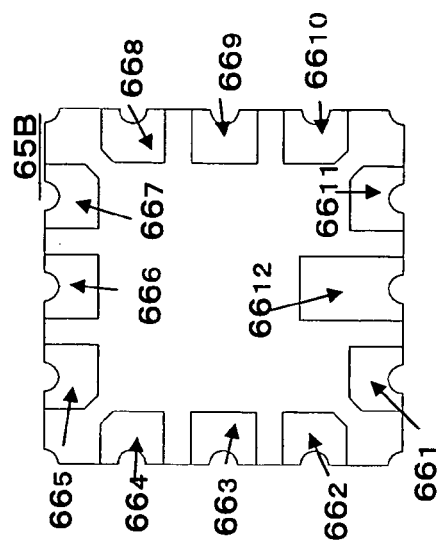
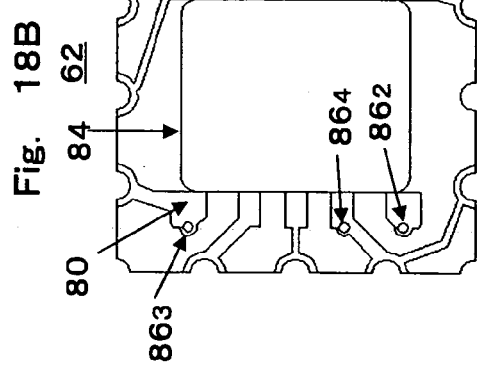
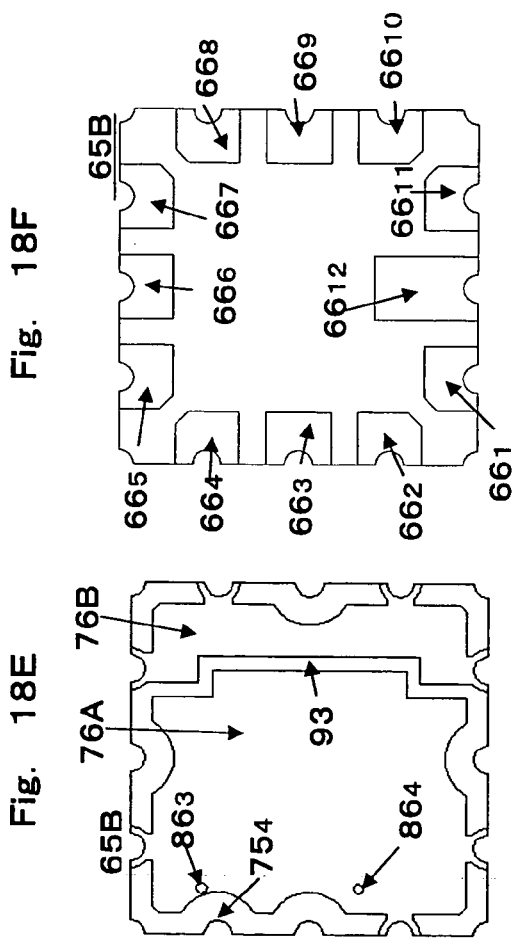
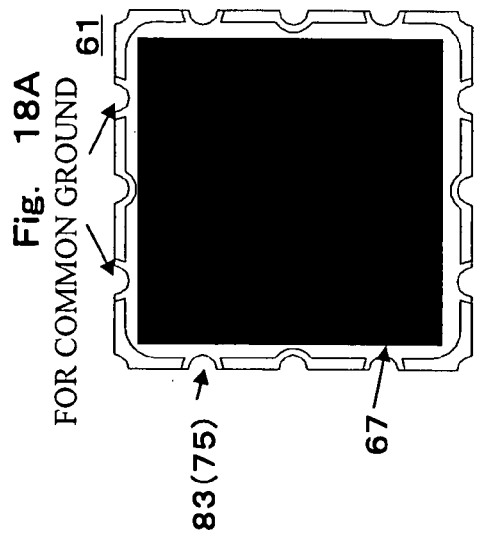
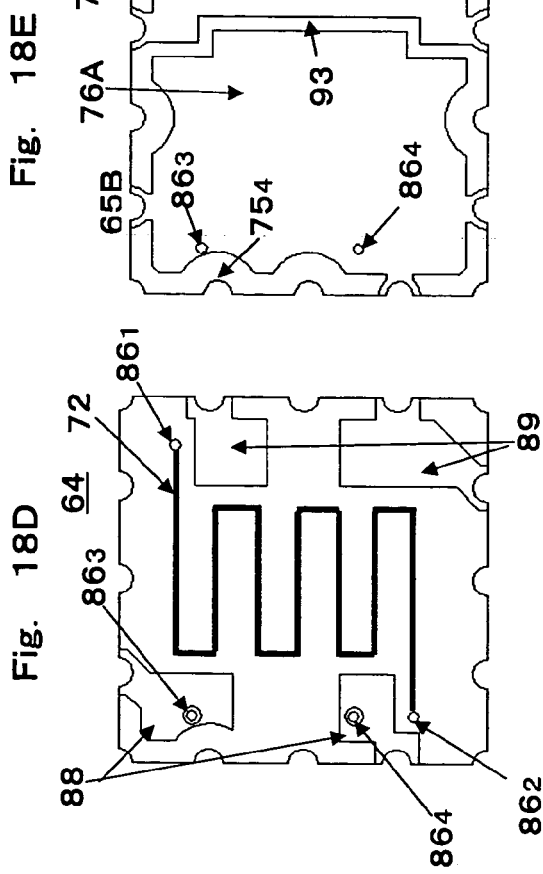

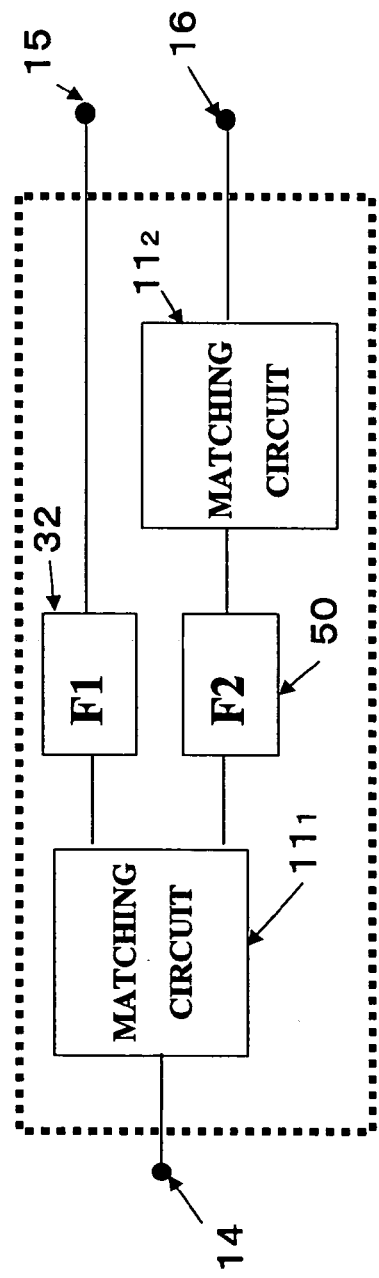
Fig. 21A
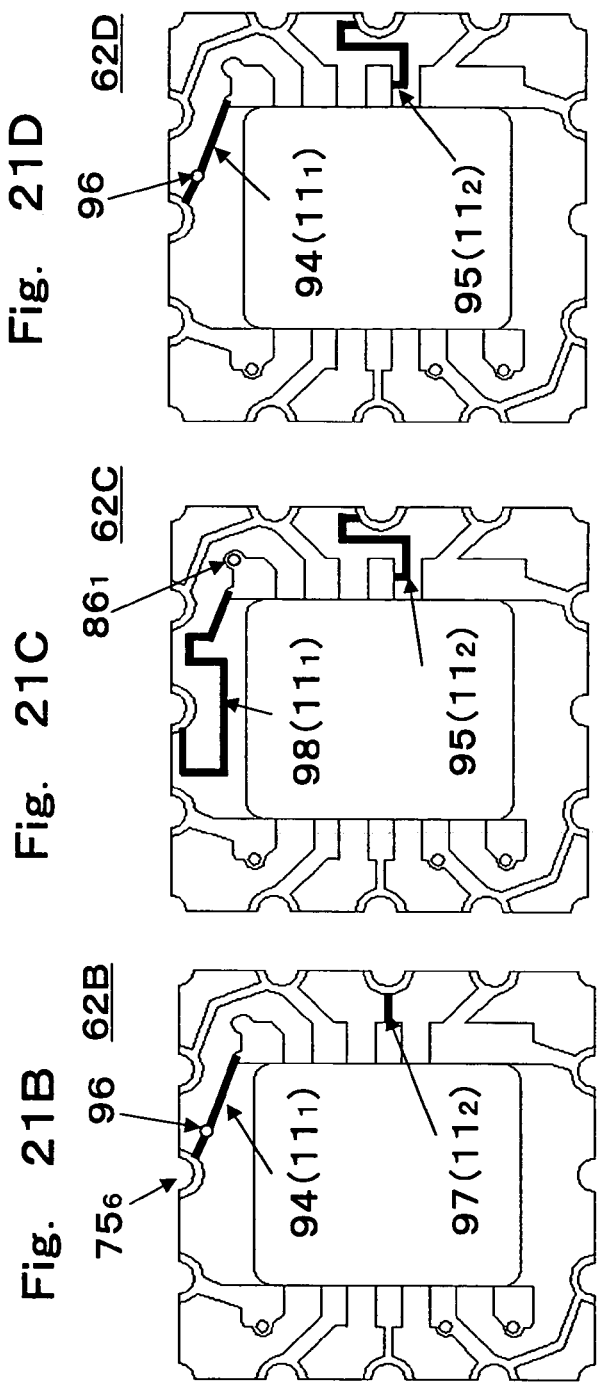
Fig. 21D
Fig. 21C
Fig. 21B

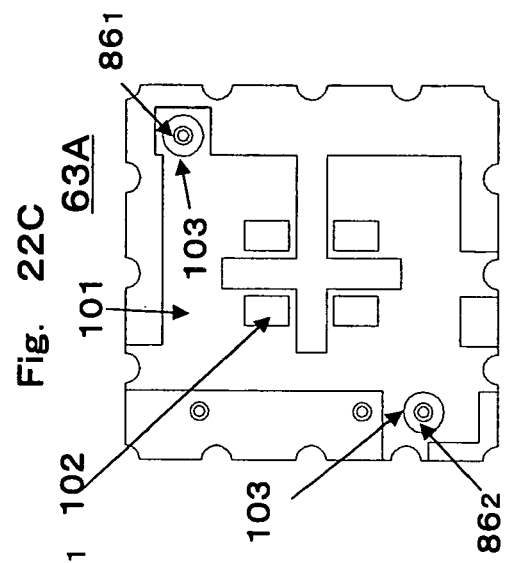
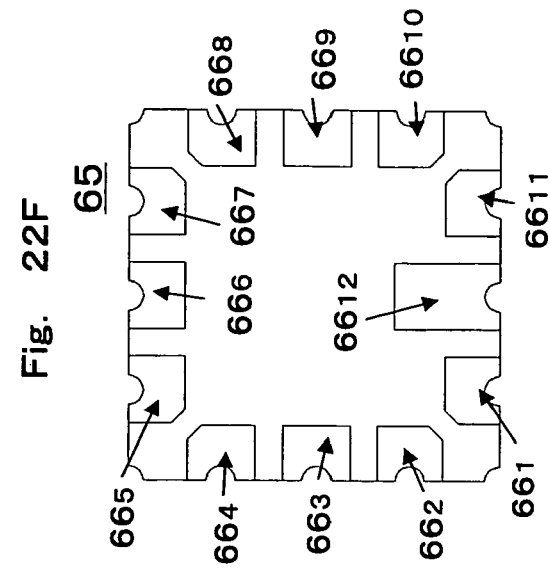
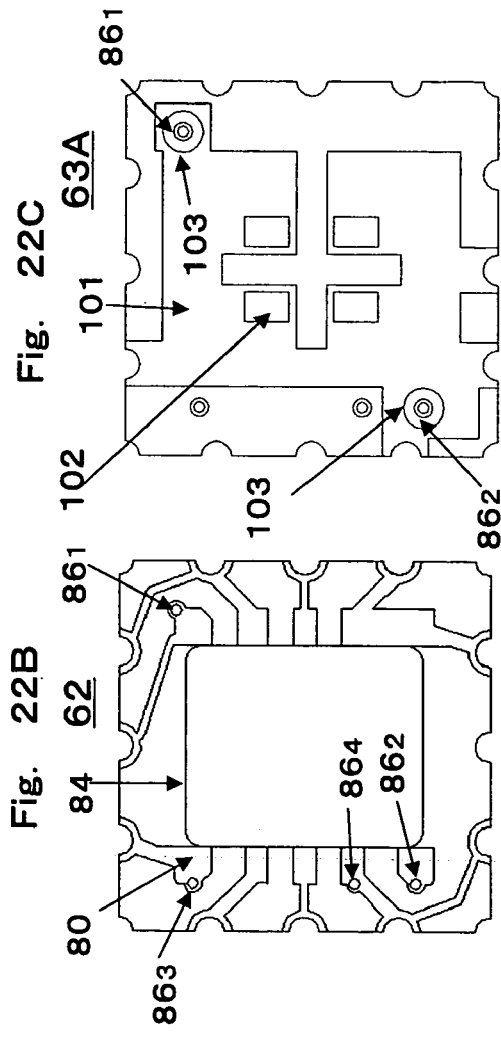
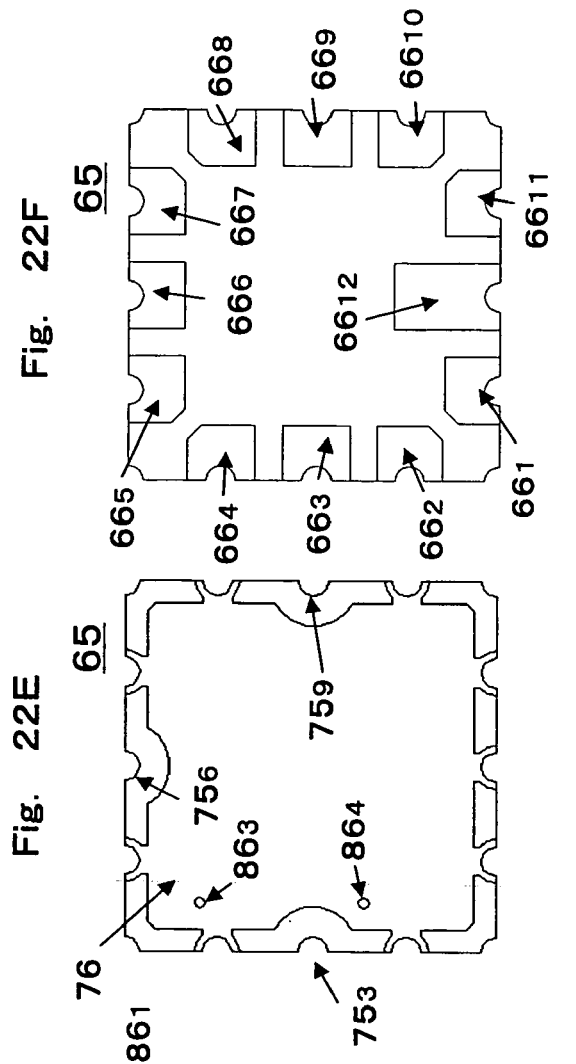
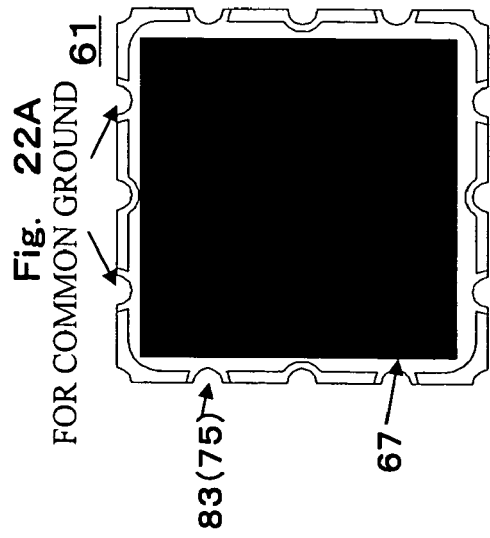
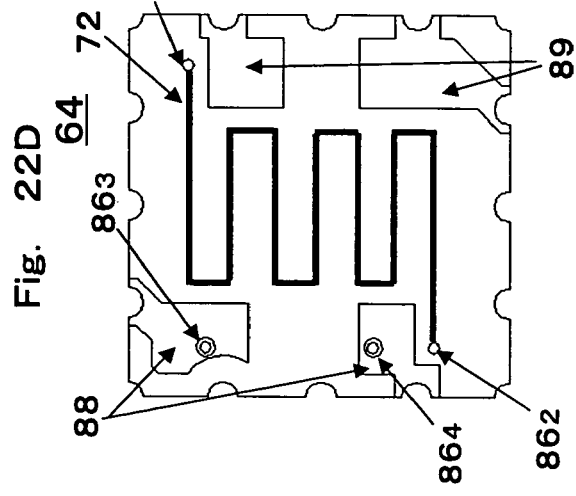

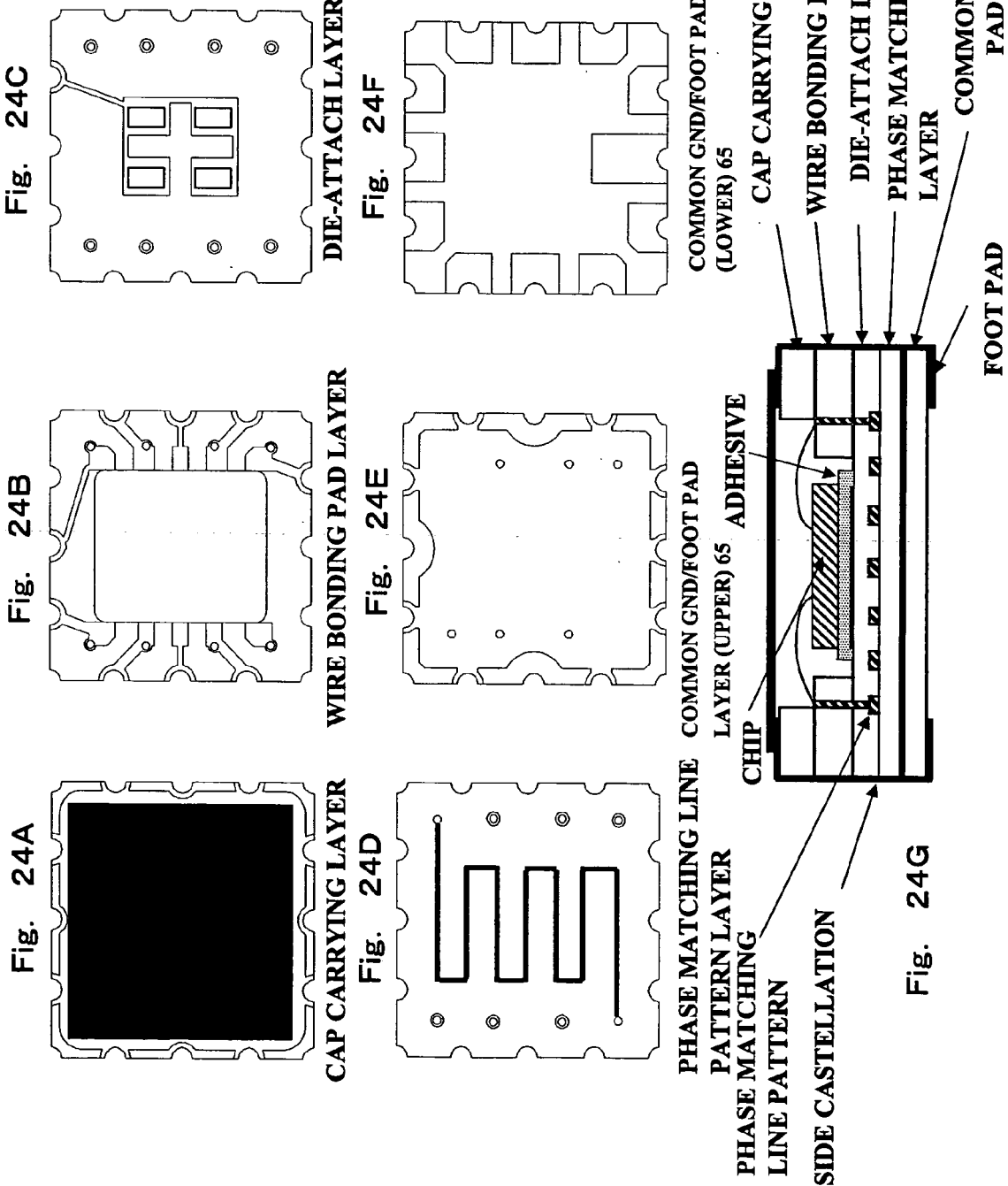

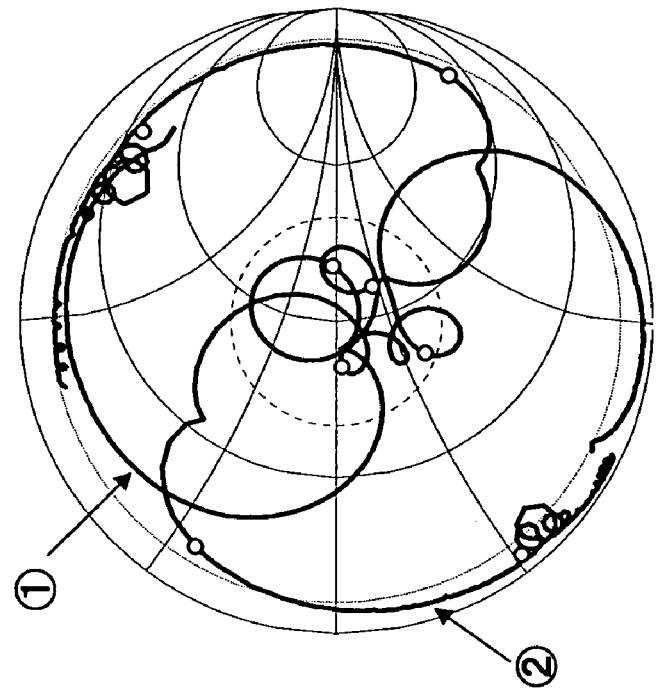
Fig. 25A COMPARATIVE EXAMPLE
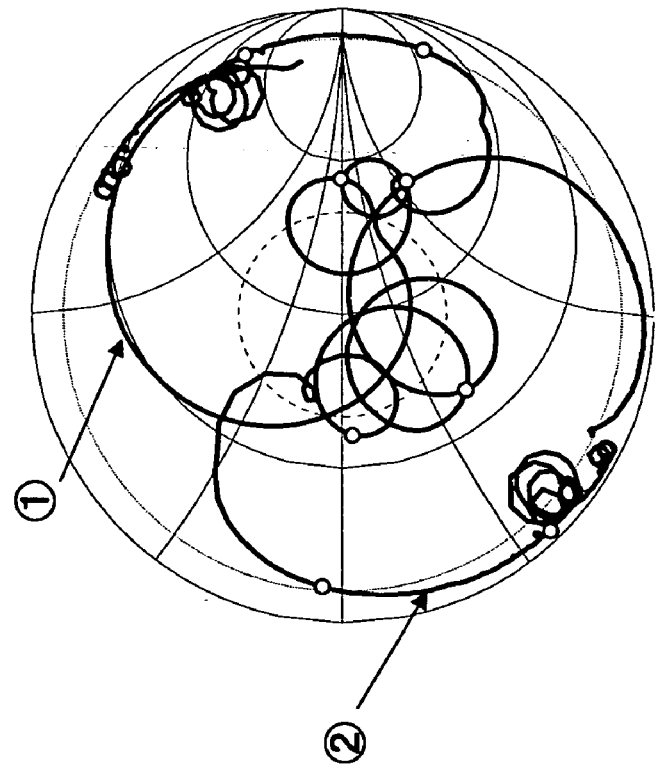
Fig. 25B 11TH EMBODIMENT
① REFLECTION CHARACTERISTIC SEEN FROM ANTENNA TERMINAL
② REFLECTION CHARACTERISTIC SEEN FROM RECEPTION TERMINAL

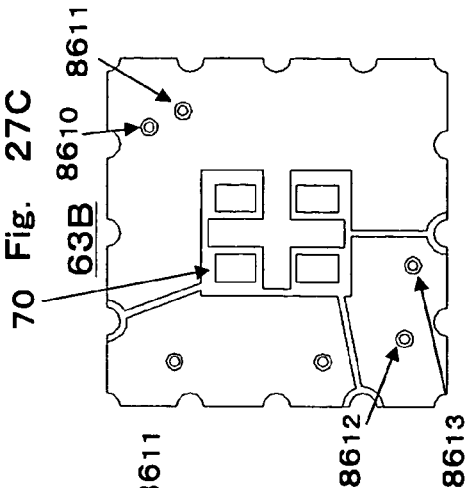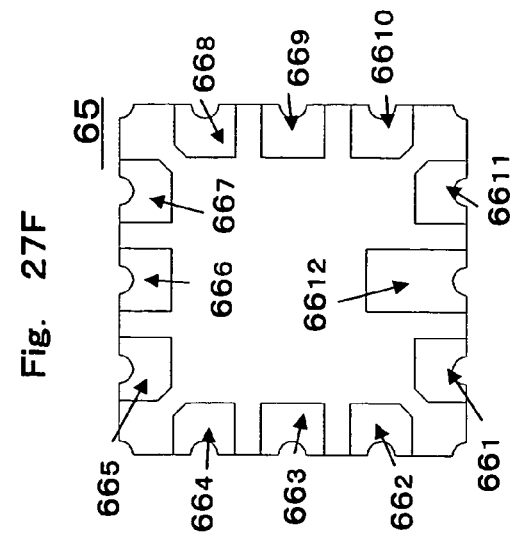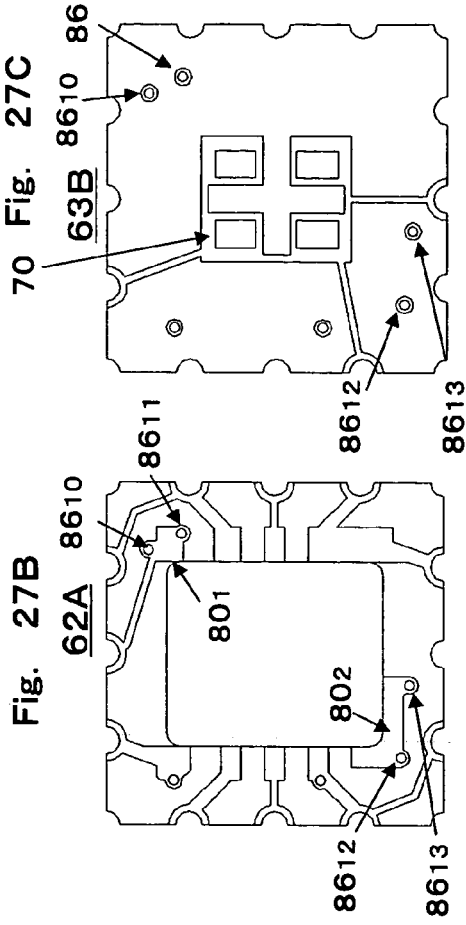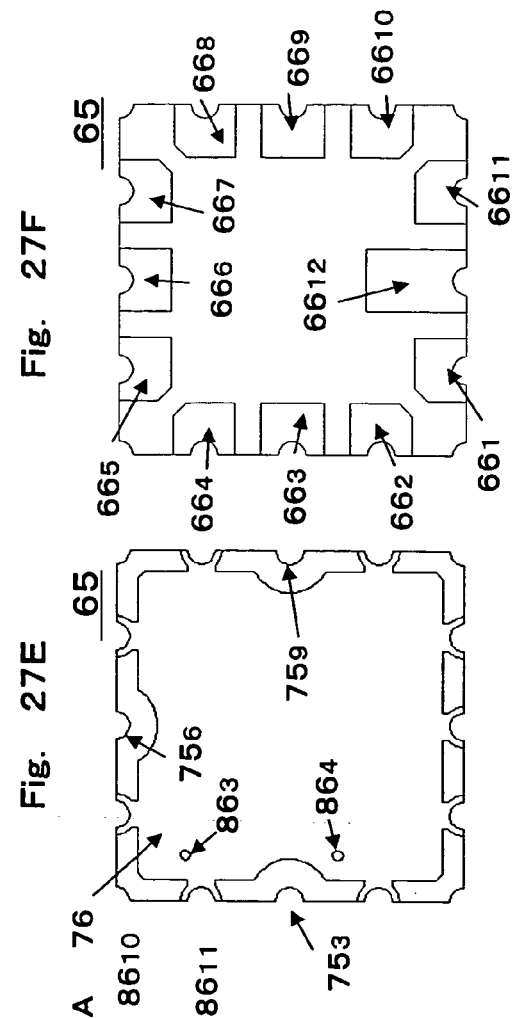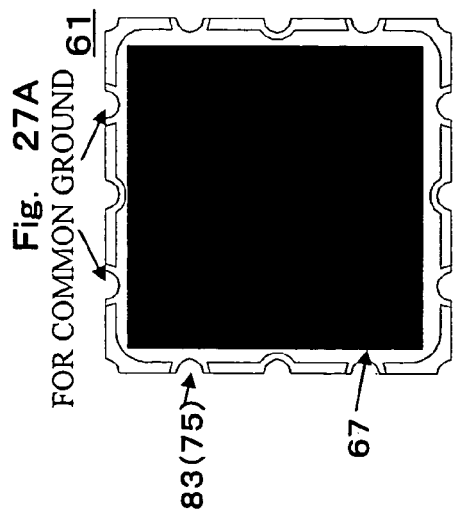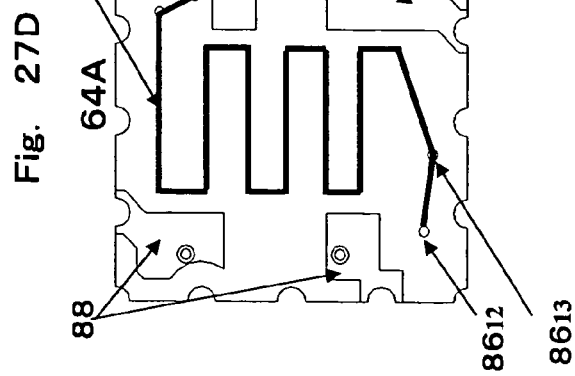

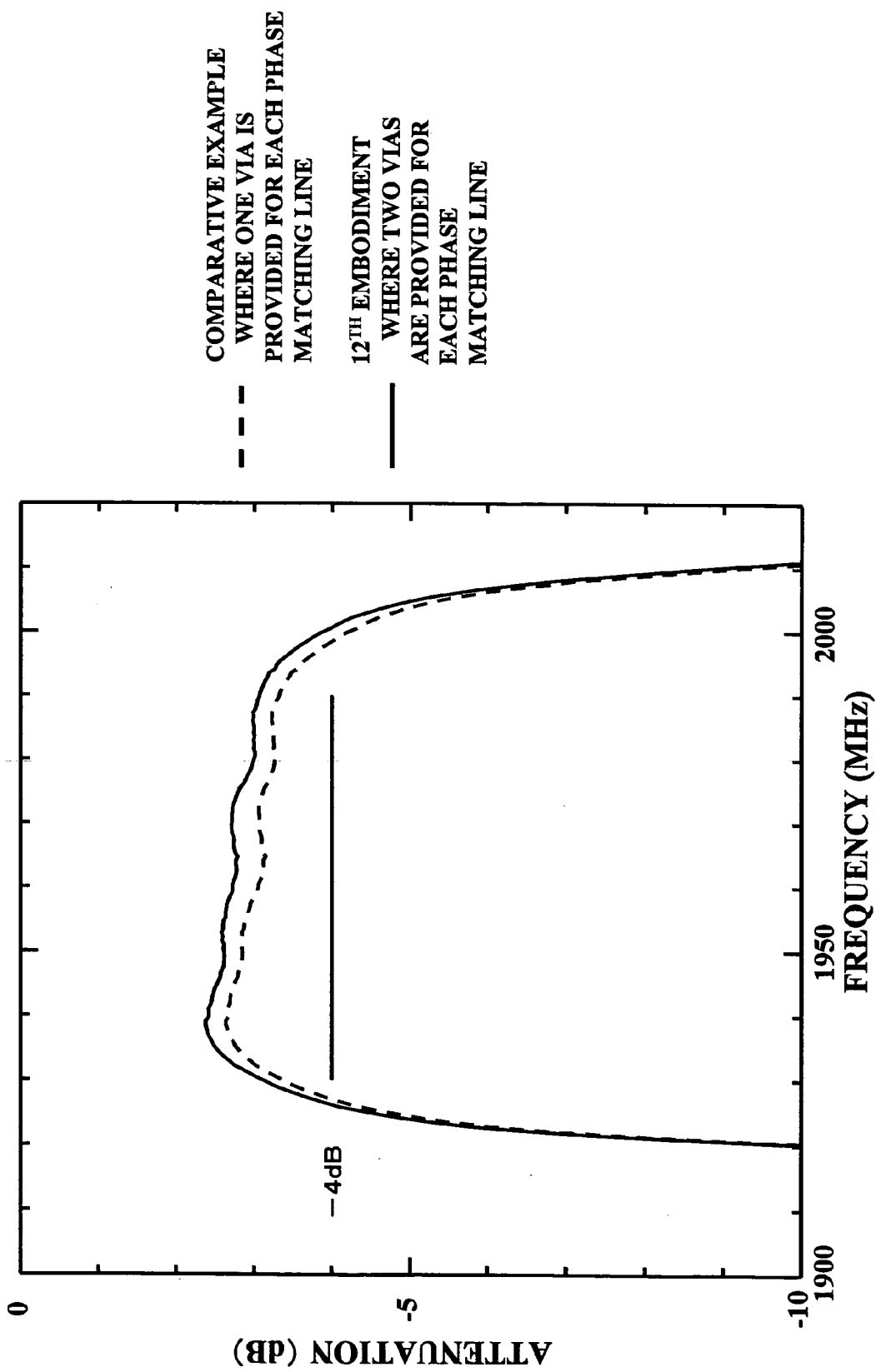

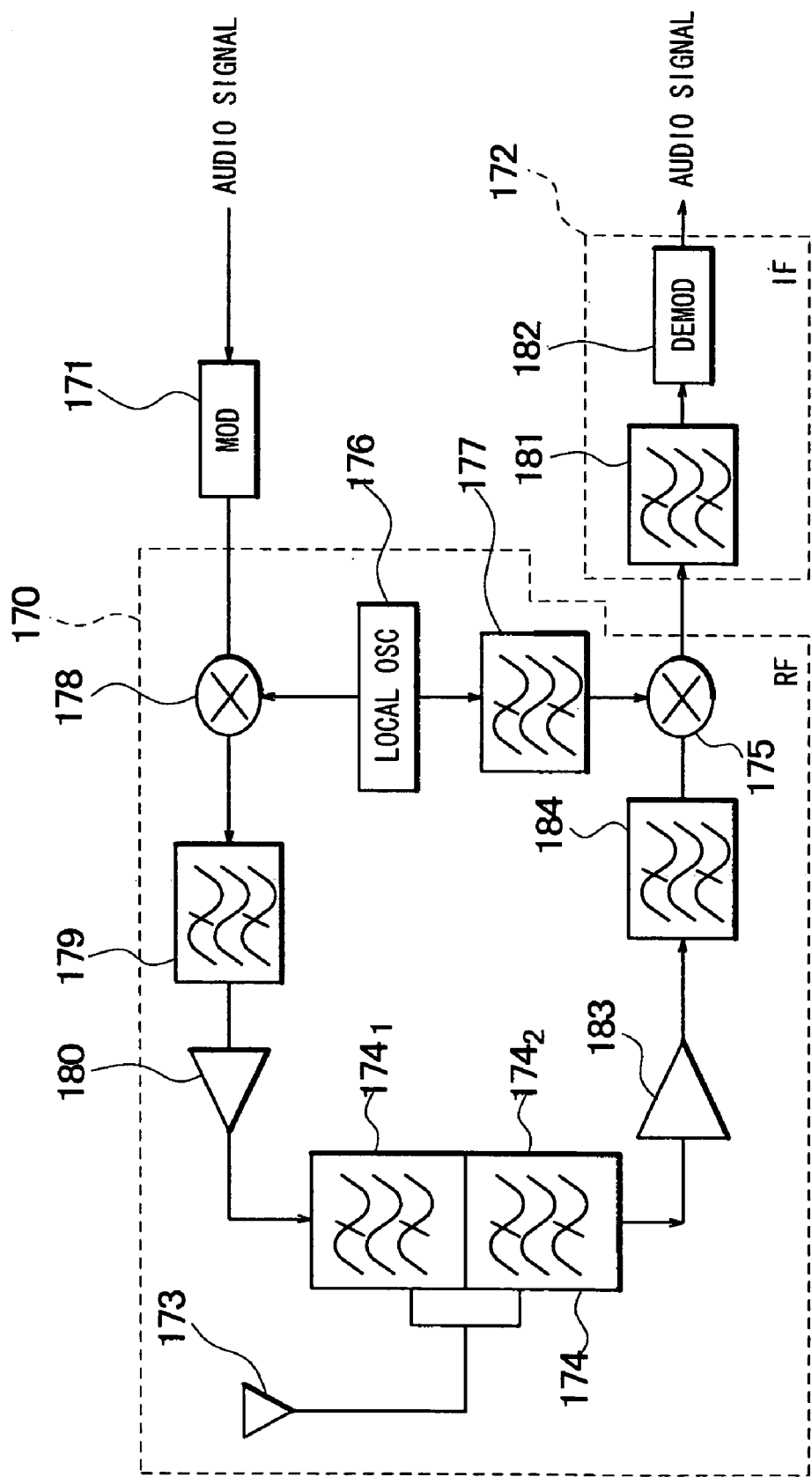

US 7,135,944 B2

BRANCHING FILTER HAVING BOTH SAW LADDER AND DUAL MODE FILTERS, AND ELECTRONIC APPARATUS USING THE BRANCHING FILTER

FIELD OF THE INVENTION

The present invention relates to a duplexer using a bandpass type surface acoustic wave filter.

BACKGROUND OF THE INVENTION

In recent years, as mobile communication systems have been developed, portable telephones and portable information terminals have been rapidly spread. In this trend, manufacturers have been vying to develop smaller terminals with higher performance. The systems for portable telephones include both analog systems and digital systems, and the frequency bands used in those systems include various ranges, such as an 800 MHz to 1 GHz band and a 1.5 GHz to 2.0 GHz band.

Through the recent development of portable telephones, the portable terminals now exhibit high performance in a dual mode (such as a combination of an analog mode and a digital mode, or a combination of two digital modes: TDMA (time-division multiple access) and CDMA (code-division multiple access)) and in a dual band (a combination of a 800 MHz band and a 1.9 GHz band, or a combination of a 900 MHz band and a 1.8 GHz or a 1.5 GHz). Under the circumstances, parts used in those portable telephones have also been developed to achieve high performance. Meanwhile, there have been demands for smaller and less expensive portable telephones and parts.

In those portable terminals, duplexers are employed to conduct branching and generation of signals. A duplexer normally includes filters and an impedance matching circuit. In general, the filters include a band-pass filter, a band rejection filter, or a combination of these two filters. However, duplexers using surface acoustic wave filters have been developed recently, to achieve smaller terminals with higher performance.

FIGS. 1A and 1B illustrate such a duplexer. FIG. 1A is a block diagram illustrating the structure of the duplexer, and FIG. 1B shows the frequency characteristics of the duplexer. In the graph shown in FIG. 1B, the abscissa axis indicates the frequency (increasing toward the right), while the ordinate axis indicate the pass intensity (increasing upward). As shown in FIG. 1A, a duplexer 10 includes two filters 12 and 13, an impedance matching circuit 11 (hereinafter referred to simply as the matching circuit 11), a common terminal 14, and individual terminals 15 and 16. The filters 12 and 13 each includes a surface acoustic wave filter, and have different pass-band center frequencies F1 and F2 (F2>F1). The filter 12 is a filter for transmission, while the filter 13 is a filter for reception, for example. Hereinafter, the filters 12 and 13 may be referred to as the transmission filter 12 and the reception filter 13, respectively. In a duplexer for a 1.9 GHz band, for example, the difference in frequency between the frequencies F1 and F2 is approximately 100 MHz.

The matching circuit 11 is provided to prevent the filters 12 and 13 from degrading the filter characteristics of each other. The characteristic impedance of the filter 12 with respect to the common terminal 14 will be hereinafter represented by Z1, and the characteristic impedance of the filter 13 will be hereinafter represented by Z2. If the frequency of a signal inputted from the common terminal 14 is F1, the characteristic impedance Z1 of the filter 12 is equal to the characteristic impedance value of the common terminal 14, and the characteristic impedance Z2 of the filter 13 is infinity and has a reflection coefficient of 1, by virtue of the matching circuit 1. If the frequency of a signal is F2, the characteristic impedance Z1 of the filter 12 is infinity and has a reflection coefficient of 1, and the characteristic impedance Z2 of the filter 13 is equal to the characteristic impedance value of the common terminal 14.

Japanese Unexamined Patent Publication Nos. 6-310979, 10-126213, and 2001-267881 disclose duplexers using surface acoustic wave filters. Among the publications, Japanese Unexamined Patent Publication Nos. 6-310979 and 10-126213 suggest improvements on matching circuits. Japanese Unexamined Patent Publication No. 2001-267881 discloses a ladder type surface acoustic wave filter, a dual-mode type surface acoustic wave filter, and a high-frequency circuit for a wireless device equipped with a duplexer. Also, Japanese Unexamined Patent Publication No. 11-340772 discloses that a combination of a ladder type surface acoustic wave filter and a dual-mode type surface acoustic wave filter is employed as a dual band filter, instead of a duplexer.

As shown in FIG. 2, a duplexer that uses a ladder type surface acoustic wave filter for both transmission and reception is also known. Each resonator 20 in the ladder type surface acoustic wave filters is a single-port surface acoustic wave resonator that includes an interdigital transducer 21 and reflectors 22 and 23 sandwiching the interdigital transducer 21.

Although improvements on matching circuits are described in Japanese Unexamined Patent Publication Nos. 6-310979 and 10-126213, the transmission and reception filters of the duplexers are not explained in detail. Also, a ladder type surface acoustic wave filter and a dual-mode type surface acoustic wave filter are described in Japanese Unexamined Patent Publication No. 2001-267881, but disclosure has not been made as to the relationship between the power durability required in a duplexer and a surface acoustic wave filter, and the relationship between the transmission/reception band of a duplexer and a surface acoustic wave filter.

Furthermore, the surface acoustic wave filter disclosed in Japanese Unexamined Patent Publication No. 11-340772 is employed on condition that one of the two band center frequencies is two to four times as high as the other one. This disclosure does not concern a duplexer in which the characteristics rises (or falls) of a filter affect the characteristics falls (or rises) of the other filter.

In the duplexer shown in FIG. 2, the suppression of the low frequency band of the reception filter 13 that overlaps the pass band of the transmission filter 12 is not strong enough, and interference is caused in the transmission band, as indicated by the broken circle line in FIG. 3.

DISCLOSURE OF THE INVENTION

It is therefore an object of the present invention to provide a duplexer using a dual-mode type surface acoustic wave filter, so as to improve both power durability and filter characteristics.

The above object is achieved by a duplexer that includes: two surface acoustic wave filters that have different band center frequencies; and a phase matching circuit that matches the phases of the two surface acoustic wave filters to each other. In this duplexer, one of the two surface acoustic wave filters is a ladder type surface acoustic wave filter, while the other one of the two surface acoustic wave filters includes two or more dual-mode type surface acoustic wave filters connected in parallel. The ladder type surface acoustic wave filter excels in power durability and exhibits steep falls. The other surface acoustic wave filter, which is a coupled dual-mode type surface acoustic wave filter, not only exhibits steep rises, but also achieves excellent filter characteristics with reduced insertion loss and greatly improved power durability, by virtue of the two or more dual-mode type surface acoustic wave filters connected in parallel. Furthermore, with the improved power durability, the dual-mode type surface acoustic wave filters can be located at the front end (the first-stage filter to be connected to the common terminal) of the duplexer.

BRIEF DESCRIPTION OF THE DRAWINGS

FIG. 2 illustrates a conventional duplexer using conventional surface acoustic wave filters;

FIG. 7A illustrates the circuit structure of the duplexer having a balanced output;

FIG. 7B illustrates the balanced output;

FIG. 12A is a section view of a duplexer in accordance with a fifth embodiment of the present invention;

FIG. 12B is a plan view of the duplexer, with the cap being removed;

FIGS. 13A through 13F illustrate the layers contained in the laminated package of the duplexer in accordance with the fifth embodiment of the present invention;

FIGS. 15A and 15B are graphs showing impedance comparisons between a ladder type surface acoustic wave filter and a DMS filter;

FIGS. 18A through 18F illustrate the layers contained in the laminated package of a duplexer in accordance with a seventh embodiment of the present invention;

FIG. 21A illustrates the circuit structure of a duplexer in accordance with a tenth embodiment of the present invention;

FIGS. 21B, 21C, and 21D are plan views showing examples of wire bonding pad layers that can be employed in the duplexer of FIG. 21A;

FIGS. 22A through 22E illustrate the layers contained in the laminated package of a duplexer in accordance with an eleventh embodiment of the present invention;

FIG. 22F is a bottom view of the laminated package of the duplexer in accordance with the eleventh embodiment;

FIGS. 24A through 24G illustrate a comparative example in relation to the eleventh embodiment of the present invention;

FIG. 25A shows the reflection characteristics of the single DMS filter employed in the comparative example shown in FIGS. 24A through 24G;

FIG. 25B shows the reflection characteristics of the single DMS filter employed in the eleventh embodiment shown in FIGS. 22A through 22G;

FIGS. 27A through 27F illustrate a duplexer in accordance with a twelfth embodiment of the present invention;

FIG. 28 shows the insertion losses of the reception filter of the fifth embodiment and the reception filter of the twelfth embodiment;

FIG. 40 illustrates a communication device in accordance with a seventeenth embodiment of the present invention.

DESCRIPTION OF THE PREFERRED EMBODIMENTS

The following is a description of embodiments of the present invention, with reference to the accompanying drawings.

First Embodiment

Figure 1A:
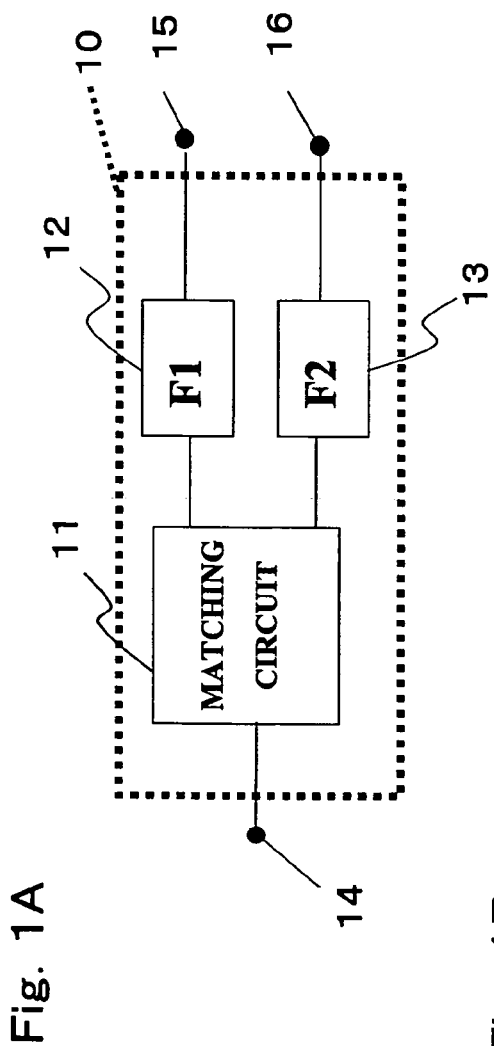
FIG. 1A is a block diagram illustrating the structure of a conventional duplexer.
Figure 1B:
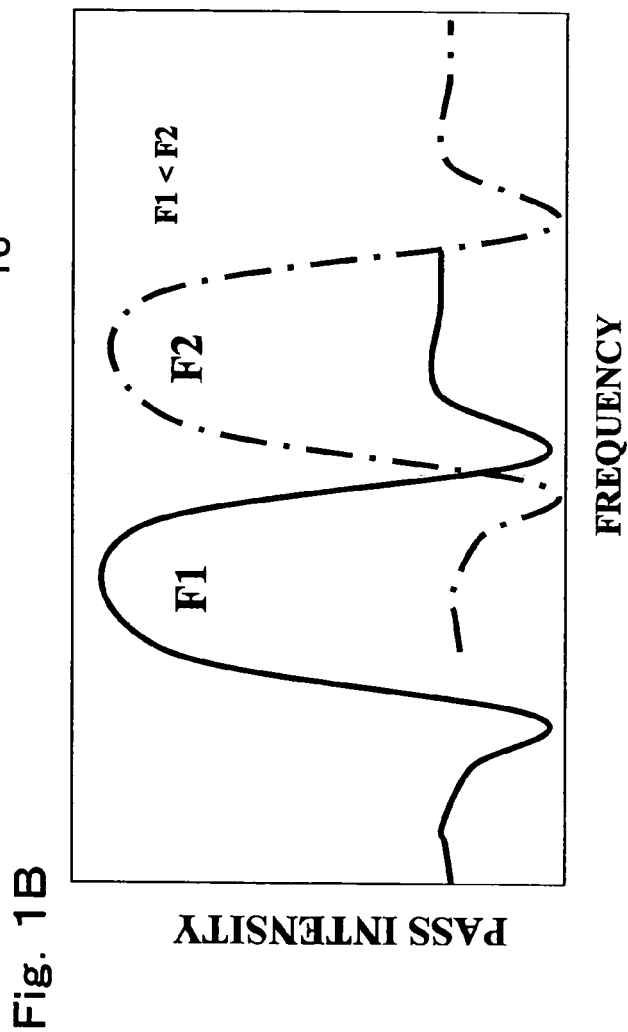
FIG. 1B shows the frequency characteristics of the duplexer of FIG. 1A.
Figure 3:
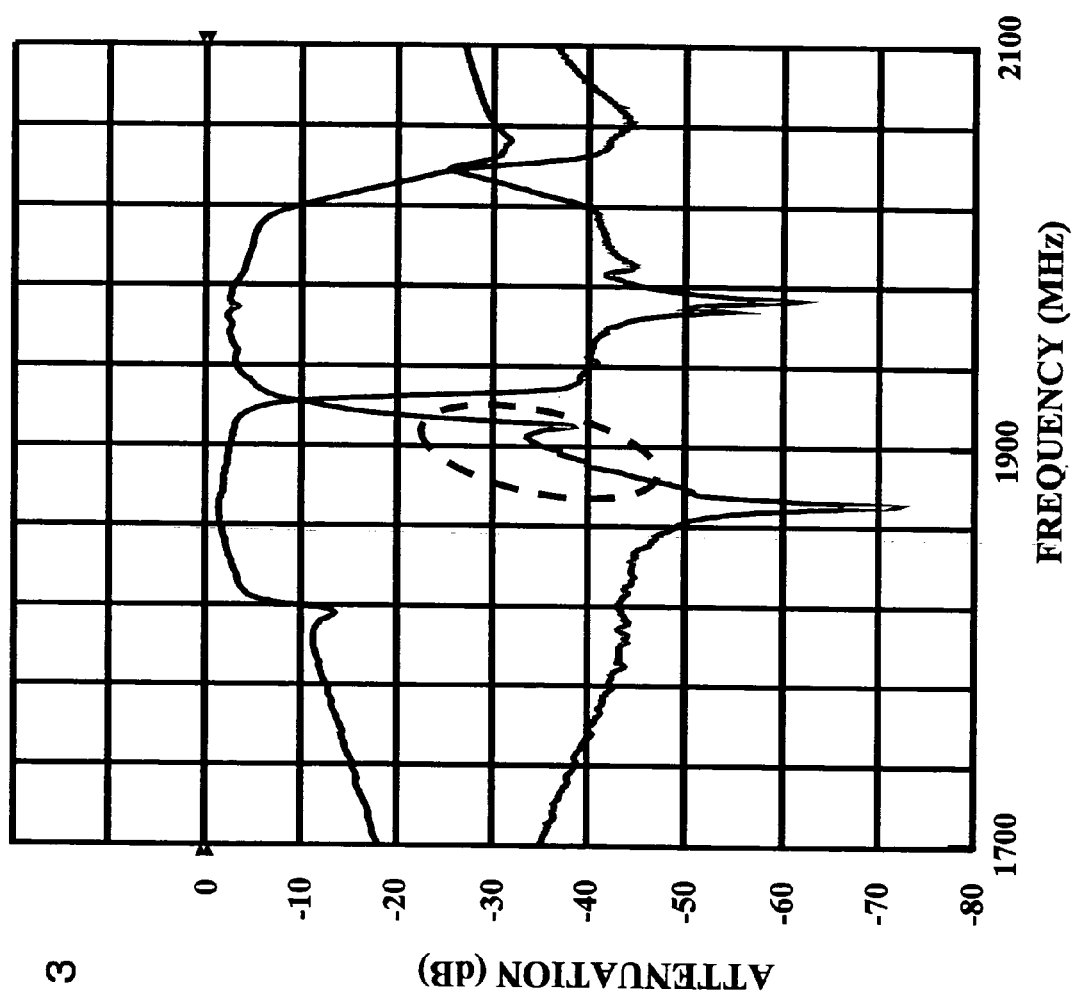
FIG. 3 shows the filter characteristics of the duplexer of FIG. 2.
Figure 4:
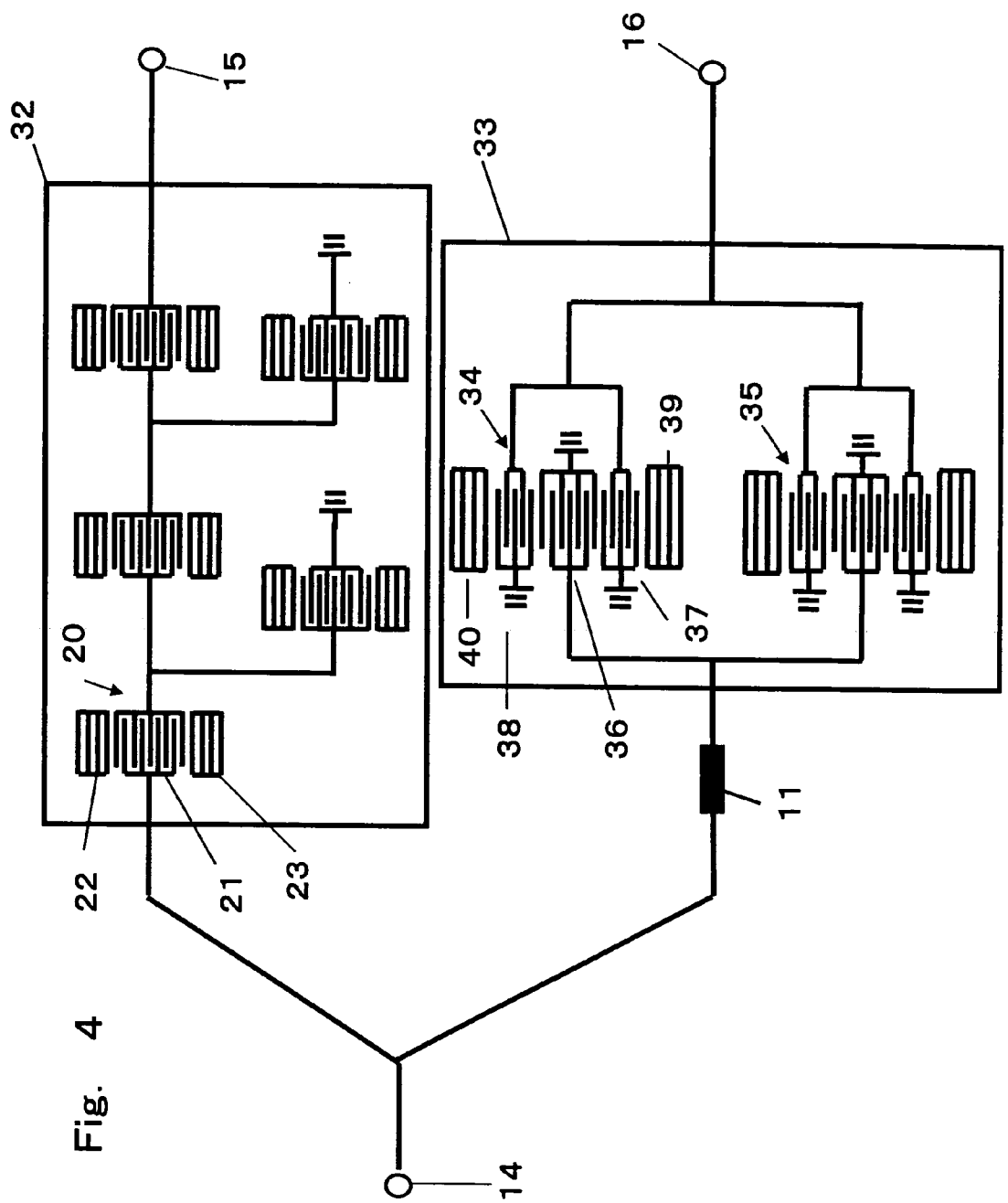
FIG. 4 illustrates a duplexer in accordance with a first embodiment of the present invention.

FIG. 4 illustrates a duplexer in accordance with a first embodiment of the present invention. In FIG. 4, the same components as those already described are denoted by the same reference numerals as those for the components already described. The duplexer shown in FIG. 4 includes a ladder type surface acoustic wave filter 32 and a longitudinally-coupled dual-mode type surface acoustic wave filter 33. The ladder type surface acoustic wave filter 32 is a transmission filter of the duplexer, and the longitudinally-coupled dual-mode type surface acoustic wave filter 33 is a reception filter. These filters 32 and 33 have different band center frequencies. One end of the ladder type surface acoustic wave filter 32 is connected to a common terminal 14, and the other end is connected to an individual terminal (a transmission terminal) 15. Likewise, one end of the longitudinally-coupled dual-mode type surface acoustic wave filter 33 is connected to the common terminal 14 via a matching circuit 11, and the other end is connected to an individual terminal (a reception terminal) 16.

One of the features of this embodiment lies in that the transmission filter is formed by the ladder type surface acoustic wave filter 32 having single-port surface acoustic wave resonators 20 connected in a ladder fashion, while the reception filter is formed by the longitudinally-coupled dual-mode type surface acoustic wave filter 33. Hereinafter, the ladder type surface acoustic wave filter 32 will be referred to simply as the transmission filter 32, and the longitudinally-coupled dual-mode type surface acoustic wave filter 33 will be referred to simply as the reception filter 33.

The reception filter 33 has a circuit structure in which dual-mode type surface acoustic wave filters (two dual-mode type surface acoustic wave filters 34 and 35 in the embodiment shown in FIG. 4; hereinafter referred to as DMS (Dual Mode SAW) filters 34 and 35) are connected in parallel. Each of the DMS filters 34 and 35 includes three interdigital transducers (hereinafter referred to as IDTs) 36, 37, and 38, and two reflectors 39 and 40. In FIG. 4, reference numerals are not allotted to the components of the DMS filter 35, for convenience. The IDTs 36, 37, and 38 are arranged next to one another in the transmission direction of surface acoustic wave. The reflectors 39 and 40 are grating reflectors, for example, and are arranged adjacent to the IDT 37 and 38, respectively. The DMS filter 35 has the same structure as the DMS filter 34.

The two DMS filters 34 and 35 are connected in parallel in the following manner. One of the comb-like electrodes of the IDT 36 of the DMS filter 34 is connected to one of the comb-like electrodes of the IDT 36 of the DMS filter 35, and these comb-like electrodes are connected to one end of the matching circuit 11. The other one of the comb-like electrodes of each of the IDTs 36 is grounded. One of the comb-like electrodes of the IDT 37 of the DMS filter 34 is connected to one of the comb-like electrodes of the IDT 38 of the DMS filter 34. Likewise, one of the comb-like electrodes of the IDT 37 of the DMS filter 35 is connected to one of the comb-like electrodes of the IDT 38 of the DMS filter 35. These connected comb-like electrodes are also connected to the reception terminal 16. The other comb-like electrodes of the IDTs 37 and 38 are grounded.

Figure 5:
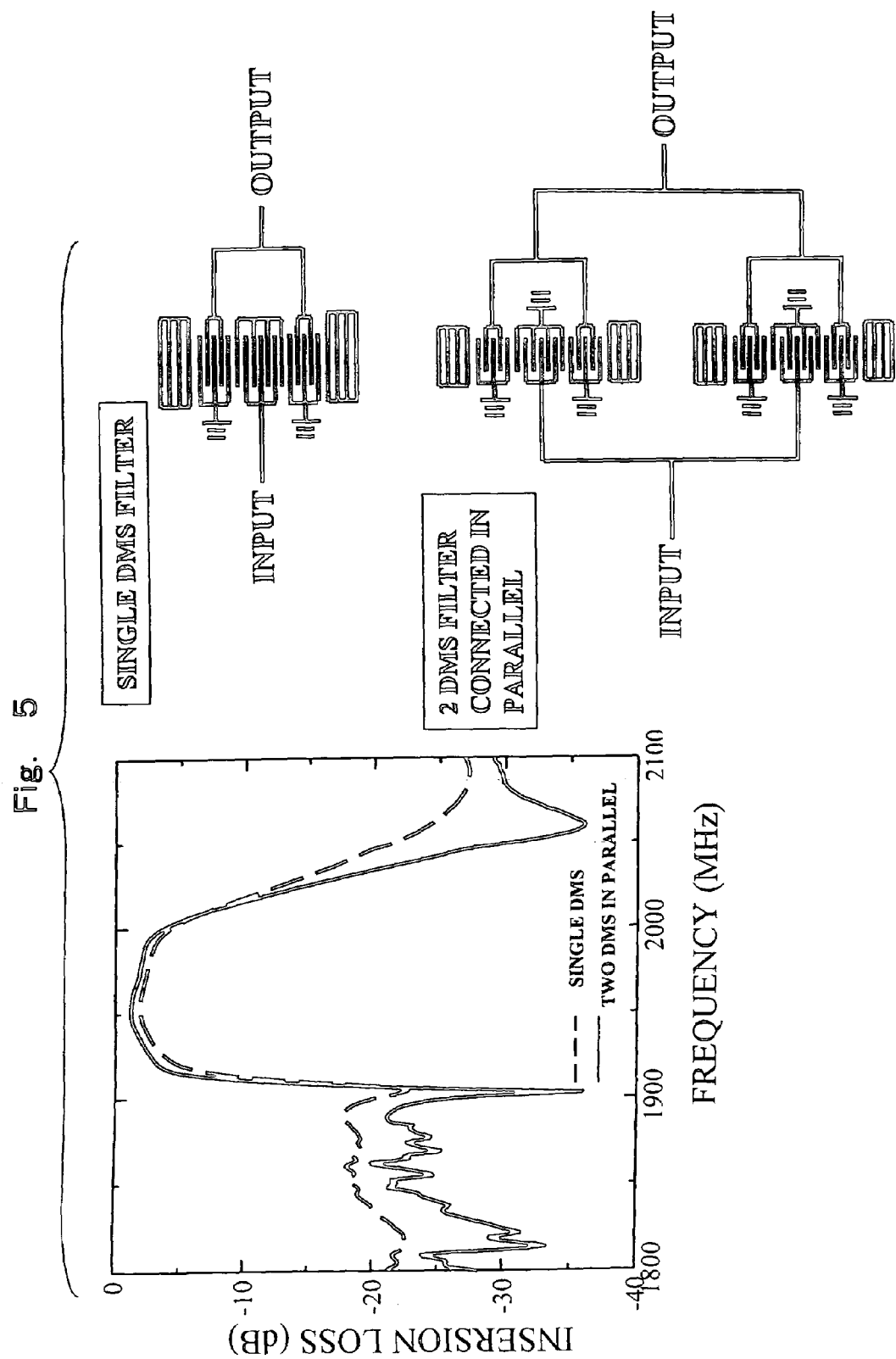
FIG. 5 shows the differences in characteristics between a structure having a single DMS filter and a structure having two DMS filters connected in parallel.

FIG. 5 illustrates the characteristics difference between a single DMS filter and two DMS filters connected in parallel. A DMS filter has much fewer pairs of IDTs than a ladder-type filter, and has a more remarkable increase in insertion loss due to the resistance of the IDT electrode fingers. Particularly, where the frequency is high (a 1.9 GHz band in the example shown in FIG. 5), the electrode width becomes as small as 0.5 µm, and therefore, the insertion loss becomes very large. To avoid this, two DMS filters having an opening length half of the opening length of the single DMS filter are connected in parallel. As a result, the resistance of the electrode fingers is reduced to ¼, and the insertion loss is reduced by 1.2 dB. In general, if N of DMS filters having a wavelength reduced to 1/N are connected in parallel, the resistance of the electrode fingers becomes 1/(N×M). Accordingly, the number of DMS filters to be connected in parallel should be increased until the insertion loss due to the resistance is eliminated.

Also, the connecting of DMS filters (two DMS filters in the example shown in FIG. 4) in parallel disperses high power and reduces the power required for one DMS filter. Thus, sufficiently high power durability can be secured for the duplexer. The power durability will be explained later in detail. Further, the surface acoustic wave resonators of the transmission filter 32 connected to the common terminal 14 are series-arm resonators arranged in series arms. Accordingly, the impedance of the reception band of the transmission filter 32 becomes higher, and the insertion loss of the reception filter can be reduced.

In the above description, the band center frequency F1 of the transmission filter 32 is lower than the band center frequency F2 of the reception filter 33, and the fall of the pass band of the transmission filter 32 using a ladder type surface acoustic wave filter partially overlaps the rise of the reception filter 33. However, a duplexer having the reduced insertion loss and the improved power durability of the reception filter 33 can be realized, even if F1 is higher than F2.

The number of DMS filters to be connected in parallel is not limited two, but may be three or greater. This aspect of the present invention will be described later in detail.

Each of the IDTs shown in FIG. 4 is formed in the following manner. An alloy film mainly containing Al or an Al alloy multi-layer film is formed by sputtering on a substrate that is made of a piezoelectric material, such as LiTaO$_3$, cut out at a predetermined angle (at 42 degrees, Y-cut, X-propagation, for example). Exposure and etching are then performed to form a pattern in the Al alloy film or multi-layer film. The transmission filter 32 and the reception filter 33 may have individual substrates or a common substrate. This applies to all the other embodiments of the present invention.

(Second Embodiment)

Figure 6:
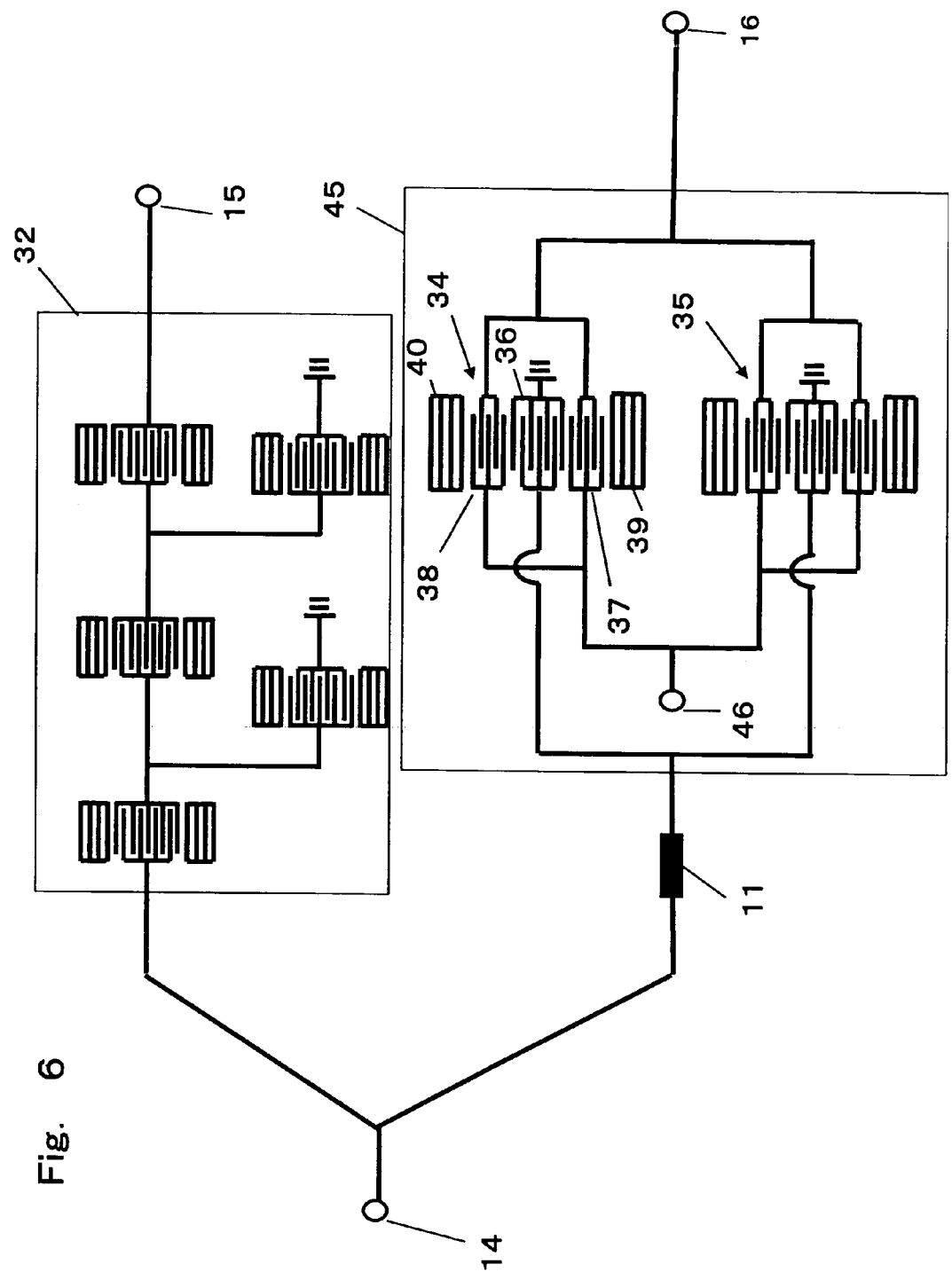
FIG. 6 illustrates a duplexer in accordance with a second embodiment of the present invention.

FIG. 6 illustrates a duplexer in accordance with a second embodiment of the present invention. In this figure, the same components as those of the first embodiment are denoted by the same reference numerals as those of the first embodiment. The duplexer shown in FIG. 6 differs from the duplexer of the first embodiment in that the reception filter has a balanced (differential) output through modified connections. The duplexer shown in FIG. 6 has such a reception filter 45. The comb-like electrodes of the IDTs 37 that are grounded in FIG. 4 are connected to each other between the DMS filters 34 and 35, and are also connected to a reception terminal 46. A balanced output can be obtained through the reception terminal 46 and another reception terminal 16.

FIGS. 7A and 7B illustrate a balanced output. The duplexer of FIG. 6 is shown as a duplexer 100 in FIG. 7A. A balanced output is signal outputs of the same amplitudes and opposite phases, as indicated by a reception signal 1 and a reception signal 2 in FIG. 7B. With a balanced output, it is easier to design the electric circuits for electronic devices such as portable telephones. Particularly, as a duplexer is connected to an IC of a later stage, a structure that can output two reception signals having phases different from each other by 180 degrees is more beneficial than a single-output structure.

(Third Embodiment)

Figure 8:
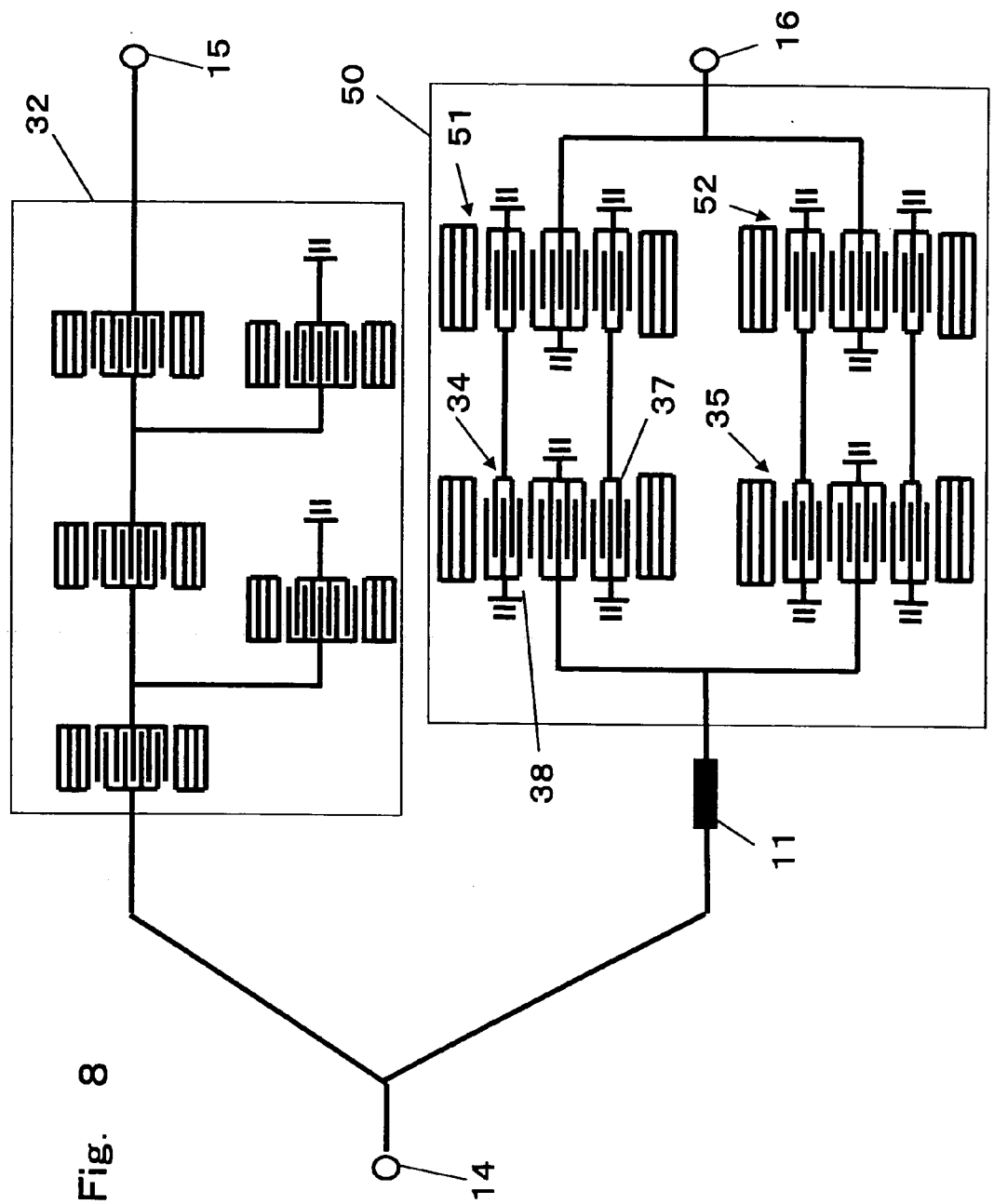
FIG. 8 illustrates a duplexer in accordance with a third embodiment of the present invention.

FIG. 8 illustrates a duplexer in accordance with a third embodiment of the present invention. In this figure, the same components as those of the foregoing embodiments are denoted by the same reference numerals as those of the foregoing embodiments. A reception filter 50 of this embodiment has a structure in which one or more DMS filters connected in parallel are connected in cascade. In the example shown in FIG. 8, a set of two DMS filters 34 and 35 are connected to another set of two DMS filters. In FIG. 8, the second-stage two DMS filters connected in parallel are denoted by reference numerals 51 and 52. The comb-like electrodes of the IDTs 37 of the DMS filters 34 and 51 are connected to each other, and the comb-like electrodes of the IDTs 38 of the DMS filters 34 and 51 are connected to each other, as shown in FIG. 8. Reference numerals 37 and 38 are allotted only to the IDTs of the DMS filters 34, for simplification of the drawing. The comb-like electrodes of the IDTs 37 and 38 of the DMS filters 35 and 52 are also connected to each corresponding other, as shown in FIG. 8.

Figure 9:
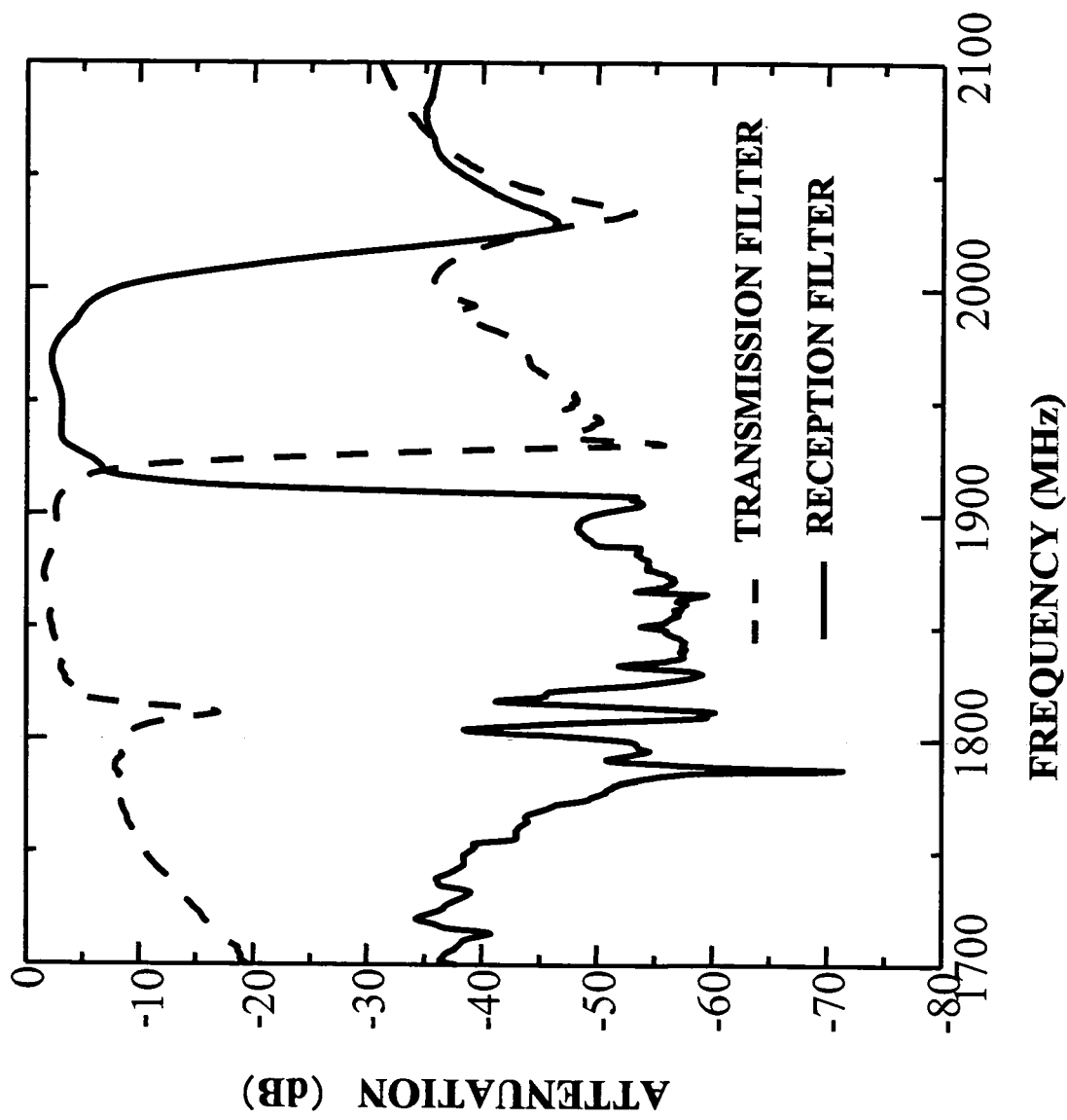
FIG. 9 shows the filter characteristics of the duplexer in accordance with the third embodiment of the present invention.

FIG. 9 shows the filter characteristics of the duplexer in accordance with the third embodiment shown in FIG. 8. The characteristics shown in FIG. 9 are obtained in a case where the band center frequency F1 of the transmission filter 32 is lower than the band center frequency F2 of the reception filter 50. As is already known, a ladder type surface acoustic wave filter excels in power durability and exhibits steeper falls. In this embodiment, on the other hand, DMS filters that characteristically have steep rises are connected in parallel and are further cascaded, so that the insertion loss can be reduced and the power durability can be greatly improved. As shown in FIG. 9, the rise of the pass band of the reception filter 33 (on the low-frequency side) is steeper than that of the ladder type surface acoustic wave filter. Also, the insertion loss can be reduced, and the suppression on the side of the transmission filter 32 can be improved.

In the above description, the band center frequency F1 of the transmission filter 32 is lower than the band center frequency F2 of the reception filter 50, and the rise of the pass band of the transmission filter 32 at least partially overlaps the fall of the DMS filter 50. However, a duplexer that has the reception filter 50 with low insertion loss and greatly improved power durability can be realized, even if F1 is higher than F2.

Figure 10:
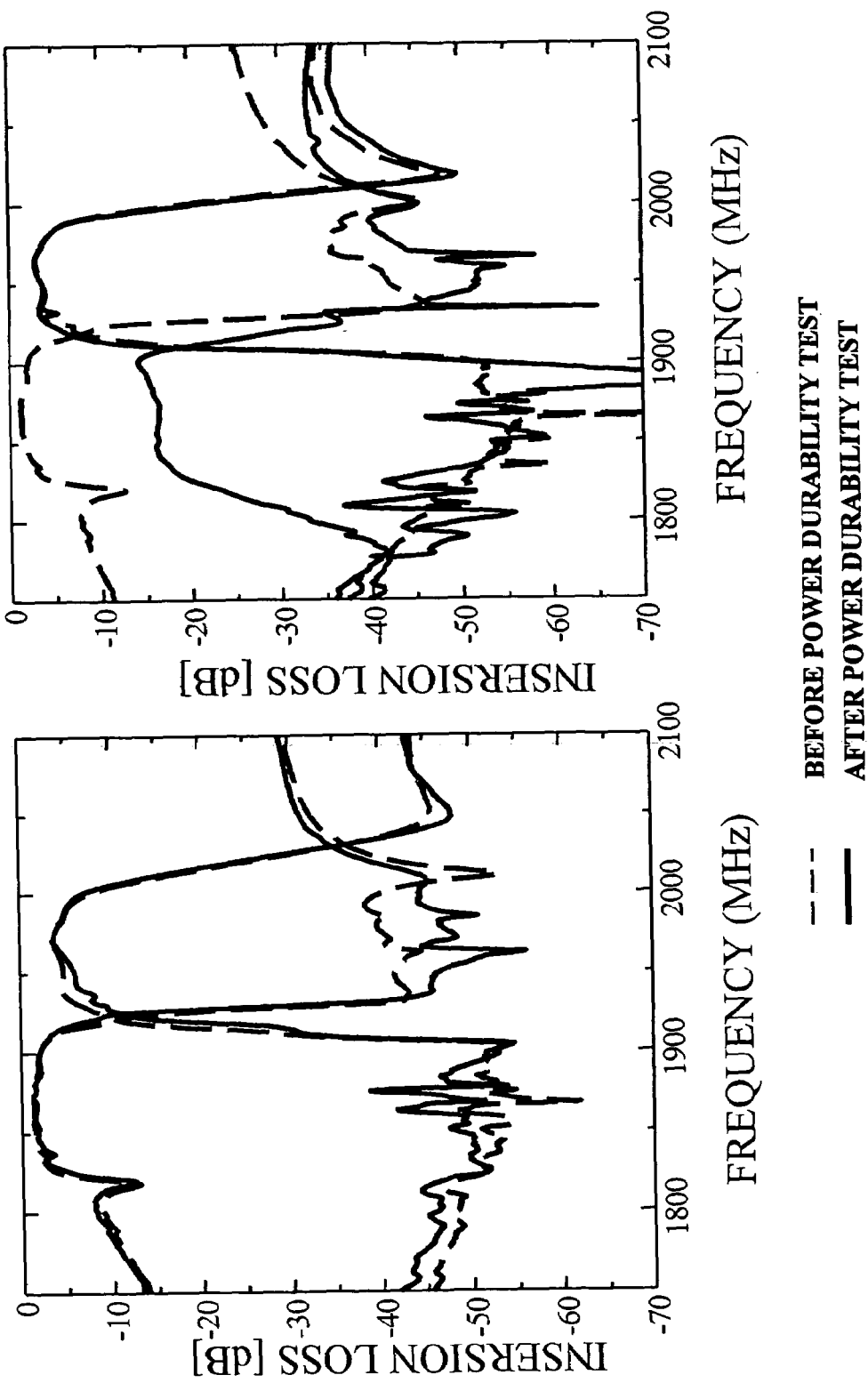
FIGS. 10A and 10B show an improvement in power durability with an increase in the number of DMS filters connected in parallel.

FIGS. 10A and 10B illustrates a case where the number of DMS filters connected in parallel is increased to improve the power durability.

The inventors of the present invention conducted a power durability test on the structure shown in FIG. 8. In this test, power was applied to the transmission terminal 15, and output signals were taken out from the common terminal 14. With the power being applied to the transmission filter 32, the transmission filter 32 should break first after a certain lapse of time in a normal power durability test. In the power durability test carried out on the structure shown in FIG. 8, however, the reception filter 50 broke first, as shown in FIG. 10A. This is because a power leakage was caused in the reception filter 50 due to slight impedance mismatching between the transmission filter 32 and the reception filter 50, and the power leakage led to the breakdown of the reception filter 50.

To improve the power durability of the DMS filters, a set of three DMS filters connected in parallel was cascaded to another set of three DMS filters connected in parallel. The opening length of each of the DMS filters was a third of the opening length of a single DMS filter. As a result, the power applied to each DMS filter was reduced, and the power durability was increased, as shown in FIG. 10B.

Accordingly, when DMS filters are employed for the reception filter of a duplexer, a single DMS filter or cascaded single DMS filters are not suitable in terms of power durability. It is therefore necessary to connect two or more DMS filters in parallel.

(Fourth Embodiment)

Figure 11:
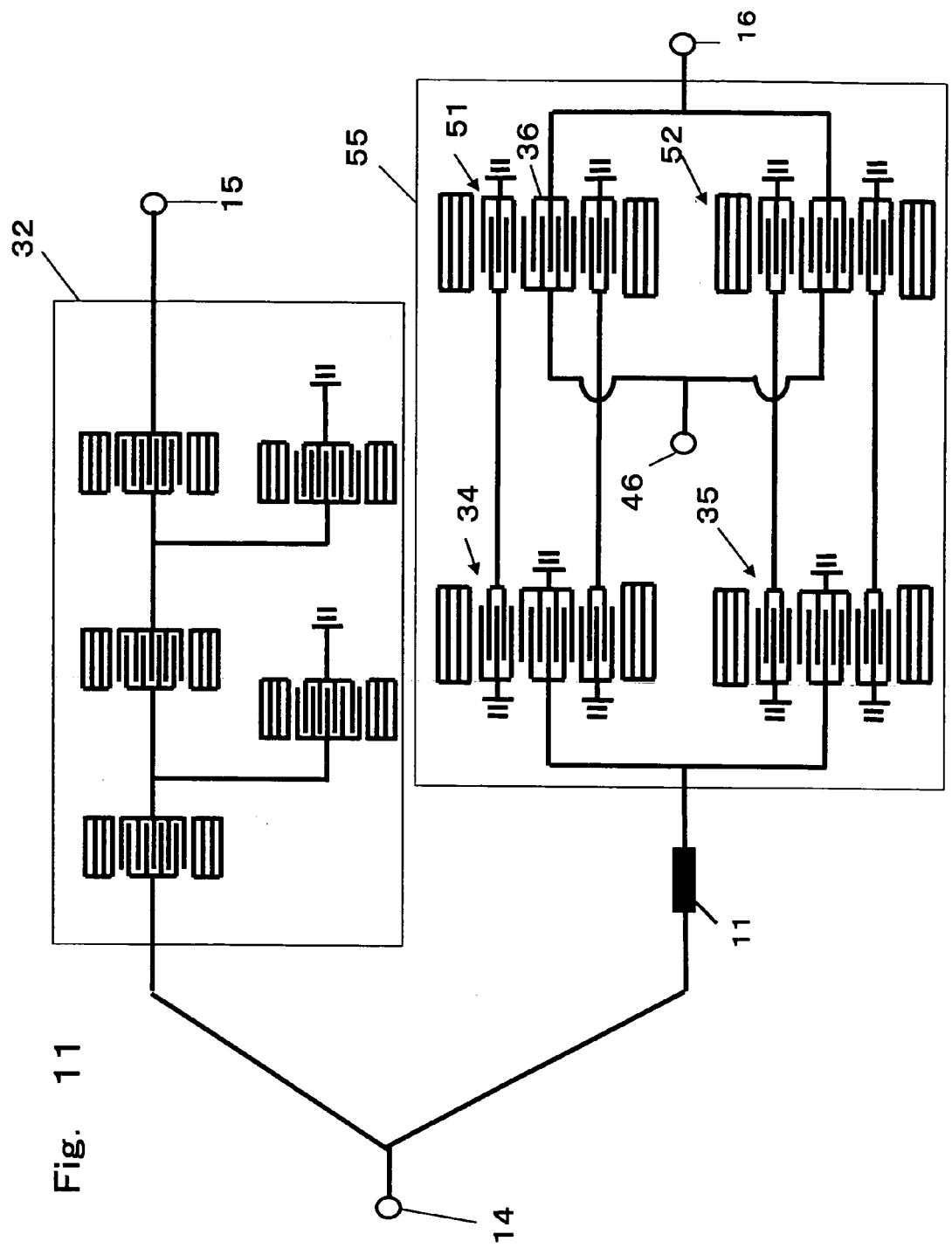
FIG. 11 shows the filter characteristics of a duplexer in accordance with a fourth embodiment of the present invention.

FIG. 11 illustrates a duplexer in accordance with a fourth embodiment of the present invention. In this figure, the same components as those of the foregoing embodiments are denoted by the same reference numerals as those of the foregoing embodiments. The duplexer shown in FIG. 11 differs from the duplexer of the third embodiment in that the reception filter has a balanced (differential) output through modified connections. This reception filter is shown as a reception filter 55 in FIG. 11. In this embodiment, the comb-like electrodes of the IDTs 36 of the DMS filters 51 and 52 that are grounded in FIG. 8 are connected to each other, and the comb-like electrodes are also connected to a reception terminal 46. A balanced output can be obtained through the reception terminal 46 and another reception terminal 16.

(Fifth Embodiment)

FIG. 12A is a longitudinal section view of a duplexer in accordance with a fifth embodiment of the present invention. FIG. 12B is a plan view of the duplexer, with the cap shown in FIG. 12A being removed. This embodiment is a packaged duplexer having one of the structures of the first through fifth embodiments. The packaging described below can be applied to duplexers having structures other than those of the first through fifth embodiments.

The duplexer shown in FIG. 12A includes a laminated package 60, a chip 69, a phase matching line pattern 72, and a cap 67. The laminated package 60 has five layers 61 through 65 laminated as shown in FIG. 12A. The layer 61 is a cap mounting layer. The layer 62 is a wire bonding pad layer. The layer 63 is a die-attach layer. The layer 64 is a phase matching line pattern layer. The layer 65 is a common ground/foot pad layer. Each of the layers 61 through 65 is made of a material having a relative permittivity ($\epsilon$) of approximately 9.5, such as alumina or glass ceramics. The cap mounting layer 61 and the wire bonding pad layer 62 form step-like parts inside the package. The step-like parts form a concavity to accommodate the chip 69. The chip 69 is accommodated in the concavity, and may be formed by a single chip unit or plural (two, for example) chip units. In a case of a single chip unit, transmission and reception filters are formed on a single piezoelectric substrate. In a case where two chips 69 are employed, on the other hand, the transmission filter is formed in one of the chips, and the reception filter is formed in the other. In this embodiment, a single chip 69 is employed. This chip 69 is secured onto a die-attach unit 70 formed on the die-attach layer 63 with a conductive adhesive 71. The die-attach unit 70 forms a chip mounting surface, and is made of a conductive material such as Al. The size of the laminated package 60 is approximately 5 mm×5 mm×1.5 mm, or 3.8 mm×3.8 mm×1.5 mm, with the height (thickness) of the package being 1.5 mm.

The cap 67 is placed on the cap mounting layer 61. FIG. 13A is a plan view of the duplexer shown in FIGS. 12A and 12B. The cap 67 hermetically seals the chip 69. The cap 67 is formed with metal plating such as Au plating or Ni plating. On the sides of the laminated package 60, semicircular grooves 83 are formed. In the example shown in FIG. 13A, three of the grooves 83 are formed on each side. These grooves 83 continue from the cap mounting layer 61 to the common ground/foot pad layer 65. A conductive layer is provided in each of the grooves 83 to form a connection path (side castellation) 75 (see FIG. 12A). The connection paths 75 create continuity among the layers, and can also be used as external connection terminals. The "COMMON GROUND" shown in FIG. 13A will be described later.

FIG. 12B is a plan view of the structure, with the cap 67 shown in FIG. 12A being removed. The chip 69, the cap mounting layer 61, and part of the wire bonding pad layer 62 can be seen, with the cap 67 being removed. As shown in FIG. 12B, a seal ring 74 made of a conductive material such as Al is formed on the cap mounting layer 61. The cap 67 is placed on the seal ring 74. The cap mounting layer 61 has an opening 73 in the center. The opening 73 forms the concavity for accommodating the chip 69. The seal ring 74 is connected to the connection paths 75, except the four connection paths 75 located in the centers of the four side surfaces.

The chip 69 forms the ladder type surface acoustic wave filter and the DMS filters of any of the first through fourth embodiments. The chip 69 may form the ladder type surface acoustic wave filter 32 and the DMS filter 50 shown in FIG. 8, for example. In that case, the ladder type surface acoustic wave filter 32 is a transmission filter, and the DMS filter 50 is a reception filter. The blocks denoted by reference numeral 77 are the resonators (the pattern of electrodes and reflectors) of the ladder type surface acoustic wave filter 32 that are schematically shown. The blocks denoted by reference numeral 78 are the resonators (the pattern of electrodes and reflectors) of the DMS filter 50 that are also schematically shown. These resonators are wired, as shown in FIG. 8, using a wiring pattern formed on the substrate. The resonators are also connected to wire bonding pads 79 formed on the substrate of the chip 69. The substrate is made of a piezoelectric single crystal material such as $LiTaO_3$ (at 43 degrees, Y-cut, X-propagation, for example). The electrodes on the substrate are formed in the following manner. An alloy film mainly containing Al (such as Al—Cu or Al—Mg) or an alloy multi-layer film mainly containing Al (such as Al—Cu/Cu/Al—Cu, Al/Cu/Al, Al/Mg/Al, or Al—Mg/Mg/Al—Mg) is formed by sputtering, and is then exposed. Etching and patterning are performed on the film to form the electrodes on the substrate.

The wire bonding pads 79 are connected to wire bonding pads 80 formed on the wire bonding pad layer 62, using bonding wires 68. The bonding wires 68 may be made of Al—Si, for example. Some of the wire bonding pads 79 are provided with vias $86_1$ through $86_4$ to establish electric connections with other layers.

As shown in FIG. 13B, the wire bonding pad layer 62 has an opening 84 in the center. The opening 84 is smaller than the opening 73 of the cap mounting layer 61. The wire bonding pads 79 are arranged along two facing sides of the opening 84. A wiring pattern is also formed on the wire bonding pads 79.

Figure 14:
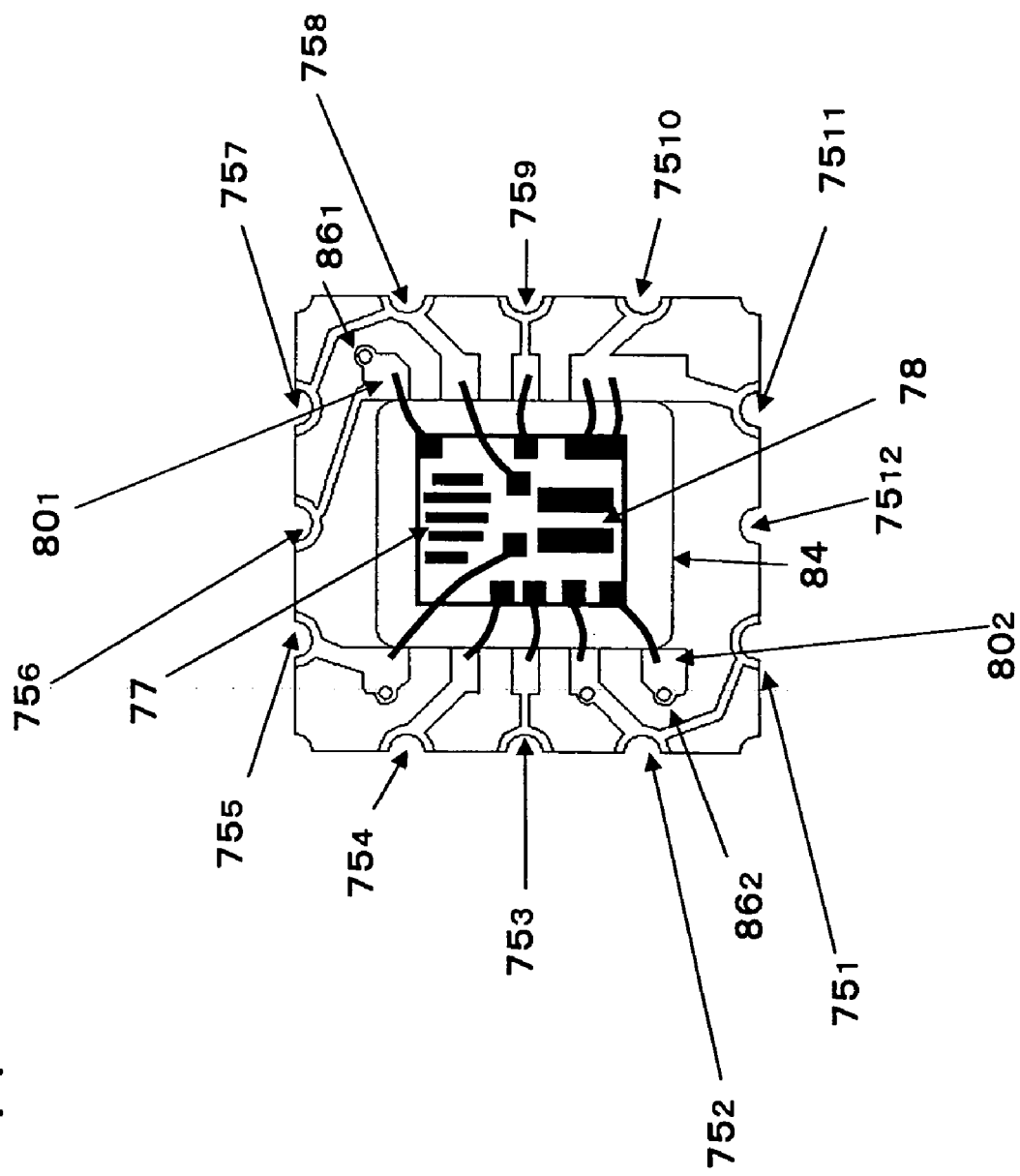
FIG. 14 shows the connections between the chip and the wire bonding pad layer of the duplexer in accordance with the fifth embodiment of the present invention.

FIG. 14 illustrates the connections between the chip 69 and the wire bonding pad layer 62. Reference numerals $75_1$ through $75_{12}$ in FIG. 14 indicate the twelve connection paths (side castellation) 75. The remarks accompanying reference numerals $75_1$ through $75_{12}$ explain the functions of the corresponding connection paths. The connection paths $75_1$ and $75_2$ form the grounds of the first stage (the stage formed by the DMS filters 34 and 35 in FIG. 8) of the DMS filter 50. The connection path $75_3$ establishes the connection with the foot castellation (formed by foot pads described later) of the transmission terminal 15 shown in FIG. 8. The connection path $75_4$ forms the grounds of the ladder type surface acoustic wave filter 32. The connection path $75_5$ forms the grounds of the first-stage of the DMS filter 50, or the grounds of the ladder type surface acoustic wave filter 32. The connection path $75_6$ establishes the connection with the foot castellation of the common terminal (an antenna terminal) 14 shown in FIG. 8. The connection paths $75_7$ and $75_8$ form the grounds of the second stage (the stage formed by the DMS filters 51 and 52 in FIG. 8) of the DMS filter 50. The connection path $75_9$ establishes the connection with the foot castellation of the reception terminal 16 shown in FIG. 8. The connection paths $75_{10}$ and $75_{11}$ form the grounds of the second stage of the DMS filter 50. (The connection path $75_{12}$ is not connected to the pattern on the wire bonding pad layer 62.

As described above, the grounds of the first stage of the DMS filter 50 is connected to the connection paths (external connection terminals formed by foot pads described later) $75_1$ and $75_2$ (the connection path $75_5$ may be included), and the grounds of the second stage of the DMS filter 50 is connected to the connection paths (external connection terminals) $75_7$, $75_8$, $75_{10}$, and $75_{11}$. The grounds are reinforced in this manner, so that the inductance components are reduced, and the stop-band suppression can be increased. The connection paths $75_1$, $75_2$, $75_7$, $75_8$, $75_{10}$, and $75_{11}$ (the connection path $75_5$ may be included) that form the above grounds are made common to the seal ring 74 formed on the cap mounting layer 61 and a common ground pattern 76 formed on the upper surface of the common ground/foot pad layer 65. In other words, these connection paths are not made common to the intermediate layers 62, 63, and 64. Accordingly, the stop-band suppression by the duplexer can be dramatically increased. This aspect will be described later in detail, with reference to FIG. 16.

The connection paths $75_1$ through $75_{11}$ having the above functions are connected to the corresponding wire bonding pads 80 with leading wires. Among the wire bonding pads 80, the one denoted by reference numeral $80_1$ is a wire bonding pad provided at the inlet (one end) of the phase matching line pattern 72, and the one denoted by reference numeral $80_2$ is a wire bonding pad provided at the outlet (the other end) of the phase matching line pattern 72. These pads $80_1$ and $80_2$ are connected to the inlet and the outlet of the phase matching line pattern 72 formed on the phase matching line pattern layer 64 with the vias $86_1$ and $86_2$. The die-attach layer 63 has a structure shown in FIG. 13C. The die-attach unit 70 that constitutes the ground pattern is formed on the die-attach layer 63. In the die-attach unit 70, four thick-paint blocks in contact with the chip 69 are formed. The four thick-paint blocks are formed by thickly painting these blocks, when the die-attach unit 70 is formed. As shown in FIG. 12A, the chip 69 is attached onto the die-attach unit 70, using the conductive adhesive 71. The four thick-paint blocks spread the conductive adhesive 71 on the entire bottom face of the chip 69. The die-attach unit 70 is connected to the connection paths $75_1$, $75_2$, and $75_5$ that function as grounds, via leading patterns 87. However, the die-attach unit 70 is not connected to the connection paths $75_7$, $75_8$, $75_{10}$, and $75_{11}$, shown in FIG. 14, which form the ground of the second stage of the DMS filter 50. Accordingly, there is no continuity between the first stage and the second stage in the DMS filter 50. With this ground structure, the suppression by the filter can be improved, as will be described later.

The die-attach layer 63 is provided over the phase matching line pattern layer 64 shown in FIG. 13D. As shown in FIG. 13D, the phase matching line pattern 72 is formed on the phase matching line pattern layer 64. The phase matching line pattern 72 is a line pattern that is bent so as to maintain a predetermined length. The phase matching line pattern 72 is made of a conductive material mainly containing copper (Cu), silver (Ag), tungsten (W), or the like. More specifically, a conductive film is formed on the phase matching line pattern layer 64, and is then patterned by laser trimming or the like, to thereby form the phase matching line pattern 72. Both ends of the phase matching line pattern layer 64 are connected to the vias $86_1$ and $86_2$. The phase matching line pattern 72 is a strip line pattern of approximately 80 μm to 120 μm in width. Ground potential patterns sandwiching the phase matching line pattern 72 form the ground for the strip line. Unlike with a circuit component, the quality of the products is substantially uniform with the phase matching line pattern 72. Thus, stable filter characteristics can be obtained.

In the following, the functions of the phase matching line pattern 72 will be described. FIGS. 15A and 15B are graphs showing impedance comparisons between the reception filters of the conventional duplexer shown in FIG. 2 (the ladder type surface acoustic wave filter 13 being used as the reception filter) and the duplexer of the present invention shown in FIG. 8 (the DMS filter 50 being used as the reception filter). As shown in FIG. 15A, prior to phase rotation, the ladder type surface acoustic wave filter 13 and the DMS filter 50 have different impedance characteristics. To increase the impedance of the transmission band to infinity after phase rotation, the phase matching line pattern 72 connected to the DMS filter 50 should preferably have a length of 0.28 λ to 0.34 λ, as shown in FIG. 15B. Here, λ represents the wavelength of the surface acoustic wave to be transmitted through the DMS filter 50. In the case of the ladder type surface acoustic wave filter 13, on the other hand, a phase matching line pattern of approximately 0.2 λ to 0.25 λ (λ/4) is provided, so that the impedance of the transmission band after phase rotation approaches to infinity (λ representing the wavelength of the surface acoustic wave to be transmitted through the ladder type surface acoustic wave filter 13).

Further, ground patterns 88 and 89 are formed on the phase matching line pattern layer 64, as shown in FIG. 13D. The ground patterns 88 are connected to the corresponding ones of the wire bonding pads 80 on the wire bonding pad layer 62 through the vias $86_3$ and $86_4$. The ground patterns 89 are connected to the corresponding ones of the connection paths 75. As the ground patterns 88 and 89 are formed on the phase matching line pattern 64 in this manner, the grounds can be reinforced, the inductance components can be reduced, and the suppression can be increased.

The ground patterns 88 and 89 are arranged so as not to overlap signal lines of other layers and bonding pads connected to the signal lines. More specifically, the ground patterns 88 and 89 are arranged so as not to overlap the patterns connected to the connection paths $75_3$ (transmission signal), $75_6$ (transmission/reception signal), and $75_9$ (reception signal), as well as the wire bonding pads 80. With this arrangement, the capacitance components between the signals and the grounds can be reduced, and improved impedance matching can be achieved. Thus, the insertion loss in the duplexer can be reduced.

The common ground/foot pad layer 65 is provided under the phase matching line pattern layer 64. FIG. 13E is a top view of the common ground/foot pad layer 65, and FIG. 13F is a perspective view of the bottom face of the common ground/food pad layer 65, seen from the top. The common ground pattern 76 is formed on the upper face of the common ground/foot pad layer 65. The common ground pattern 76 covers substantially the entire area on the upper face. The common ground pattern 76 is connected to the connection paths 75 except the signal connection paths $75_3$, $75_6$, and $75_9$, and also is connected to the ground patterns 88 shown in FIG. 13D and the corresponding ones of the wire bonding pads 80 shown in FIG. 13D, through the vias $86_3$ and $86_4$. With this structure, inductance components can be reduced by reinforcing the grounds, and the suppression can be increased.

The bottom face of the common ground/foot pad layer 65 is the mounting face of the duplexer. The duplexer is mounted on a wiring board, with the mounting face facing the wiring board. As shown in FIG. 13F, foot pads (foot castellation) $66_1$ through $66_{12}$ to be connected to the connection paths $75_1$ through $75_{12}$, respectively, are formed on the mounting face. The foot pads $66_1$ through $66_{12}$ function as external connection terminals, and are brought into contact with the corresponding electrodes on the wiring board, so as to establish electric connections. The foot pads $66_1$ and $66_2$ are the ground terminals for the first stage of the DMS filter 50. The foot pad $66_3$ is the transmission terminal 15 of the duplexer. The foot pad $66_4$ is the ground terminal for the ladder type surface acoustic wave filter 32. The foot pad $66_5$ is the ground terminal for the first stage of the DMS filter 50 or the ground terminal for the ladder type surface acoustic wave filter 32. The foot pad $66_6$ is the common terminal 14 to which an antenna can be connected. The foot pads $66_7$ and $66_8$ function as the ground terminals for the second stage of the DMS filter 50. The foot pad $66_9$ is the reception terminal 16. The foot pads $66_{10}$ and $66_{11}$ are ground terminals for the second stage of the DMS filter 50. The foot pad $66_{12}$ is a ground terminal connected to the common ground pattern 76. In FIGS. 12A and 12B, these foot pads are shown simply as foot pads 66.

The above structure of the fifth embodiment can be summed up as follows, with emphasis being put on the ground structure.

Where the DMS filter 50 has a structure in which the set of dual-mode type surface acoustic wave filters 34 and 35 connected in parallel is cascaded to the other set of dual-mode type surface acoustic wave filters 51 and 52 connected in parallel, the intermediate layers 62, 63, and 64 contained in the laminated package 60 do not have a pattern for making the grounds common between the two dual-mode type surface acoustic wave filters. Thus, the stop-band suppression by the DMS filter 50 can be improved.

Also, where the DMS filter 50 has a structure in which the set of dual-mode type surface acoustic wave filters 34 and 35 connected in parallel is cascade-connected to the other set of dual-mode type surface acoustic wave filters 51 and 52 connected in parallel, the wire bonding pad layer 62 contained in the laminated package 60 has first pads (the wire bonding pads to be connected to the connection paths $75_1$ and $75_2$ (the connection path $75_5$ may also be included)) to be connected to the grounds of the dual-mode type surface acoustic wave filters 34 and 35 of the first stage with the bonding wires 68, and second pads (the wire bonding pads 80 to be connected to the connection paths $75_7$, $75_8$, $75_{10}$, and $75_{11}$) to be connected to the grounds of the dual-mode type surface acoustic wave filters 51 and 52 of the second stage by wire bonding. The first pads and the second pads are independent (uncommon) grounds on the wire bonding pad layer 62.

Figure 16:
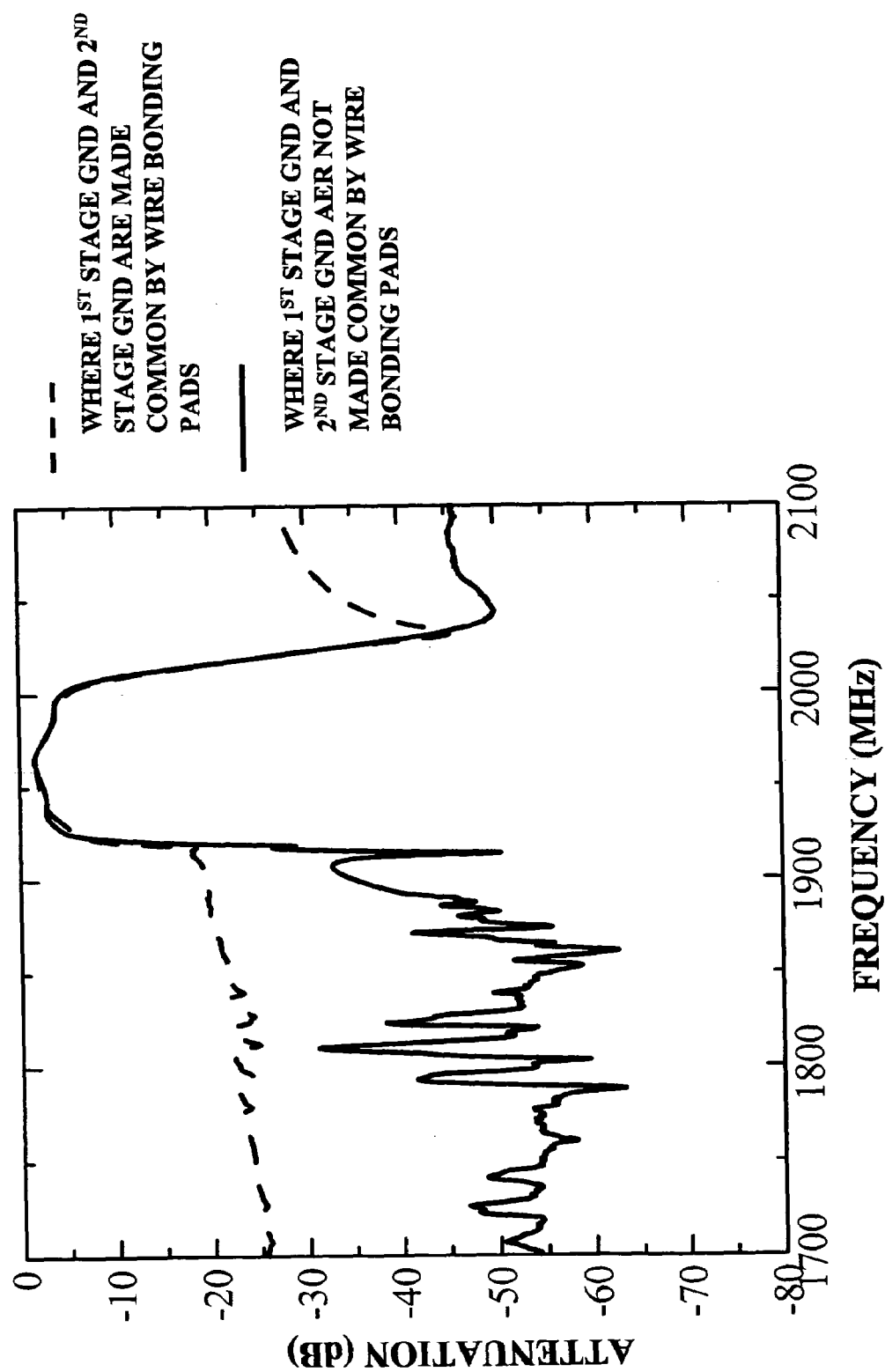
FIG. 16 shows the characteristics of dual-mode type surface acoustic wave filters.

FIG. 16 is a graph showing the filter characteristics of a two-stage DMS filter having grounds that are made common to both the first stage and the second stage with wire bonding pads (a case where the wire bonding pad layer 62 makes the grounds common), and the filter characteristics of the DMS filter 50 having independent grounds for the first stage and the second stage that do not communicate with each other with the wire bonding pads 80. As can be seen from FIG. 16, the stop-band suppression by the DMS filter 50 that does not have grounds made common is dramatically improved. To achieve the effect shown in FIG. 16, it is necessary to maintain the independence of the grounds of the first stage from the second stage, and vice versa, in the DMS filter 50 formed in the chip 69.

Where the DMS filter 50 has a structure in which the set of dual-mode type surface acoustic wave filters 34 and 35 connected in parallel is cascaded to the other set of dual-mode type surface acoustic wave filters 51 and 52 connected in parallel, the grounds of the dual-mode type surface acoustic wave filters are made common to both the first stage and the second stage, by virtue of the first layer 61 forming the upper surface of the laminated package 60 and the second layer 65 forming the common ground pattern 76. The intermediate layers 62, 63, and 64 do not make the grounds common. With this structure, the stop-band suppression can be improved, and adverse influence of external noise can be easily avoided.

Also, where the DMS filter 50 has a structure in which the set of dual-mode type surface acoustic wave filters 34 and 35 connected in parallel is cascaded to the other stage of dual-mode type surface acoustic wave filters 51 and 52 connected in parallel, the first pads (the wire bonding pads 80 connected to the connection paths $75_1$ and $75_2$ (the connection path $75_5$ may be included)) to be connected to the grounds of the dual-mode type surface acoustic wave filters 34 and 35 of the first stage by wire bonding, and the second pads (the wire bonding pads 80 connected to the connection paths $75_7$, $75_8$, $75_{10}$, and $75_{11}$) to be connected to the grounds of the dual-mode type surface acoustic wave filters 51 and 52 of the second stage, are connected to the external connection terminals (foot pads 66) formed an outer surface (the bottom surface in the fifth embodiment) of the laminated package 60. With this structure, the grounds are reinforced, and the inductance components are reduced to thereby increase the stop-band suppression.

The layers 61 through 65 contained in the laminated package 60 each has a ground pattern (i.e., the seal ring 74 on the cap mounting layer 61, the bonding pads 80 on the layer 62, the die-attach unit 70 on the layer 63, the ground patterns 88 and 89 on the layer 64, and the common ground pattern 76 on the layer 65) to be connected to the ground terminals (the foot pads 66 except the foot pads $66_3$, $66_6$, $66_9$) formed on an outer surface of the laminated package 60. With this structure, the grounds are reinforced, and the inductance components are reduced to thereby increase the stop-band suppression.

The intermediate layers 62 through 64 contained in the laminated package 60 have ground patterns (i.e., the bonding pads 80 on the layer 62, the die-attach unit 70 on the layer 63, and the ground patterns 88 and 89 on the layer 64) to be connected to the ground terminals (the foot pads 66 except the foot pads $66_3$, $66_6$, $66_9$) formed on an outer surface of the laminated package 60. Each of the ground patterns is located so as not to overlap a signal line pattern (the signal line pattern connected to the connection paths $75_3$, $75_6$, and $75_9$) formed on the laminated package 60, and the bonding pads connected to the signal line pattern. With this structure, the capacitance components can be reduced, and therefore, improved impedance matching can be achieved. Accordingly, the insertion loss of the duplexer can be reduced.

Although the fifth embodiment has been described by way of the above examples, various modifications can be made to the structure of the fifth embodiment. The laminated package 60, for example, is not limited to the five-layer structure, but may contain a desired number of layers (six layers, for example). Also, the chip 69 has a substrate made of a single piezoelectric material, and therefore, helps to reduce the size of the duplexer. However, the ladder type surface acoustic wave filter 32 and the DMS filter 50 may be formed on separate substrates. The materials used for the parts of the duplexer are not limited to the ones described above, but other suitable materials may be employed. Further, the ladder type surface acoustic wave filter 32 and the DMS filter 50 may not have the above number of stages. Also, any of the ladder type surface acoustic wave filters and DMS filters of the foregoing embodiments may be employed, instead of the ladder type surface acoustic wave filter 32 and the DMS filter 50.

(Sixth Embodiment)

Figure 17:
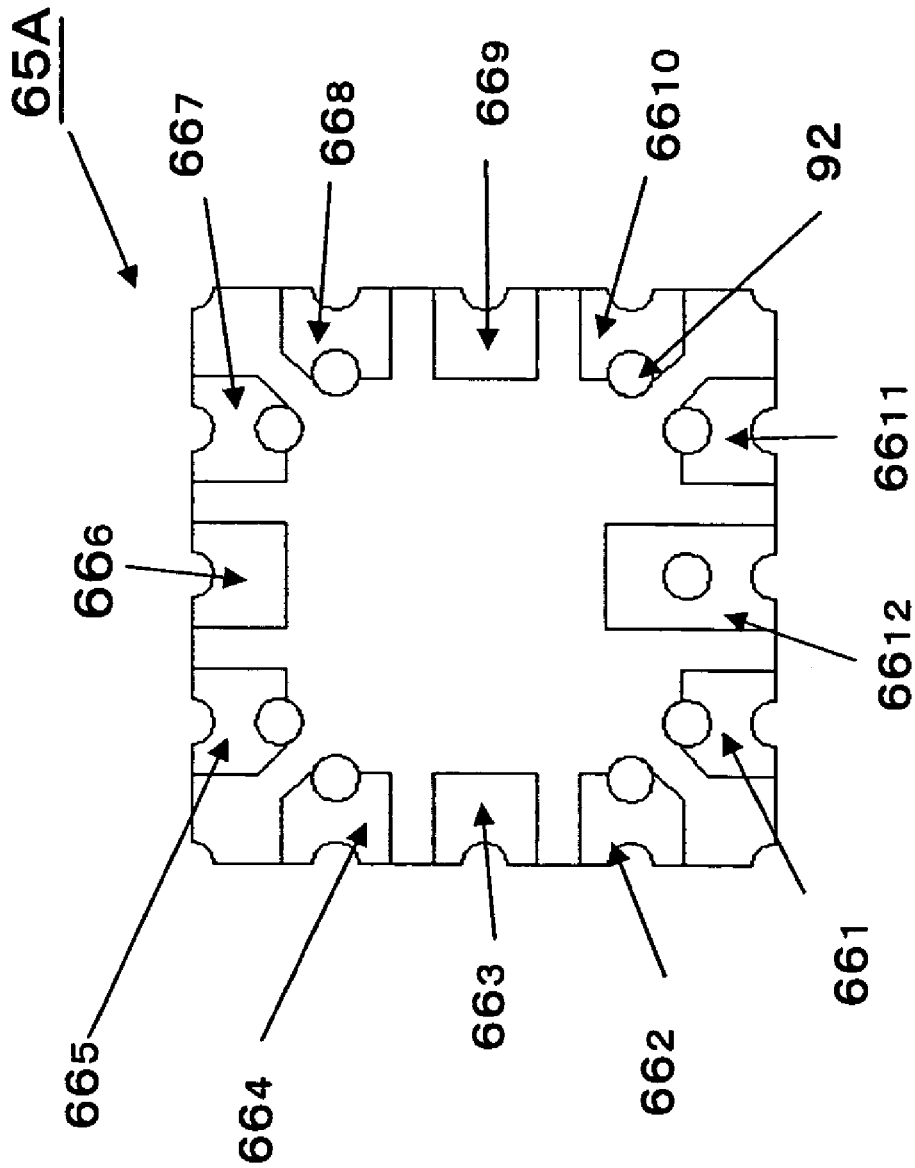
FIG. 17 is a perspective view of the bottom face of the common ground/foot pad layer, seen from the top, of a duplexer in accordance with a sixth embodiment of the present invention.

FIG. 17 is a perspective view of the lower surface (the bottom face) of the common ground/foot pad layer 65A, seen from the top, of a duplexer in accordance with a sixth embodiment of the present invention. In this figure, the same components as those of the foregoing embodiments are denoted by the same reference numerals as those of the foregoing embodiments. This embodiment has the same structure as the duplexer of the fifth embodiment, except for the common ground/foot pad layer 65A. The foot pads $66_1$, $66_2$, $66_4$, $66_5$, $66_7$, $66_8$, $66_{10}$, $66_{11}$, and $66_{12}$, which serve as ground terminals, are connected to the common ground pattern 76 through vias 92. With this structure, the grounds of the duplexer can be reinforced, and the inductance components can be reduced to thereby increase the stopband suppression.

(Seventh Embodiment)

FIGS. 18A through 18F illustrate each of the layers contained in the laminated package of a duplexer in accordance with a seventh embodiment of the present invention. In these figures, the same components as those of the foregoing embodiments are denoted by the same reference numerals as those of the foregoing embodiments. The seventh embodiment differs from the fifth embodiment in the structure of the common ground/foot pad layer. A common ground formed on the upper face of a common ground/foot pad layer 65B shown in FIGS. 18E and 18F is divided into two common ground patterns 76A and 76B by a narrow dividing groove 93. The common ground pattern 76A is connected to the connection paths $75_1$ and $75_2$, and forms the grounds of the first stage of the DMS filter 50. The common ground pattern 76B is connected to the connection paths $75_7$, $75_8$, $75_{10}$, and $75_{11}$, and forms the grounds of the second stage of the DMS filter 50. The common ground pattern 76A is not connected to the connection path $75_4$ that is connected to the ground of the ladder type surface acoustic wave filter 32. Also, as the connection path $75_5$ functions as a ground of the first stage of the DMS filter 50, the common ground pattern 76A functions as a common ground only for the DMS filter 50. In this manner, the common ground of the first stage is completely separated from the common ground of the second stage in the DMS filter 50. Thus, a duplexer that efficiently avoids adverse influence of external noise can be realized.

(Eighth Embodiment)

Figure 19A:
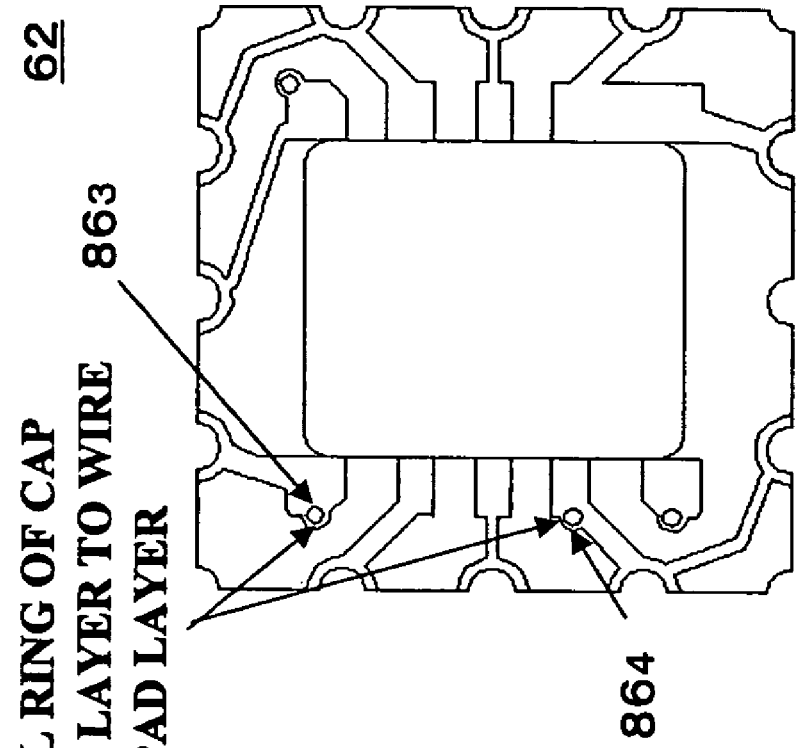
FIG. 19A is a plan view of the cap mounting layer of a duplexer in accordance with an eighth embodiment of the present invention.
Figure 19B:
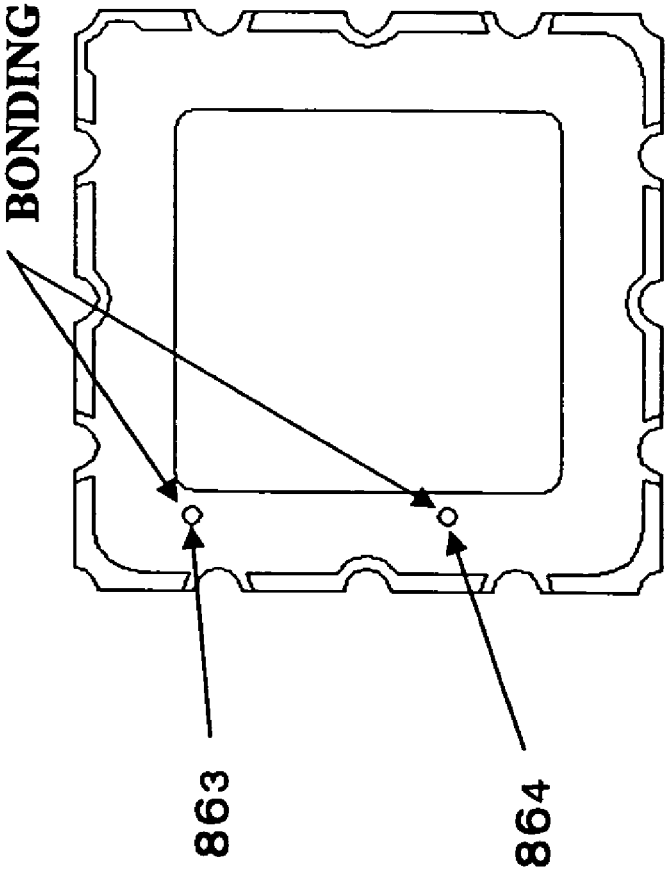
FIG. 19B is a plan view of the wire bonding pad layer of the duplexer of FIG. 19A.

FIGS. 19A and 19B are plan views of the cap mounting layer 61A and the wire bonding pad layer 62 of a duplexer in accordance with an eighth embodiment of the present invention. In these figures, the same components as those of the foregoing embodiments are denoted by the same reference numerals as those of the foregoing embodiments. The eighth embodiment differs from the fifth embodiment in the structure of the cap mounting layer. The seal ring 74 formed on the cap mounting layer 61A is connected to the wire bonding pads 80 connected to the connection paths $75_5$ and $75_2$ through the vias $86_3$ and $86_4$. With this structure, the grounds of the duplexer are further reinforced, and the inductance components are reduced to thereby improve the increase the stop-band suppression even further.

(Ninth Embodiment)

Figure 20A:
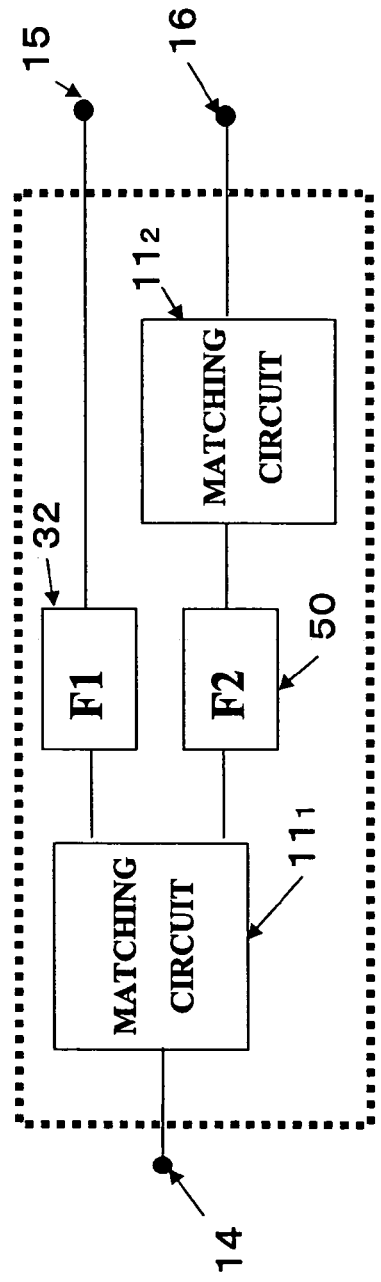
FIG. 20A illustrates the circuit structure of a duplexer in accordance with a ninth embodiment of the present invention.
Figure 20B:
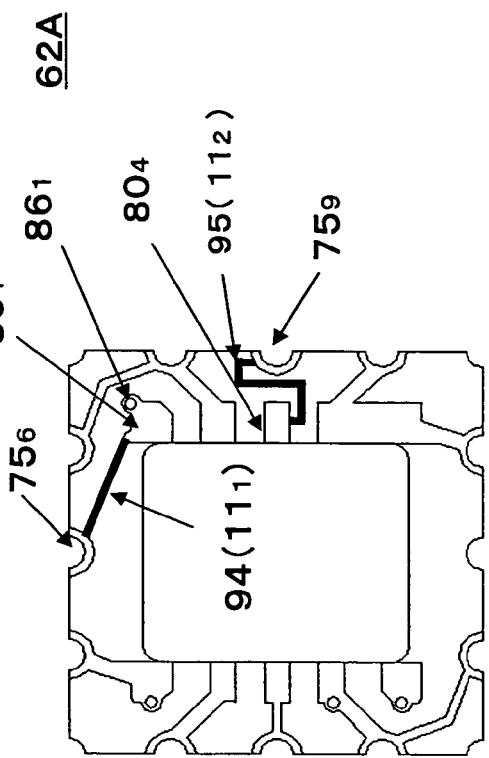
FIG. 20B is a plan view of the wire bonding pad layer of the duplexer of FIG. 20A.

FIG. 20A illustrates the circuit structure of a duplexer 200 in accordance with a ninth embodiment of the present invention. FIG. 20B is a plan view of the wire bonding pad layer 62A of the duplexer 200. In these figures, the same components as those of the foregoing embodiments are denoted by the same reference numerals as those of the foregoing embodiments. The ninth embodiment differs from the fifth embodiment in the structure of the matching circuit. As shown in FIG. 20A, the duplexer 200 includes two matching circuits $11_1$ and $11_2$. The matching circuit $11_1$ is interposed between the two filters 32 and 50, and adjusts the phases of the filters 32 and 50. The matching circuit $11_2$ is provided on the output side of the DMS filter 50.

To realize the structure shown in FIG. 20A, the duplexer 200 includes the wire bonding pad layer 62A shown in FIG. 20B. As shown in FIG. 20B, line patterns 94 and 95 are formed on the wire bonding pad layer 62A. The line pattern 94 forms part of the matching circuit $11_1$, and the line pattern 95 forms the matching circuit $11_2$. More specifically, the line pattern 94 forms the part of the matching circuit $11_1$ between the common terminal 14 and the ladder type surface acoustic wave filter 32, and the line pattern 94 and the phase matching line pattern 72 shown in FIG. 13D form the part of the matching circuit $11_1$ between the common terminal 14 and the DMS filter 50. The line pattern 94 is connected to one end of the phase matching line pattern 72 through the via $86_1$. The line pattern 95 is formed between the wire bonding pad $80_4$ wire-bonded to the reception terminal 16 connected to the DMS filter 50, and the connection path $75_9$ connected to the foot pad $66_9$ corresponding to the reception terminal 16. With this structure, the impedance of the duplexer 200 can be adjusted at several points, so that improved impedance matching can be achieved. As a result, the insertion loss of the duplexer 200 is reduced. In the example shown in FIG. 20B, the line pattern 94 is a straight line pattern, and the line pattern 95 is a bent line pattern. However, patterns of other shapes may also be employed, as will be described next.

(Tenth Embodiment)

FIG. 21A illustrates the circuit structure of a duplexer 210 in accordance with a tenth embodiment of the present invention. FIGS. 21B through 21D are plan views showing various examples of the wire bonding pad layers of the duplexer 210. In these figures, the same components as those of the foregoing embodiments are denoted by the same reference numerals as those of the foregoing embodiments. As shown in FIG. 21A, the duplexer 210 has the same circuit structure as that of the duplexer 200 shown in FIG. 20A.

A wire bonding pad layer 62B shown in FIG. 21B has a via 96 in the line pattern 94. The via 96 is connected to the phase matching line pattern 72 shown in FIG. 13D. By adjusting the position of the via 96, the line length of the phase matching line pattern formed between the common terminals 14 and the DMS filter 50 can be adjusted. The line pattern 97 shown in FIG. 21B is a straight line pattern.

A wire bonding pad layer 62C shown in FIG. 21C has a line pattern 98 that forms the matching circuit $11_1$. The length of the line pattern 98 is varied so as to adjust the line length. The line pattern 98 is bent at several points, and is longer than the line pattern 94 shown in FIG. 21B. A wire bonding pad layer 62D shown in FIG. 21D is the same as the wire bonding pad layer 62B shown in FIG. 21B, except that the straight line pattern 97 is replaced with the bent line pattern 95.

With any of the above structures of the tenth embodiment, the impedance of the duplexer 210 can be adjusted at several points, and improved impedance matching can be achieved. As a result, the insertion loss of the duplexer 210 can be reduced.

(Eleventh Embodiment)

Figure 22G:
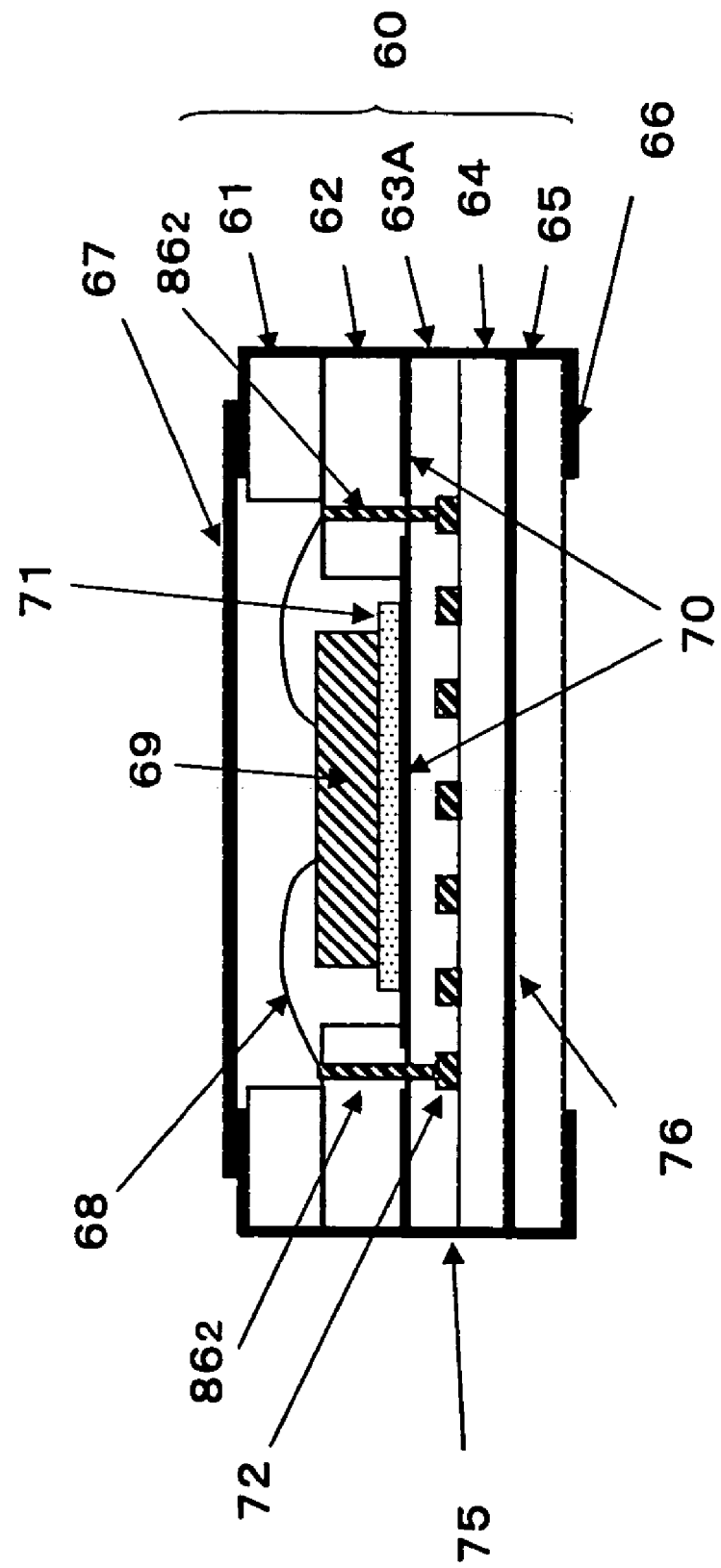
FIG. 22G is a section view of the duplexer in accordance with the eleventh embodiment.

FIGS. 22A through 22G illustrate a duplexer in accordance with an eleventh embodiment of the present invention. In FIGS. 22A through 22G, the same components as those of the foregoing embodiments are denoted by the same reference numerals as those of the foregoing embodiments. This embodiment differs from the fifth embodiment in the structure of the die-attach layer. FIG. 22C shows a die-attach layer 63A employed in the eleventh embodiment. It should be noted that FIGS. 22A, 22B, 22D through 22F are the same as FIGS. 13A, 13B, 13D through 13F. FIG. 22G is a section view of the duplexer in accordance with the eleventh embodiment.

As shown in FIG. 22C, a ground pattern 101 is formed on the die-attach layer 63A. The ground pattern 101 is arranged in such a position as to cover the phase matching line pattern 72 shown in FIG. 22D. The ground pattern 101 and the common ground pattern 76 shown in FIG. 22E sandwich the phase matching line pattern 72. The ground pattern 101 has four thick-paint blocks 102 on which the chip 69 is mounted. A hole 103 is formed around each of the vias $86_1$ and $86_2$, so as to prevent the ground pattern 101 from touching the vias $86_1$ and $86_2$ connected to the phase matching line pattern 72.

As the phase matching line pattern 72 is interposed between the upper and lower ground patterns 101 and 76, improved impedance matching can be achieved, and the insertion loss can be reduced. The reason for this is as follows. The characteristic impedance can be expressed by the following equation:

$$Z_0 = (L/C)^{1/2}$$

The phase matching line pattern 72 shown in FIG. 12A includes parts that are interposed between the die-attach unit 70 and the common ground pattern 76, and parts that are interposed between the cap 67 and the common ground pattern 76 (the parts in the vicinities of both ends of the line pattern 72). Since the cap 67 is located at a distance from the phase matching line pattern 72, the phase matching line pattern 72 is located at a distance from the ground. Accordingly, the capacitance formed at the parts between the cap 67 and the phase matching line pattern 72 is smaller than that at the other parts. As can be seen from the above equation, as the C becomes smaller, the characteristic impedance becomes higher. If a desired characteristic impedance is 50 Ω, the characteristic impedance of the phase matching line pattern 72 might exceed 50 Ω. In the structure shown in FIGS. 22A through 22G, on the other hand, the entire length of the phase matching line pattern 72 is interposed between the common ground pattern 76 and the ground pattern 101 formed on the die-attach layer 63A. Accordingly, any part of the phase matching line pattern 72 is close to the ground, and therefore, the characteristic impedance can be readily set at the desired impedance of 50 Ω.

Figure 23:
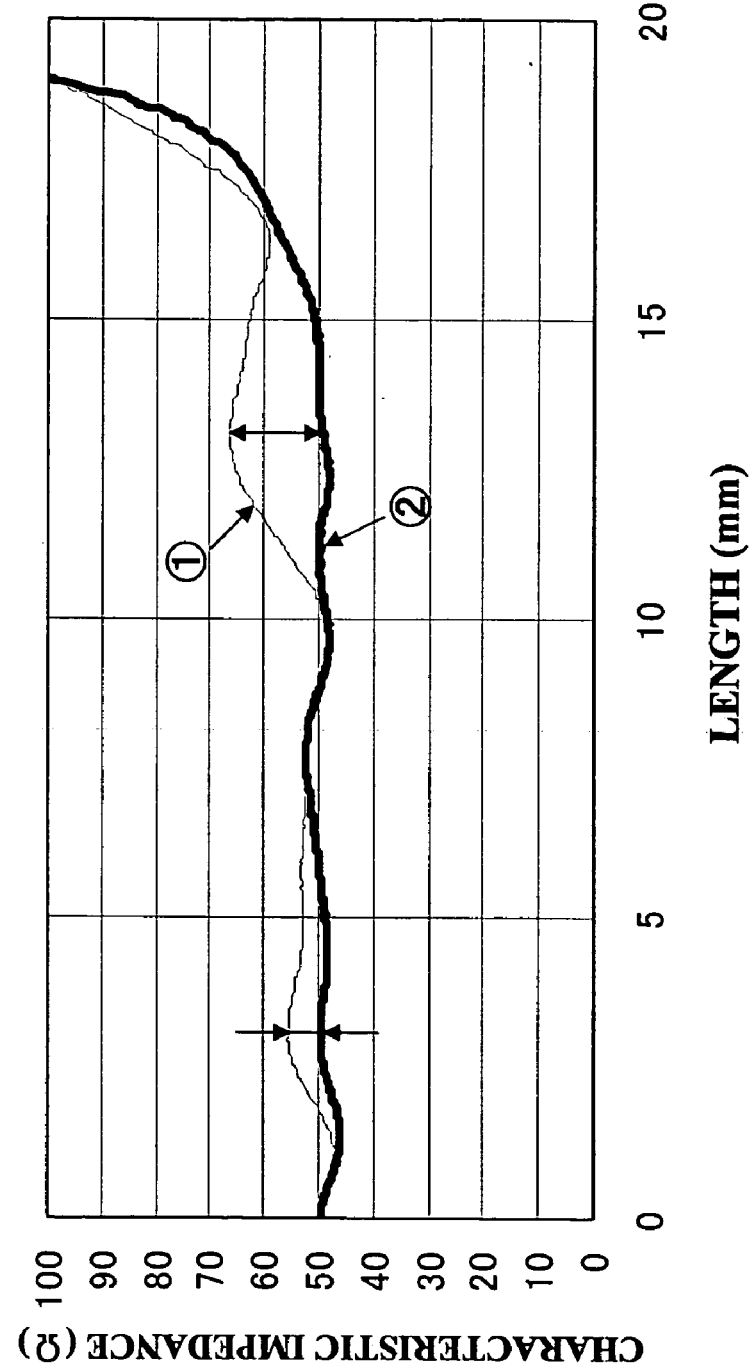
FIG. 23 is a graph showing the stability of the characteristic impedance of the phase matching line pattern employed in the eleventh embodiment, as well as the stability of the characteristic impedance of a comparative example.

FIG. 23 is a graph showing the stability of the characteristic impedance of the phase matching line pattern 72 employed in the eleventh embodiment, and the stability of the characteristic impedance of a comparative example. In the graph of FIG. 23, the abscissa axis represents the length (mm) of the phase matching line pattern 72, and the ordinate axis represents the characteristic impedance (Ω). The comparative example is a duplexer having the structure shown in FIGS. 24A through 24G. Unlike the die-attach layer 63A of the eleventh embodiment, the die-attach layer (shown in FIG. 24C) of the comparative example covers only the center of the phase matching line pattern 72. As shown in FIG. 24G, the cap 67 covers the neighboring areas of both ends of the phase matching line pattern 72. Unlike the structure shown in FIGS. 13A through 13F, the die-attach layer shown in FIG. 24C has the die-attach unit connected to only one connection path. The wire bonding layer shown in FIG. 24B is also different from either of the structures shown in FIGS. 22B and 13B. As shown in FIG. 23, in the eleventh embodiment, the characteristic impedance is stabilized at approximately 50 Ω, regardless of the length of the phase matching line pattern 72. In the comparative example, on the other hand, the characteristic impedance is unstable and sometimes exceeds 50 Ω, reaching 65 Ω at the maximum, as indicated by the arrows. When the characteristic impedance exceeds 50 Ω, impedance matching cannot be properly performed, and the insertion loss of the duplexer increases.

Figure 26:
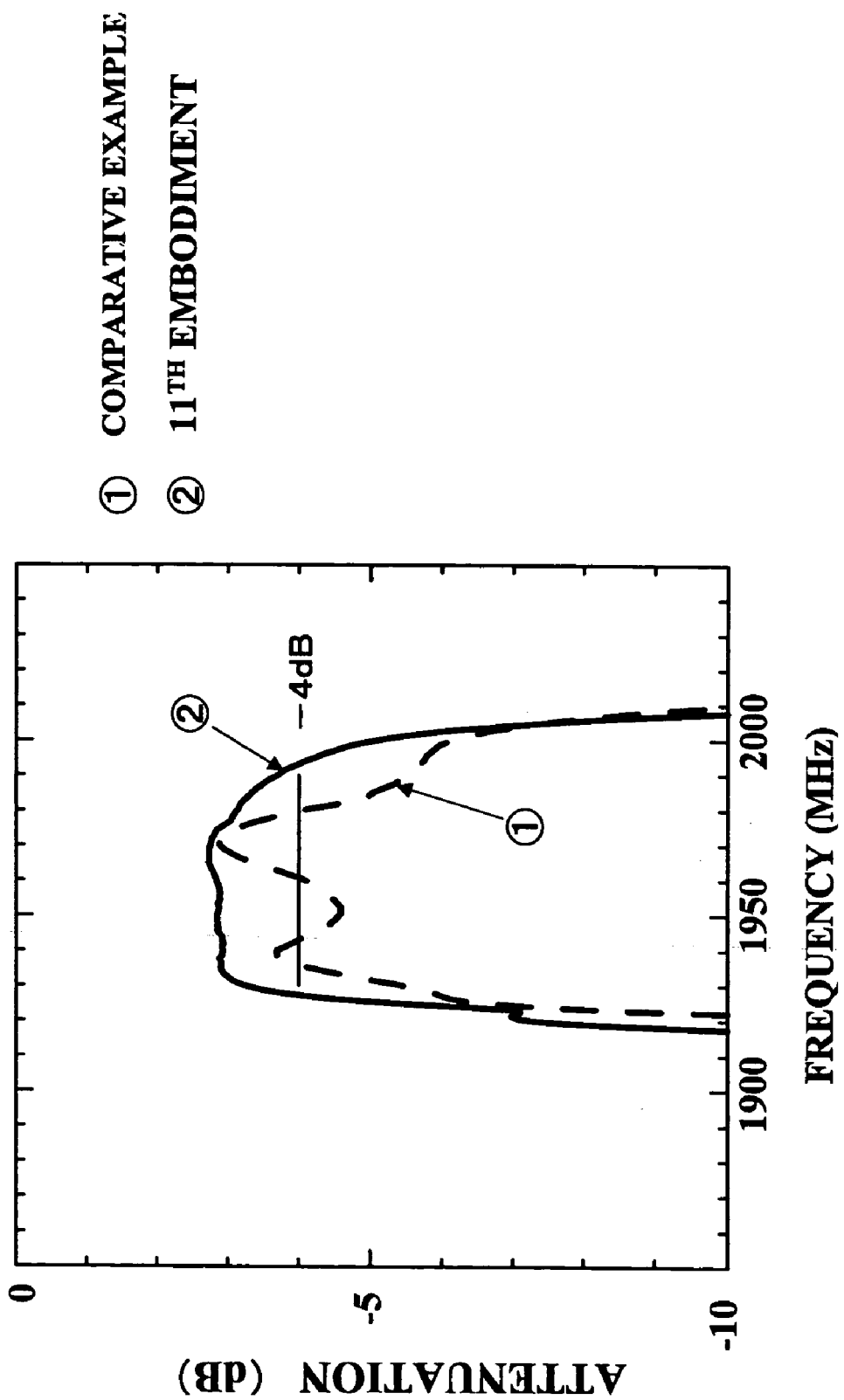
FIG. 26 shows an insertion loss comparison between the reception filters of the eleventh embodiment shown in FIGS. 22A through 22G and the comparative example shown in FIGS. 24A through 24G.

FIG. 25A shows the reflection characteristics of the independent reception filter (a DMS filter) employed in the comparative example shown in FIGS. 24A through 24G. FIG. 25B shows the reflection characteristics of the independent reception filter (the DMS filter 50) employed in the eleventh embodiment shown in FIGS. 22A through 22G. Here, "an independent reception filter" refers to a situation where the transmission filter of a duplexer is not connected to the common terminal 14. In the comparative example, as the characteristic impedance becomes as high as approximately 65 Ω, the impedance matching in the pass band shifts from 50 Ω. As a result, the insertion loss of the reception filter becomes large, as shown in FIG. 26. In the eleventh embodiment, on the other hand, the characteristic impedance of the phase matching line pattern 72 is steady at approximately 50 Ω, as shown in FIG. 23. Accordingly, the pass band is located in the neighborhood of 50 Ω with the reflection characteristics of the independent reception filter 50, and therefore, preferable impedance matching can be performed. As a result, the insertion loss of the reception filter 50 is small, as shown in FIG. 26. Particularly, for a duplexer for a band higher than 800 MHz such as a 1900 MHz band, a package material having a low permittivity as described earlier is employed. In that case, the variation in the characteristic impedance becomes significantly large, unless the phase matching line pattern 72 is covered with upper and lower ground surfaces, as shown in FIGS. 22A through 22G. Judging from the above facts, the structure shown in FIGS. 22A through 22G is suitable particularly for the use in a high-frequency band of 800 MHz or higher.

(Twelfth Embodiment)

FIGS. 27A through 27F illustrate a duplexer in accordance with a twelfth embodiment of the present invention. In these figures, the same components as those of the foregoing embodiments are denoted by the same reference numerals as those of the foregoing embodiments. One of the features of this embodiment is that the phase matching line pattern is connected to the wire bonding pads on the package through vias, and the resistance in the vias is reduced so as to reduce the insertion loss. As shown in FIG. 27B, two vias $86_{10}$ and $86_{11}$ are formed in the pad $80_1$ on the wire bonding pad layer 62A, and two vias $86_{12}$ and $86_{13}$ are formed in the pad $80_2$ on the wire bonding pad layer 62A. The vias $86_{10}$, $86_{11}$, $86_{12}$, and $86_{13}$, are also formed in a die-attach layer 63B and a phase matching line pattern layer 64A. The vias $86_{10}$ and $86_{11}$ are connected to the inlet part of a phase matching line pattern 72A. The vias $86_{12}$ and $86_{13}$ are connected to the outlet part of the phase matching line pattern 72A. Since the vias $86_{10}$, $86_{11}$, $86_{12}$, and $86_{13}$, are formed in three layers, each of the vias has such a high resistance value as to affect the insertion loss of the reception filter. These vias are provided at either end of the phase matching line pattern 72A, so that the resistance value of each via can be reduced.

FIG. 28 shows the insertion loss of each reception filter (a DMS filter) of the fifth embodiment and the twelfth embodiment. In the fifth embodiment, the via $86_1$ is provided at one end of the phase matching line pattern 72, and the via $86_2$ is provided at the other end. In the twelfth embodiment, on the other hand, two vias are provided at each end of the phase matching line pattern 72A. As shown in FIG. 28, the insertion loss of the twelfth embodiment is smaller than that of the fifth embodiment (a difference by approximately 0.4 dB).

Figure 29:
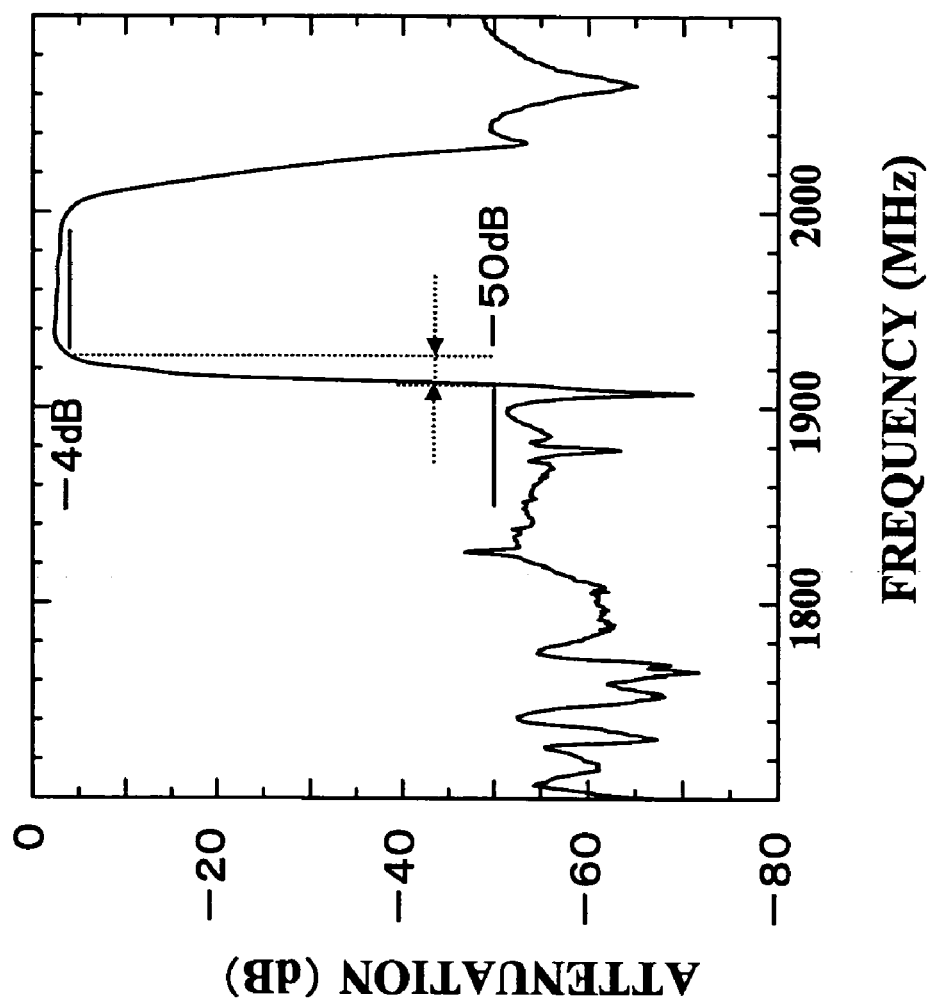
FIG. 29 illustrates a transition region.

Providing two or more vias to each end of the phase matching line pattern 72A can also improve the transition region. FIG. 29 illustrates transition regions. In a case where the filter characteristics include an insertion loss of −4 dB and a stop-band suppression of −50 dB, the transition region represents in which range (MHz) these two attenuation values transit. In other words, the frequency range of the attenuation values is the transition region. As the value of the transition region is smaller, the filter exhibits a preferably angular and steeper profile. Particularly, a filter for a 1900 MHz band has the transmission band and the reception band close to each other, and therefore, should preferably have a small transmission region and steep filter characteristics. If the transition region is small, the allowable range of frequency shifts can be made wider in the production process, and the production yield can be dramatically increased.

Figure 30:
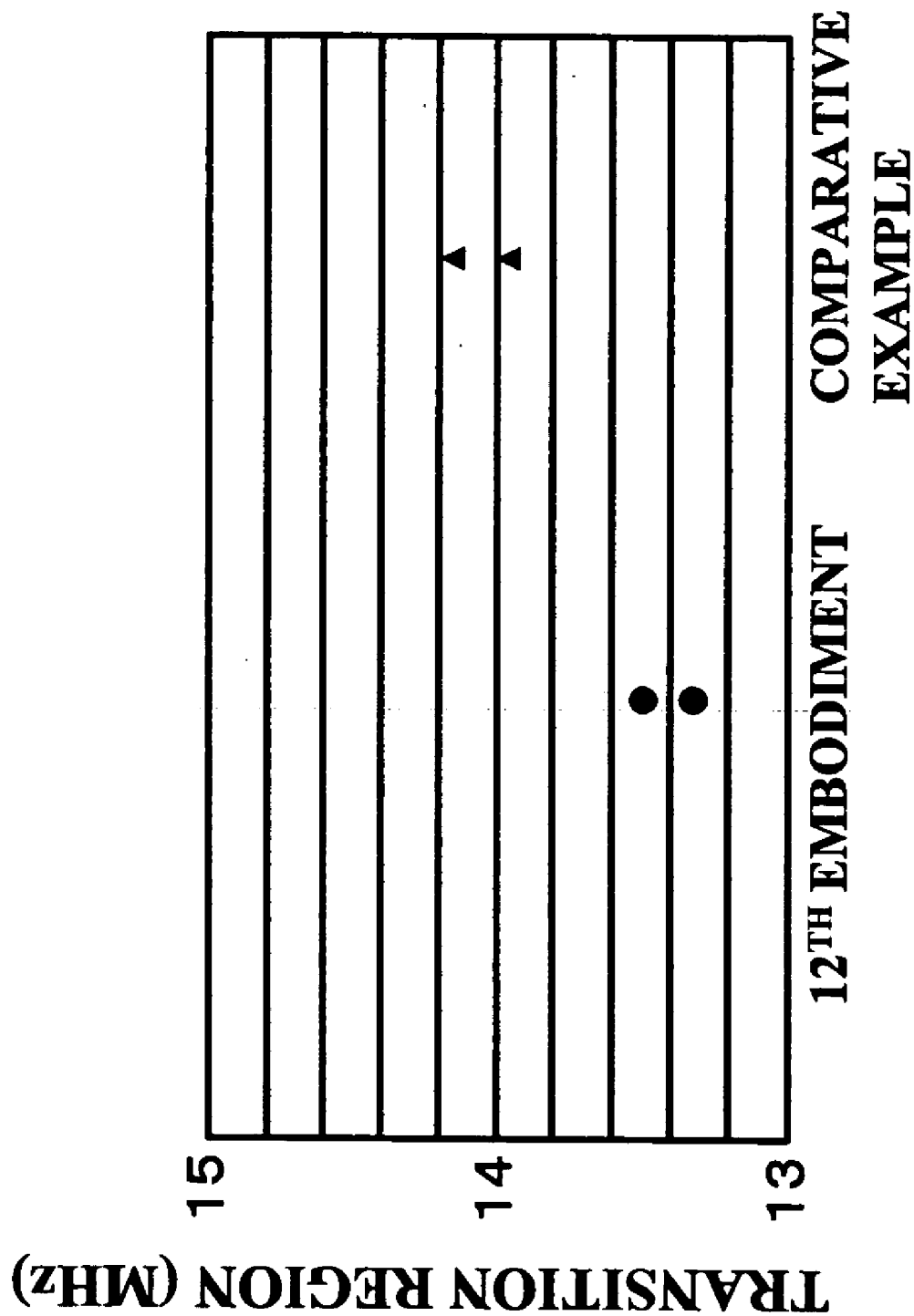
FIG. 30 shows the transition regions (MHz) of the fifth embodiment and the twelfth embodiment.

In the twelfth embodiment, the insertion loss is very small, and accordingly, the transmission region is also small. FIG. 30 shows the transition regions (MHz) of the fifth embodiment and the twelfth embodiment. Two samples were measured for each of the fifth and twelfth embodiments. The average value of the transition regions of the twelfth embodiment was smaller by approximately 0.65 MHz. Accordingly, it was found that the twelfth embodiment can greatly increase the production yield.

(Thirteenth Embodiment)

Figure 31:
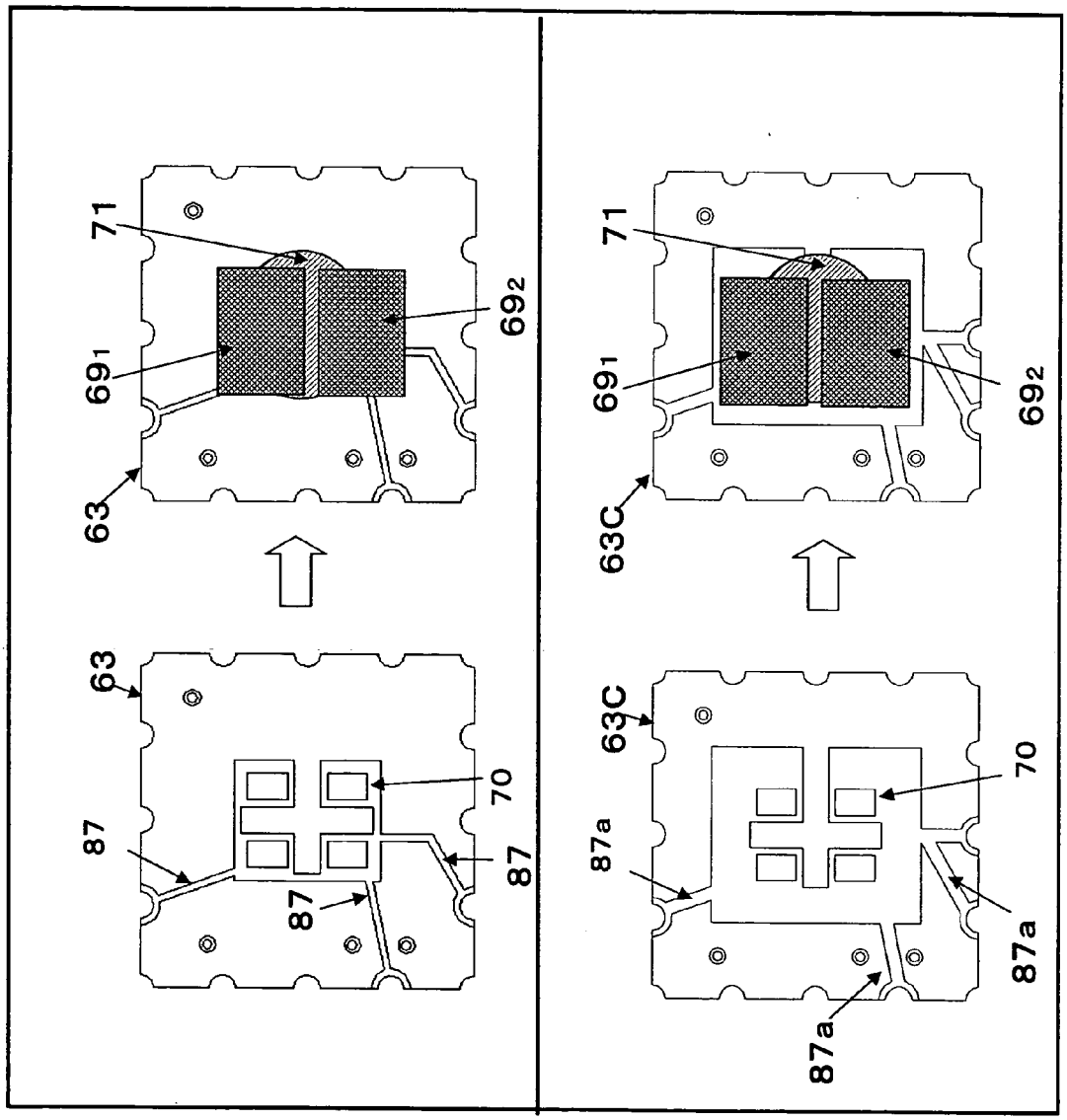
FIG. 31 illustrates the die-attach layer of a duplexer in accordance with a thirteenth embodiment of the present invention, as well as the die-attach layer of the fifth embodiment as a comparative example.

FIG. 31 illustrates the die-attach layer 63C of a duplexer in accordance with a thirteenth embodiment of the present invention, and the die-attach layer 63 of the fifth embodiment as a comparative example. Each of the duplexers employs two chips $69_1$ and $69_2$. The chip $69_1$ forms the ladder type surface acoustic wave filter 32, while the chip $69_2$ forms the DMS filter 50. In the fifth embodiment, the conductive adhesive 71 is applied onto the die-attach unit 70, and the lower surfaces of the chips $69_1$ and $69_2$ are bonded onto the die-attach unit 70. As the conductive adhesive 71 is also applied to the cross-like part on which the die-attach unit 70 is not formed, the grounds of the lower surfaces of the chips $69_1$ and $69_2$ are reinforced. The die-attach layer 63C of the thirteenth embodiment, on the other hand, has a ground that is further reinforced. A ground pattern 105 on the die-attach layer 63C has a larger area than that of the die-attach unit 50. This area of the ground pattern 105 is also larger than the combined area of the bottom faces of the two chips $69_1$ and $69_2$. In this aspect, the ground pattern 105 is the same as the ground pattern 101 shown in FIG. 22C. The chips $69_1$ and $69_2$ are bonded onto the ground pattern 105 with the conductive adhesive 71. Even if the chips $69_1$ and $69_2$ are placed in positions that shift from predetermined positions, the lower surfaces of the chips $69_1$ and $69_2$ do not stick out from the ground pattern 105, since the ground pattern 105 has a large area. As the conductive adhesive 71 is also applied to the cross-like part on which the ground pattern 105 is not formed, the grounds of the lower surfaces of the chips $69_1$ and $69_2$ are reinforced. As a result, even if the chips $69_1$ and $69_2$ are shifted from the predetermined positions, a ground surface can be surely formed on the entire surface. To further reinforce the grounds, leading patterns 87a of the thirteenth embodiment are made wider than the leading patterns 87 of the fifth embodiment. More preferably, each of the leading patterns 87a should have a width of 200 µm or greater.

Figure 32:
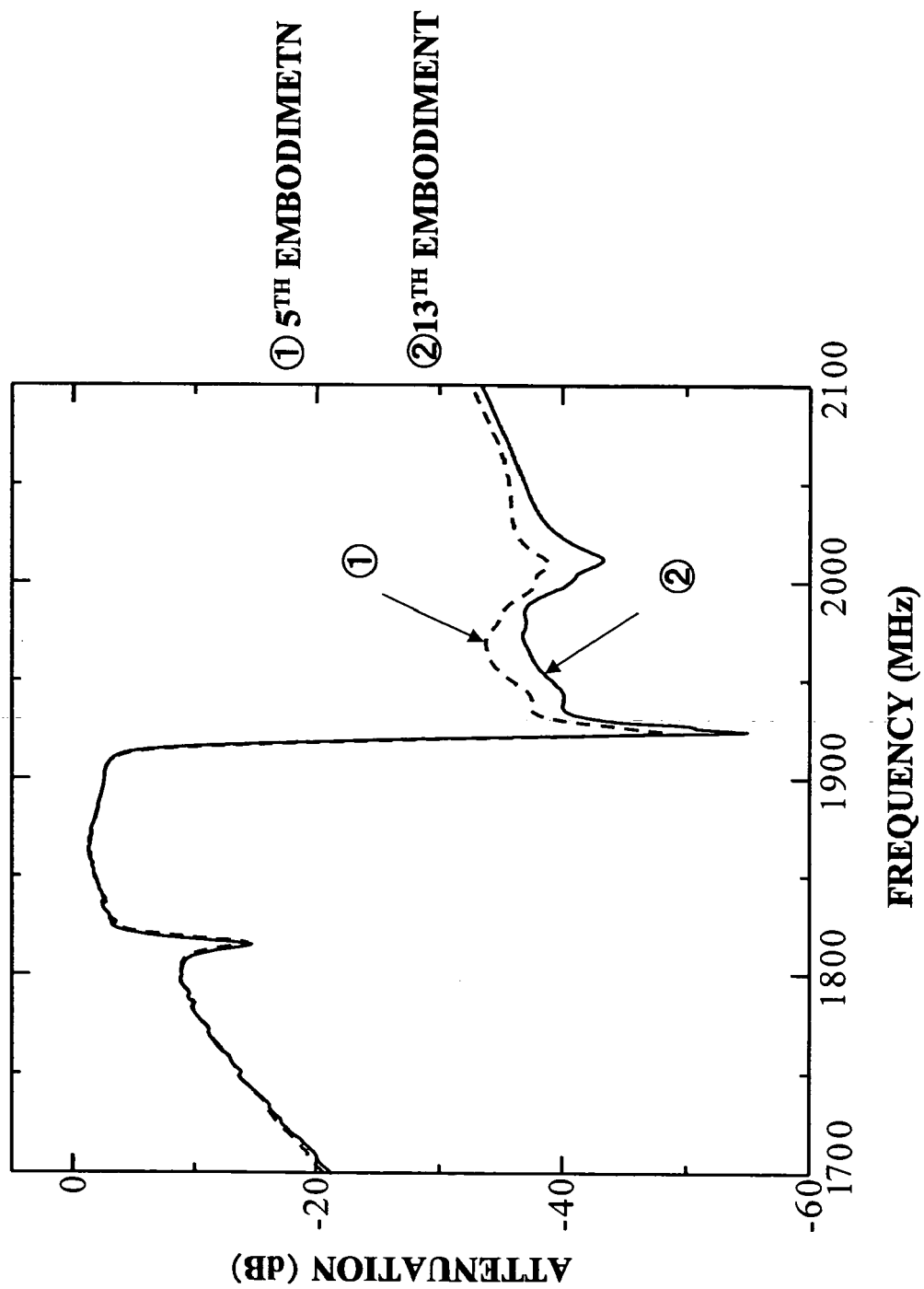
FIG. 32 shows the band rejection suppression on the high-frequency side of each of the duplexers in accordance with the fifth and thirteenth embodiments.

FIG. 32 shows the stop-band suppression on the high frequency side of each of the duplexers of the fifth embodiment and the thirteenth embodiment. As the grounds are further reinforced in the thirteenth embodiment, the stop-band suppression is also further increased.

(Fourteenth Embodiment)

Figure 33:
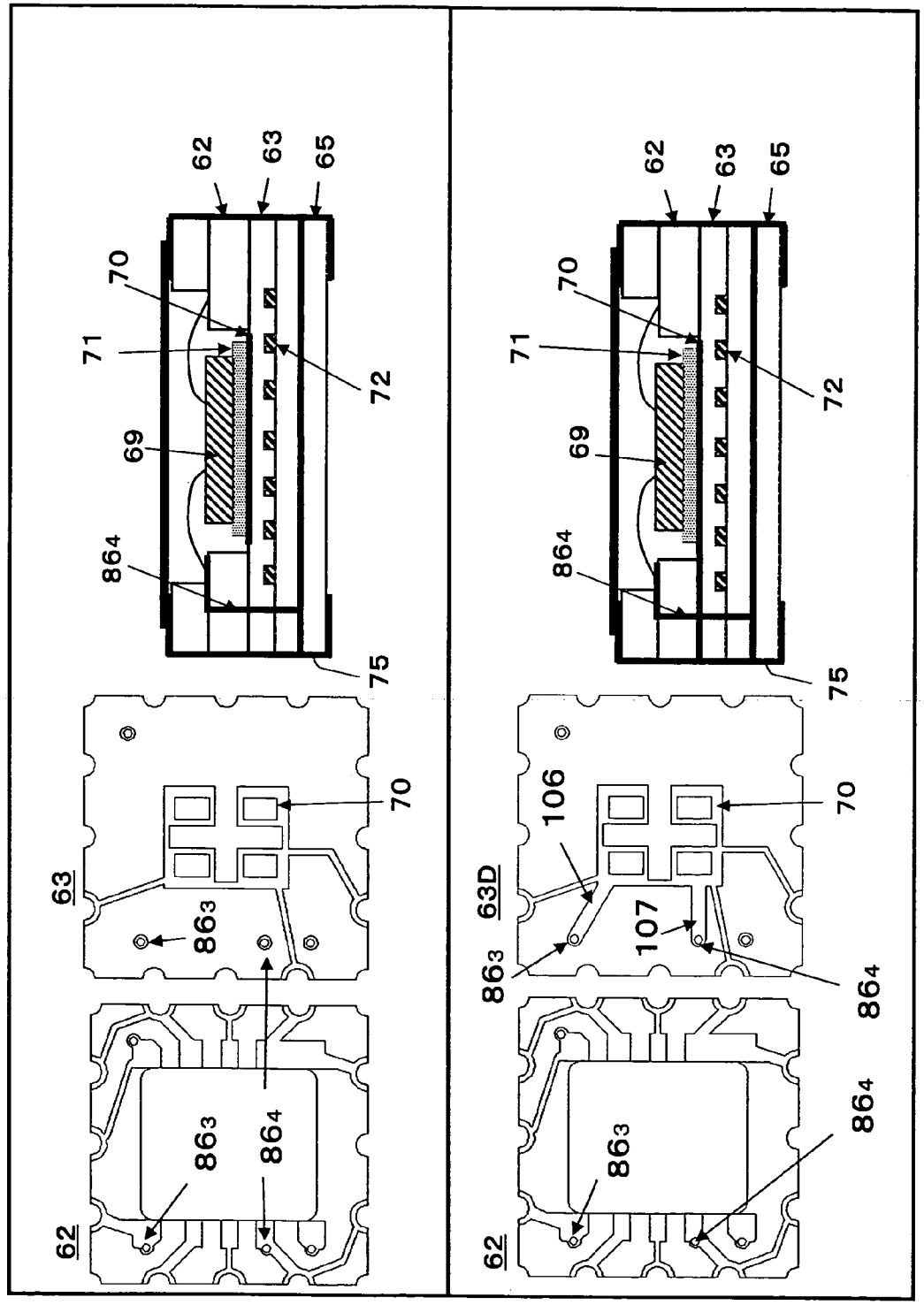
FIG. 33 shows the wire bonding layer, the die-attach layer, and a section of a duplexer in accordance with a fourteenth embodiment of the present invention, as well as the wire bonding layer, the die-attach layer, and a section of the duplexer of the fifth embodiment as a comparative example.

FIG. 33 shows the wire bonding layer 62, a die-attach layer 63D, and a section of a duplexer in accordance with a fourteenth embodiment, as well as the wire bonding layer 62, the die-attach layer 63, and a section of the duplexer of the fifth embodiment as a comparative example. The fourteenth embodiment is the same as the fifth embodiment, except that the die-attach layer 63 is replaced with the die-attach layer 63D. A ground pattern 108 formed on the die-attach layer 63D has leading patterns 106 and 107 extending from the die-attach unit 70 that is the same as that of the fifth embodiment. The leading patterns 106 and 107 are connected to the vias $86_3$ and $86_4$, respectively, which are connected to the corresponding wire bonding pads. In this structure, the ground pattern 108 is connected not only to connection paths but also to the external connection terminals (side castellation) of grounds through the vias. Accordingly, the grounds of the lower face of the chip 69 can be further reinforced. In this manner, a larger number of connection paths to the external connection terminals and the ground patterns reinforce the grounds of the lower face of the chip 69.

Figure 34:
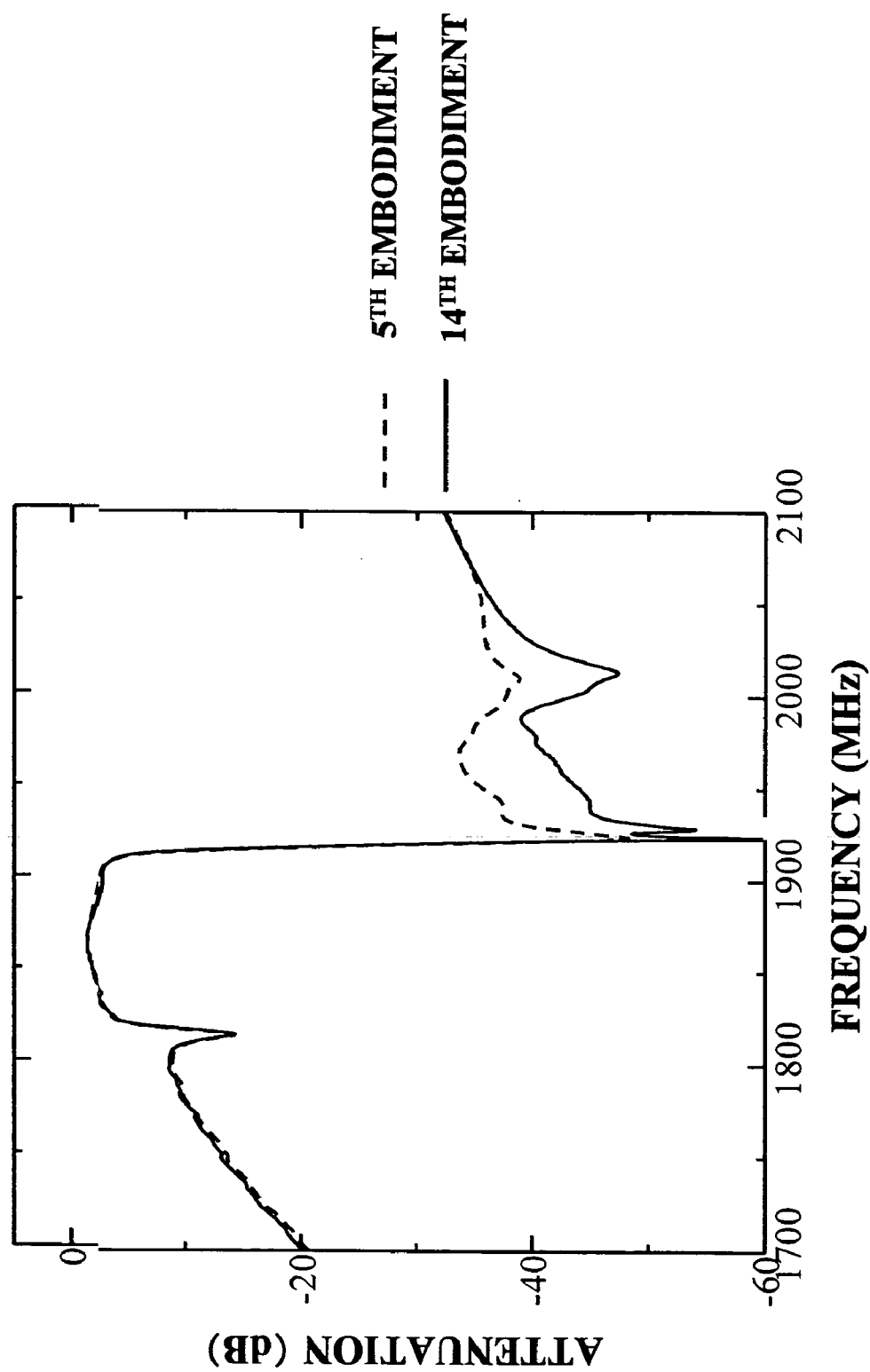
FIG. 34 shows the stop-band suppression on the high-frequency side of each of the duplexers in accordance with the fifth and fourteenth embodiments.

FIG. 34 shows the stop-band suppression on the high frequency side of each of the duplexers of the fifth embodiment and the fourteenth embodiment. As the grounds are further reinforced in the fourteenth embodiment, the stop-band suppression is also further increased.

(Fifteenth Embodiment)

Figure 35:
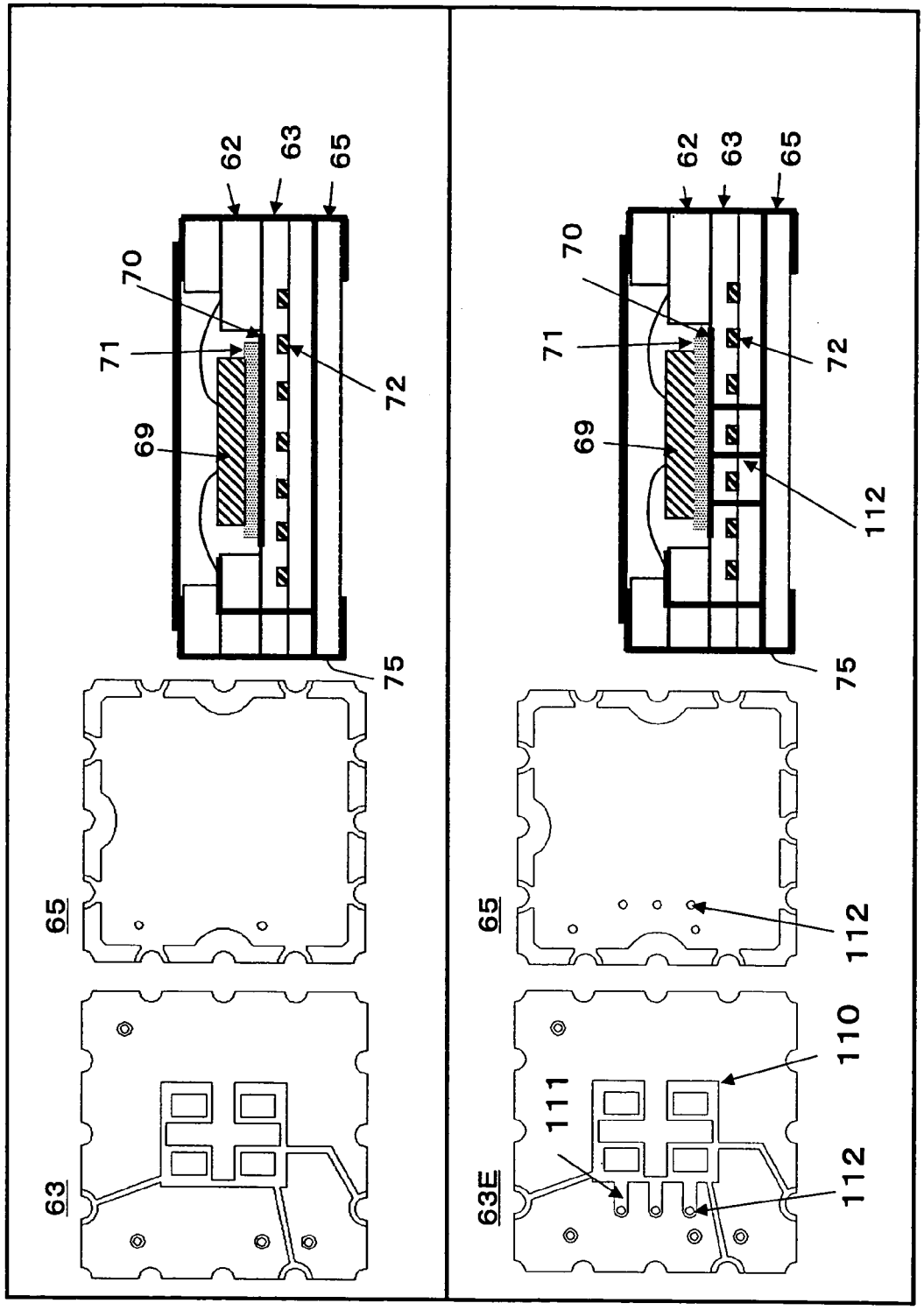
FIG. 35 shows a top view of the die-attach layer, a top view of the common ground/foot pad layer, and a section of a duplexer in accordance with a fifteenth embodiment of the present invention, as well as a top view of the die-attach layer, a top view of the common ground/foot pad layer, and a section of the duplexer of the fifth embodiment as a comparative example.

FIG. 35 shows a top view of a die-attach layer 63E, a top view of the common ground/foot pad layer 65, and a section of a duplexer in accordance with a fifteenth embodiment, as well as a top view of the die-attach layer 63, a top view of the common ground/foot pad layer 65, and a section of the duplexer of the fifth embodiment as a comparative example. The fifteenth embodiment is the same as the fifth embodiment, except that the die-attach layer 63 is replaced with the die-attach layer 63E. A ground pattern 110 formed on the die-attach layer 63E has leading patterns 111 extending from the die-attach unit 70 that is the same as that of the fifth embodiment. Each of the leading patterns 111 is connected to each corresponding via 112. The vias 112 are also formed in the phase matching line pattern layer 64, and one end of each of the vias 112 is connected to the common ground pattern 76. In this structure, the ground pattern 110 is connected to the common ground pattern 76 through vias 112, so that the grounds of the lower face of the chip 69 can be further reinforced. The common ground pattern 76, which is a solid ground surface is connected to external connection terminals via the connection path $75_1$ or the likes. Thus, the grounds of the lower face of the chip 69 can be reinforced.

Figure 36:
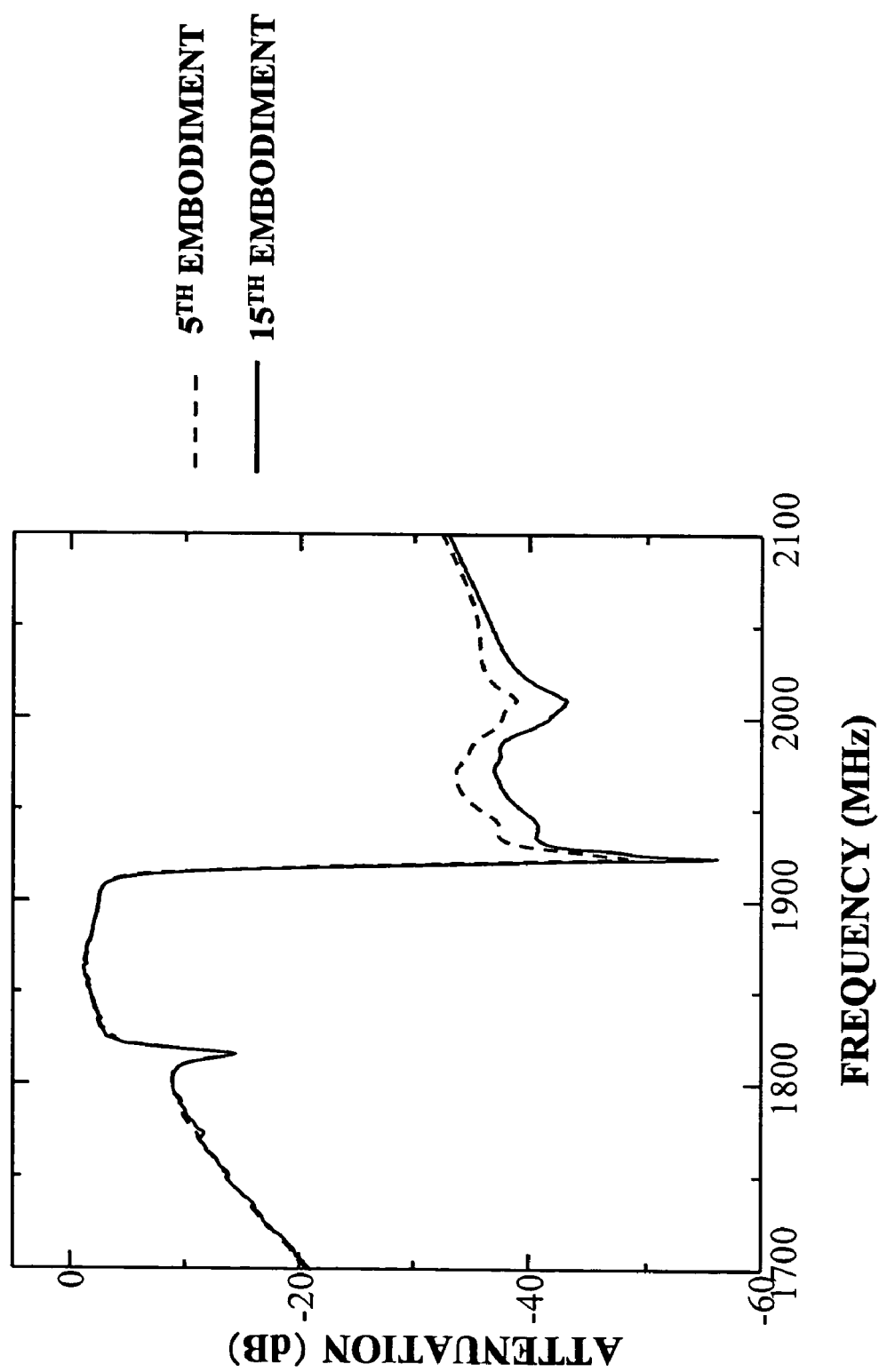
FIG. 36 shows the stop-band suppression on the high-frequency side of each of the duplexers in accordance with the fifth and fifteenth embodiments.

FIG. 36 shows the stop-band suppression on the high frequency side of each of the duplexers of the fifth embodiment and the fifteenth embodiment. As the grounds are further reinforced in the fifteenth embodiment, the stop-band suppression is further increased.

(Sixteenth Embodiment)

Figure 37:
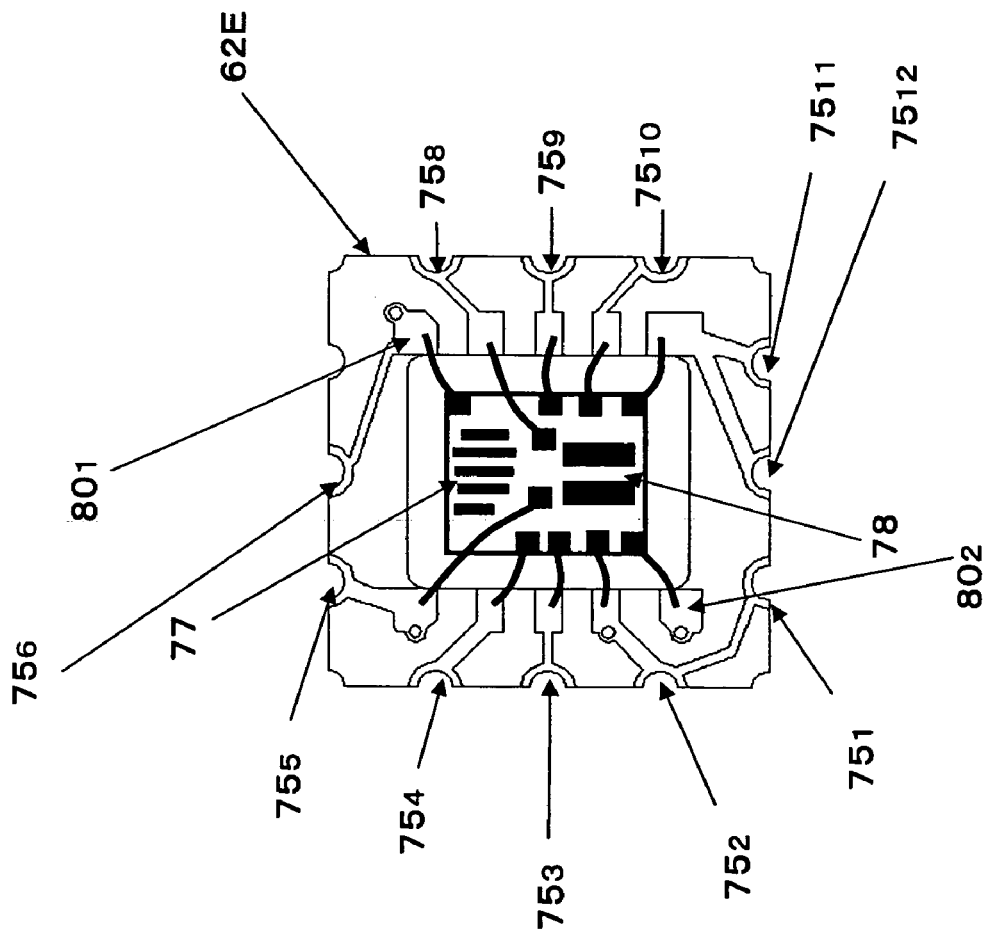
FIG. 37 is a plan view illustrating the connections between the chip and the wire bonding pad layer of a duplexer in accordance with a sixteenth embodiment of the present invention.

FIG. 37 is a plan view showing the connections between the chip 69 and the wire bonding pad layer 62E of a duplexer in accordance with a sixteenth embodiment of the present invention. In this figure, the same components as those of the foregoing embodiments are denoted by the same reference numerals as those of the foregoing embodiments. Each of the duplexers in accordance with the fifth through fifteenth embodiments includes the DMS filter 80 of the single-output structure shown in FIG. 8. The duplexer in accordance with the sixteenth embodiment, on the other hand, has the same structure as the structure shown in FIG. 11. More specifically, the duplexer of this embodiment includes the DMS filter 55 of the balanced output structure. To achieve a balanced output, the connections shown in FIG. 14 are changed to the connections shown in FIG. 37. The wire bonding pad on the chip side, which is connected to the connection paths $75_{10}$ and $75_{11}$ in FIG. 14, is divided into two pads in this example. The connection paths $75_8$, $75_9$, and $75_{10}$ establish the connections with the reception terminal 16 shown in FIG. 11, the grounds of the second stage (the stage formed by the DMS filters 51 and 52) of the DMS filter 55, and the reception terminal 46. The wire bonding pad on the chip side, which is connected to the connection paths $75_{10}$ and $75_{11}$ in FIG. 14, is divided into two pads in this example. In this structure, the foot pad $66_8$ shown in FIG. 13F serves as the reception terminal 16, the foot pad $66_9$ serves as a ground terminal, and the foot pad $66_{10}$ serves as the reception terminal 46.

Figure 38:
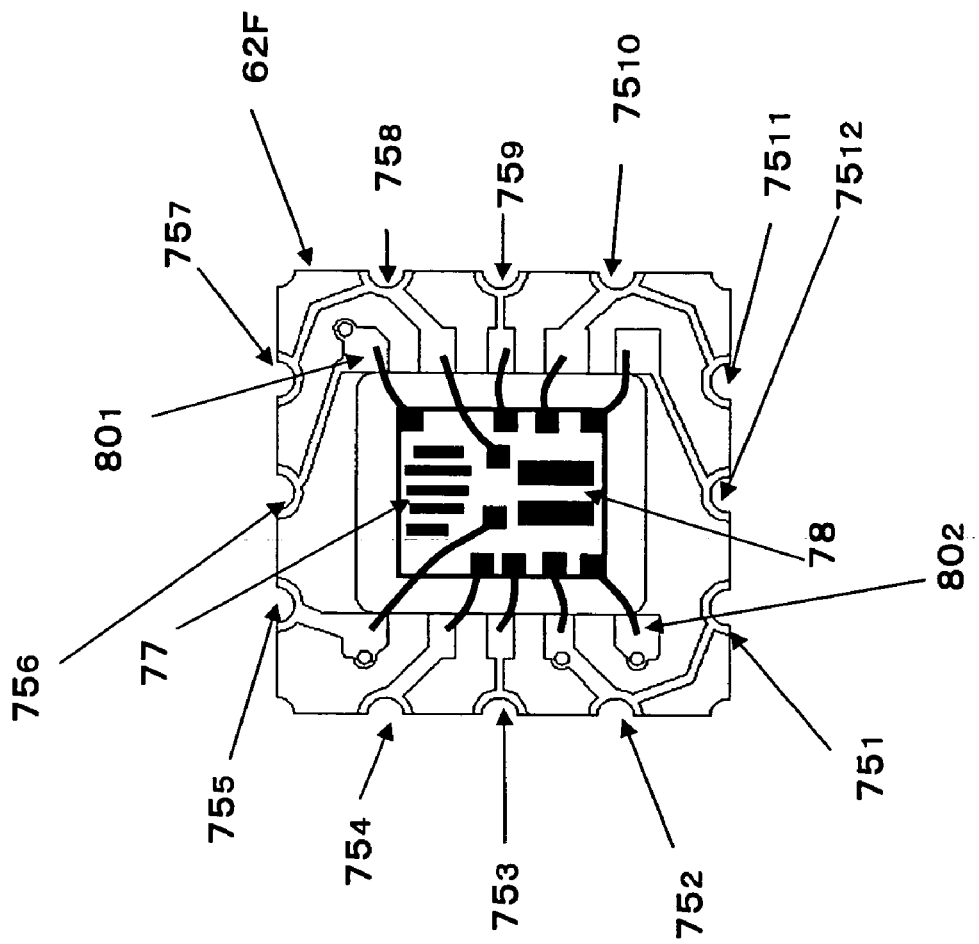
FIG. 38 is a plan view illustrating the connections between the chip and the wire bonding pad layer of another example of the duplexer in accordance with the sixteenth embodiment of the present invention.

FIG. 38 illustrates another example of a duplexer having a balanced-output structure. This duplexer includes a wire bonding pad layer 62F. The connections in this duplexer are formed by modifying the connections shown in FIG. 14 as follows. The wire bonding pad on the chip side, which is connected to the connection paths $75_{10}$ and $75_{11}$ in FIG. 14, is divided into two pads in this example. Also, the connection path $75_{12}$ establishes the connection with the reception terminal 46 shown in FIG. 11.

Figure 39:
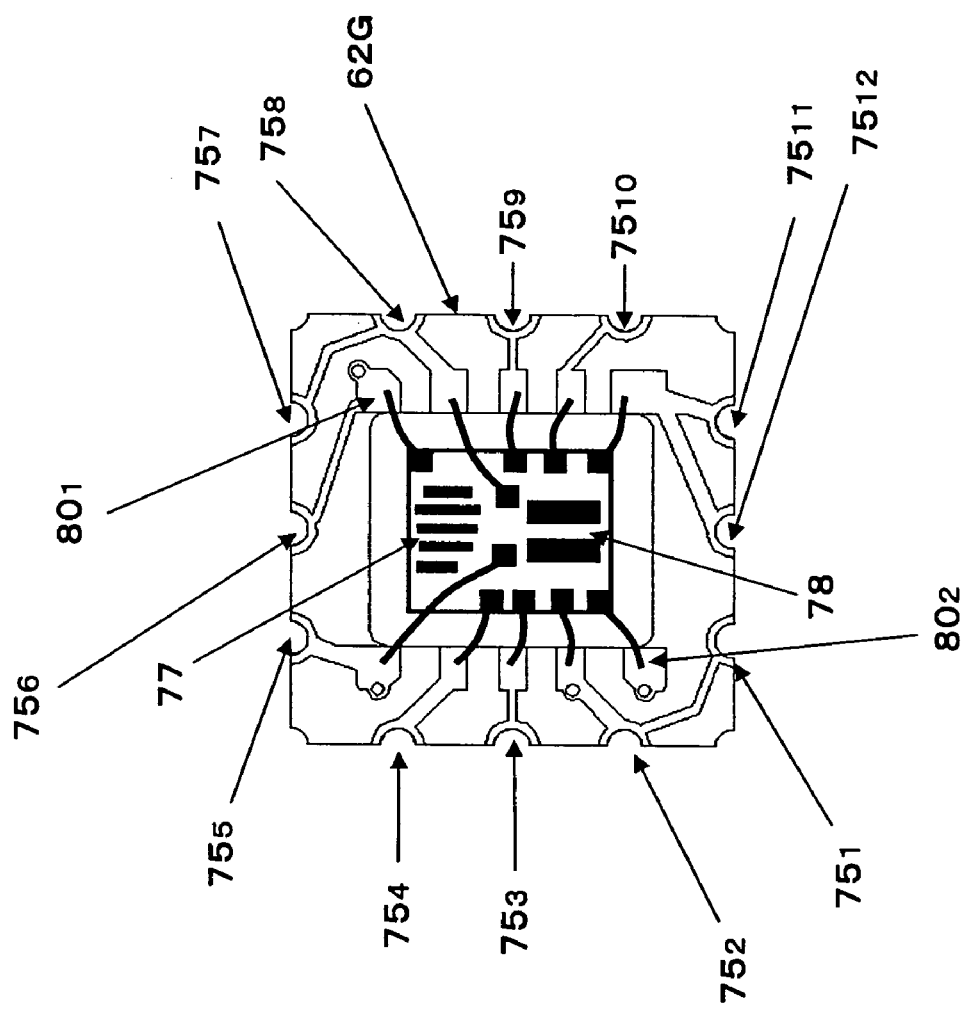
FIG. 39 is a plan view illustrating the connections between the chip and the wire bonding pad layer of yet another example of the duplexer in accordance with the sixteenth embodiment of the present invention.

FIG. 39 illustrates another example of a duplexer having a balanced-output structure. This duplexer includes a wire bonding-pad layer 62G. The connections in this duplexer are formed by modifying the connections shown in FIG. 14 as follows. The wire bonding pad on the chip side, which is connected to the connection paths $75_{10}$ and $75_{11}$ in FIG. 14, is divided into two pads in this example. Also, the connection paths $75_9$ and $75_{10}$ establish the connections with the reception terminals 16 and 46, respectively, shown in FIG. 11. Further, the connection paths $75_{11}$ and $75_{12}$ form the grounds of the second stage of the DMS filter 55.

It is of course possible to modify any of the duplexers shown in FIG. 37 through 39 so as to achieve any of the features of the sixth to fifteenth embodiments.

(Seventeenth Embodiment)

FIG. 40 is a block diagram illustrating an electronic device in accordance with a seventeenth embodiment of the present invention. This electronic device is a portable telephone, and the transmission/reception system of the portable telephone is shown in FIG. 40. The other structures such as an audio processing system are not shown, for simplification of the drawing. One of the duplexers of the foregoing embodiments is employed in the portable telephone shown in FIG. 40.

The portable telephone includes a RF (radiofrequency) unit 170, a modulator 171, and an IF (intermediate frequency) unit 172. The RF unit 170 includes an antenna 173, a duplexer 174, a low-noise amplifier 183, an interstage filter 184, a mixer (a multiplier) 175, a local oscillator 176, an interstage filter 177, a mixer (a multiplier) 178, an interstage filter 179, and a power amplifier 180. An audio signal from the audio processing system is modulated by the modulator 171, and the mixer 178 of the RF unit 170 performs frequency conversion (mixing) on the modulated audio signal with an oscillation signal of the local oscillator 176. The output of the mixer 178 is then sent to the duplexer 174 through the interstage filter 179 and the power amplifier 180. The duplexer 174, which is a duplexer in accordance with the present invention, includes a transmission filter $174_1$, a reception filter $174_2$, and a matching circuit (not shown). A transmission signal from the power amplifier 180 is sent to the antenna 173 through the duplexer 174.

A reception signal received at the antenna 173 is sent to the mixer 175 through the reception filter $174_2$ of the duplexer 174, the low-noise amplifier 183, and the interstage filter 184. The mixer 175 receives an oscillation frequency from the local oscillator 176 through the interstage filter 177, and then converts the frequency of the reception signal, to output the converted frequency to the IF unit 172. The IF unit 172 receives the signal via an IF filter 181. A demodulator 182 demodulates the signal to output a demodulated audio signal to the audio processing system (not shown).

As the communication device shown in FIG. 40 includes a duplexer of the present invention, excellent filter characteristics with high power durability can be achieved.

The first through seventeenth embodiments of the present invention have been described so far. However, the present invention is not limited to the above embodiments, but may have other various embodiments.

As described so far, a duplexer with improved power durability and filter characteristics, and an electronic device that employs such a duplexer, can be realized in accordance with the present invention.

Finally, the structures, functions, and effects of the present invention will be summed up in the following.

1) The present invention provides a duplexer that includes: two surface acoustic wave filters that have different band center frequencies; and a phase matching circuit that matches the phases of the two surface acoustic wave filters to each other. In this duplexer, one of the two surface acoustic wave filters is a ladder type surface acoustic wave filter (denoted by reference numeral 32 in FIG. 4, for instance), while the other one of the two surface acoustic wave filters includes two or more dual-mode type surface acoustic wave filters connected in parallel (denoted by reference numeral 33 in FIG. 4, for instance). The ladder type surface acoustic wave filter excels in power durability and exhibits steep falls. The other surface acoustic wave filter, which is a coupled dual-mode type surface acoustic wave filter, not only exhibits steep rises, but also achieves excellent filter characteristics with reduced insertion loss and greatly improved power durability, by virtue of the two or more dual-mode type surface acoustic wave filters connected in parallel. Furthermore, with the improved power durability, the dual-mode type surface acoustic wave filters can be located at the front end (the first-stage filter to be connected to the common terminal) of the duplexer.

2) The two or more dual-mode type surface acoustic wave filters described in 1) may have a single-ended output, as shown in FIG. 4, for instance.

3) The two or more dual-mode type surface acoustic wave filters may have a balanced output, as shown in FIG. 6, for instance. With the balanced output, an electronic device in which the duplexer is employed, as well as the electronic circuit in a stage after the duplexer, can be easily designed.

4) In any of the duplexers described in 1) through 3), the ladder type surface acoustic wave filter may be provided for transmission, while the two or more dual-mode type surface acoustic wave filters may be provided for reception. With this structure, it is possible to realize a duplexer having such filter characteristics that the falls of the pass band of the transmission filter are steep, the rises of the pass band of the reception filter are also steep, the insertion loss is greatly reduced, and the power durability is greatly improved.

5) The present invention also provides another duplexer that includes: two surface acoustic wave filters that have different band center frequencies; and a phase matching circuit that matches the phases of the two surface acoustic wave filters to each other. In this duplexer, one of the two surface acoustic wave filters is a ladder type surface acoustic wave filter (denoted by reference numeral 32 in FIG. 8, for instance), while the other one of the two surface acoustic wave filters includes two or more dual-mode type surface acoustic wave filters (denoted by reference numeral 34, 35, 51, and 52 in FIG. 8, for instance) connected in parallel, the two or more dual-mode type surface acoustic wave filters being cascaded. With the cascade connection, the suppression of the low frequency bands by the reception filter and the power durability of the reception filter can be further improved.

6) In the duplexer described in 5), the other one of the two surface acoustic wave filters may be formed by cascading two dual-mode type surface acoustic wave filters connected in parallel, as shown in FIG. 8.

7) In the duplexer described in 5) or 6), the last one of the dual-mode type surface acoustic wave filters connected in parallel may have a single-ended output, as shown in FIG. 8.

8) In the duplexer described in 5), the last one of the dual-mode type surface acoustic wave filters connected in parallel may have a balanced output, as shown in FIG. 11.

9) In any of the duplexers described in 5) through 8), the ladder type surface acoustic wave filter may be provided for transmission, while the longitudinally-coupled dual-mode type surface acoustic wave filters may be provided for reception, as shown in FIGS. 8 and 11.

10) In any of the duplexers described in 1) through 9), the resonators of the ladder type surface acoustic wave filter connected to a common terminal of the duplexer may be series-arm resonators, as shown in FIGS. 4 and 8. With this structure, the impedance in the reception band of the transmission filter is increased, and the insertion loss of the reception filter is reduced.

11) In any of the duplexers described in 1) through 10), a rise of the pass band one of the two surface acoustic wave filters may at least partially overlap a fall of the pass band of the other one of the two surface acoustic wave filters, as shown in FIGS. 10A and 10B. This is an example of the relationship between the pass bands of the two surface acoustic wave filters.

12) The present invention also provides yet another duplexer that includes: two surface acoustic wave filters that have different band center frequencies; and a phase matching circuit that matches the phases of the two surface acoustic wave filters to each other. In this duplexer, the two surface acoustic wave filters and the phase matching circuit are housed in a laminated package (denoted by reference numeral 60 in FIG. 12, for instance). One of the two surface acoustic wave filters is a ladder type surface acoustic wave filter (denoted by reference numeral 32 in FIG. 11, for instance), while the other one of the two surface acoustic wave filters includes at least one set of dual-mode type surface acoustic wave filters (denoted by reference numerals 34 and 35 or reference numerals 51 and 52 in FIG. 11, for instance) connected in parallel.

13) In the duplexer described in 12), the phase matching circuit may be formed by a line pattern, as shown in FIG. 13D, for instance. As a line pattern hardly causes a variation in product quality, stable filter characteristics can be obtained.

14) In the duplexer described in 12), the phase matching circuit for the other one of the two surface acoustic wave filters may be formed by a line pattern that has a length of 0.25 λ to 0.34 λ, with λ representing the wavelength of the surface acoustic wave to be transmitted through the dual-mode type surface acoustic wave filters.

15) In the duplexer described in 12), the other one of the two surface acoustic wave filters may have a structure in which two dual-mode type surface acoustic wave filters connected in parallel are cascaded, and the grounds of the dual-mode type surface acoustic wave filters are made common by a layer other than intermediate layers in the laminated package. With this structure, the stop-band suppression can be increased. This structure is embodied by the fifth embodiment, for instance.

16) In the duplexer described in 12), the other one of the two surface acoustic wave filters may have a structure in which two dual-mode type surface acoustic wave filters connected in parallel are cascaded, and the laminated package may contain a wire bonding pad layer that has a first pad and a second pad formed thereon. The first pad is connected to the ground of the first set of dual-mode type surface acoustic wave filters by wire bonding, and the second pad is connected to the ground of the second set of dual-mode type surface acoustic wave filters by wire bonding. Also, the first and second pads function as independent grounds on the wire bonding pad layer. With this structure, the stop-band suppression can be increased. This structure is embodied by the wire bonding pad layer 62 shown in FIG. 13B, for instance.

17) In the duplexer described in 12), the other one of the two surface acoustic wave filters may have a structure in which two dual-mode type surface acoustic wave filters connected in parallel are cascaded, and the grounds of the first and second dual-mode type surface acoustic wave filters may be made common by a first layer (denoted by reference numeral 67 in FIG. 13A, for instance) that forms the upper surface of the laminated package and a second layer (denoted by reference numeral 76 in FIG. 13E, for instance) that forms a common ground. With this structure, the stop-band suppression can be increased, and adverse influence of external noise can be readily avoided.

18) In the duplexer described in 12), the other one of the two surface acoustic wave filters may have a structure in which two dual-mode type surface acoustic wave filters connected in parallel are cascaded, and a first pad (denoted by reference numeral 80 in FIG. 13B, for instance) and a second pad (the pad connected to the connection paths $75_{10}$ and $75_{11}$) may be both connected to external connection terminals formed on outer surfaces of the laminated package. In this structure, the first pad is connected to the ground of the first set of dual-mode type surface acoustic wave filters by wire bonding, and the second pad is connected to the ground of the second set of dual-mode type surface acoustic wave filters. With this structure, the grounds of the duplexer can be reinforced, and the inductance components can be reduced. Thus, the stop-band suppression can be increased.

19) In the duplexer described in 12), each layer contained in the laminated package may have a ground pattern (denoted by reference numeral 70 in FIG. 13C or reference numeral 89 in FIG. 13D, for instance) that is connected to a ground terminal formed on an outer surface of the laminated package. With this structure, the grounds of the duplexer can be reinforced, and the inductance components can be reduced. Thus, the stop-band suppression can be increased.

20) In the duplexer described in 12), each intermediate layer contained in the laminated package may have a ground pattern that is connected to a ground terminal formed on an outer surface of the laminated package, and each ground pattern may be located in such a position as to avoid overlapping a signal line pattern formed on the laminated package and bonding pads connected to the signal line pattern. With this structure, the capacitance components can be reduced, and improved impedance matching can be achieved. This structure is embodied by the fifth embodiment, for instance.

21) In the duplexer described in 12), the two surface acoustic wave filters having different band center frequencies may be formed in a chip. Also, the other one of the two surface acoustic wave filters may have a structure in which two dual-mode type surface acoustic wave filters connected in parallel are cascaded, and the ground of each of the filters may be made common in the laminated package except the chip. With this structure, the stop-band suppression can be increased. This structure is embodied by the fifth embodiment, for instance.

22) The duplexer described in 12) further includes: a first chip that forms the one of the two surface acoustic wave filters; and a second chip that form the other one of the two surface acoustic wave filters. In this duplexer, the other one of the two surface acoustic wave filters has a structure in which two dual-mode type surface acoustic wave filters connected in parallel are cascaded, and the ground of each of the filters is made common in the laminated package except the chips. With this structure, the stop-band suppression can be improved. This structure is embodied by the fifth embodiment, for instance.

23) In the duplexer described in 12), the laminated package may contain a layer that forms a common ground, and the common ground is connected to external connection terminals formed on outer surfaces of the laminated package through connection paths formed on side surfaces of the laminated package and vias formed in the laminated package. With this structure, the grounds of the duplexer can be reinforced, and the inductance components can be reduced. Thus, the stop-band suppression can be improved. This structure is embodied by the sixth embodiment, for instance.

24) In the duplexer described in 12), the other one of the two surface acoustic wave filters may have a structure in which first and second dual-mode type surface acoustic wave filters connected in parallel are cascaded, and the laminated package may contain a common ground layer. In this structure, the common ground layer has a first common ground pattern that forms a ground surface for the first set of dual-mode type surface acoustic wave filters, and a second common ground pattern that forms a ground surface for the second set of dual-mode type surface acoustic wave filters. With this structure, the stop-band suppression can be improved, and adverse influence of external noise can be readily avoided. This structure is embodied by the seventh embodiment, for instance.

25) In the duplexer described in 12), the laminated package may contain a first layer that has wire bonding pads formed thereon, and a second layer that is formed over the first layer and has a ring-like ground pattern. Also, pads to serve as grounds among the wire bonding pads and the ring-like ground pattern are connected through vias formed in the laminated package. With this structure, the grounds of the duplexer can be further reinforced, and the inductance components can be reduced. Thus, the stop-band suppression can be further increased. This structure is embodied by the eighth embodiment, for instance.

26) In the duplexer described in 12), the laminated package may contain a first layer that has wire bonding pads, and a second layer on which the phase matching circuit is formed. In this structure, the first layer also has a phase matching circuit formed thereon, and the phase matching circuit formed on the first layer is connected to the phase matching circuit formed on the second layer through a via formed in the laminated package. With this structure, the impedance of the duplexer can be adjusted at several points, and accordingly, improved impedance matching can be achieved. Thus, the insertion loss of the duplexer can be reduced. This embodiment is embodied by the ninth embodiment, for instance.

27) In the duplexer described in 26), the phase matching circuit formed on the first layer may be connected to and interposed between the common terminal of the duplexer and the two surface acoustic wave filters.

28) In the duplexer described in 26), the phase matching circuit formed on the first layer may have a line pattern, and the via is formed in the line pattern. With this structure, the impedance of the duplexer can be adjusted at several points, and accordingly, improved impedance matching can be achieved. As a result, the insertion loss of the duplexer can be reduced. This structure is embodied by the tenth embodiment, for instance.

29) In the duplexer described in 12), the laminated package may contain a first layer on which the phase matching circuit is formed, and a second layer on which a common ground is formed. In this structure, the common ground is arranged in such a position to cover the entire surface of the phase matching circuit. With this structure, the characteristic impedance of the duplexer can be readily set at a desired value. This structure is embodied by the eleventh embodiment, for instance.

30) In the duplexer described in 12), the laminated package may contain a first layer that has wire bonding pads formed thereon, and a second layer on which a phase matching line pattern that forms the phase matching circuit is formed. In this structure, the wire bonding pads include wire bonding pads that are connected to both ends of the phase matching line pattern through vias formed in the laminated package. With this structure, the total resistance value of the vias can be reduced, and the insertion loss of the duplexer can also be reduced. This embodiment is embodied by the twelfth embodiment, for instance.

31) In the duplexer described in 12), the laminated package may contain a layer on which a die-attach unit is formed, and the two surface acoustic wave filters are mounted on the die-attach unit. In this structure, the die-attach unit has a larger area than that of at least one chip that forms the two surface acoustic wave filters. With this structure, the entire mounting surface of the chip can be presented as a ground surface, even if the chip is shifted from the designated position. This structure is embodied by the thirteenth embodiment, for instance.

32) In the duplexer described in 31), the die-attach unit may have leading patterns that are connected to connection paths formed on side surfaces of the laminated package. Each of the leading patterns has a width of 200 μm or greater. With this structure, the grounds are further reinforced, and the stop-band suppression can be further increased.

33) In the duplexer described in 12), the laminated package may contain a first layer that has wire bonding pads formed thereon, and a second layer that has a die-attach unit formed thereon, with the two surface acoustic wave filters being mounted on the die-attach unit. In this structure, the die-attach unit is connected to wire bonding pads to serve as grounds among the wire bonding pads, through vias formed in the laminated package and connection paths formed on side surfaces of the laminated package. With this structure, the grounds are further reinforced, and the stop-band suppression can be further increased. This structure is embodied by the fourteenth embodiment, for instance.

34) In the duplexer described in 12), the laminated package may contain a first layer on which a die-attach unit is formed, with the two surface acoustic wave filters being mounted on the die-attach unit, and a second layer on which a common ground is formed. In this structure, the die-attach unit is connected to the common ground through vias formed in the laminated package and connection paths formed on side surfaces of the laminated package. With this structure, the grounds are further reinforced, and the stop-band suppression can be further improved. This structure is embodied by the fifteenth embodiment, for instance.

35) In any of the duplexers described in 12) through 34), the last one of the dual-mode type surface acoustic wave filters in the other one of the two surface acoustic wave filters has a balanced output.

36) The present invention also provides an electronic device that includes: an antenna; a duplexer that is connected to the antenna; and a transmission system and a reception system that are connected to the duplexer. In this electronic device, the duplexer is one of the duplexers described in 1) through 35).

The invention claimed is:

1. A duplexer comprising:
two surface acoustic wave filters that are connected to a common terminal and have different band center frequencies; and
a phase matching circuit that matches the phases of the two surface acoustic wave filters to each other,
one of the two surface acoustic wave filters being a ladder type surface acoustic wave filter, while the other one of the two surface acoustic wave filters including a plurality of dual-mode type surface acoustic wave filters equal to three or more and connected in parallel.

2. The duplexer as claimed in claim 1, wherein the plurality of dual-mode type surface acoustic wave filters have a single-ended output.

3. The duplexer as claimed in claim 1, wherein the plurality of dual-mode type surface acoustic wave filters have a balanced output.

4. The duplexer as claimed in claim 1, wherein the ladder type surface acoustic wave filter is provided for transmission, while the plurality of dual-mode type surface acoustic wave filters are provided for reception.

5. The duplexer as claimed in claim 1, wherein the plurality of dual-mode type surface acousitic wave filters have outputs connected together.

6. The duplexer as claimed in claim 1, wherein the other one of the two surface acoustic wave filters has multiple stages cascaded and each of the multiple stages has the plurality of dual-mode type surface acoustic wave filters.

7. The duplexer as claimed in claim 1, wherein the other one of the two surface acoustic wave filters has two stages cascaded, and each of the two stages has the plurality of dual-mode type surface acoustic wave filters.

8. The duplexer as claimed in claim 1, wherein each of the plurality of dual-mode type surface acoustic wave filters has three interdigital transducers.

9. The duplexer as claimed in claim 1, wherein two surface acoustic wave filters are formed on a common substrate.

10. The duplexer as claimed in claim 1, wherein the ladder type surface acoustic wave filter has a series-arm resonators connected to the single common terminal of the duplexer.

11. The duplexer as claimed in claim 1, wherein a rise of the pass band of one of the two surface acoustic wave filters at least partially overlaps a fall of the pass band of the other one of the two surface acoustic wave filters.

12. A duplexer comprising:
two surface acoustic wave filters that are connected to a common terminal and have different band center frequencies; and
a phase matching circuit that matches the phases of the two surface acoustic wave filters to each other,
the two surface acoustic wave filters and the phase matching circuit being housed in a laminated package, and
one of the two surface acoustic wave filters being a ladder type surface acoustic wave filter, while the other one of the two surface acoustic wave filters including a plurality of dual-mode type surface acoustic wave filters equal to three or more and connected in parallel.

13. The duplexer as claimed in claim 12, wherein the phase matching circuit is formed by a line pattern.

14. The duplexer as claimed in claim 12, wherein the plurality of dual-mode surface acoustic wave filters has a 1.9 GHz pass band or higher.

15. The duplexer as claimed in claim 12, wherein:
the other one of the two surface acoustic wave filters has two stages cascaded, each of which has the plurality of dual-mode surface acoustic wave filters; and
a pattern for making a ground common between the two stages is formed on a layer other than intermediate layers in the laminated package.

16. The duplexer as claimed in claim 12, wherein:
the other one of the two surface acoustic wave filters has two stages cascaded, each of which has the plurality of dual-mode surface acoustic wave filters;
the laminated package contains a wire bonding pad layer that has a first pad and a second pad formed thereon, the first pad being connected to a ground of a first one of the two stages by wire bonding, and the second pad being connected to a ground of a second one of the two stages by wire bonding; and
the first and second pads function as independent grounds on the wire bonding pad layer.

17. The duplexer as claimed in claim 12, wherein:
the other one of the two surface acoustic wave filters has two stages cascaded, each of which has the plurality of dual-mode surface acoustic wave filters; and
grounds of the first and second stages are made common by a first layer that forms a upper surface of the laminated package and a second layer that forms a common ground.

18. The duplexer as claimed in claim 12, wherein:
the other one of the two surface acoustic wave filters has two stages cascaded, each of which has the plurality of dual-mode surface acoustic wave filters; and
a first pad and a second pad are both connected to external connection terminals formed on outer surfaces of the laminated package, the first pad being connected to a ground of a first one of the two stages by wire bonding, and the second pad being connected to a ground of a second one of the two stages by wire bonding.

19. The duplexer as claimed in claim 12, wherein each layer contained in the laminated package has a ground pattern that is connected to a ground terminal formed on an outer surface of the laminated package.

20. The duplexer as claimed in claim 12, wherein:
each intermediate layer contained in the laminated package has a ground pattern that is connected to a ground terminal formed on an outer surface of the laminated package; and
each ground pattern is located in such a position as to avoid-overlapping a signal line pattern formed on the laminated package and bonding pads connected to the signal line pattern.

21. The duplexer as claimed in claim 12, wherein:
the two surface acoustic wave filters having different band center frequencies are formed in a chip;
the other one of the two surface acoustic wave filters has two stages cascaded, each of which has the plurality of dual-mode type surface acoustic wave filters; and
a ground of each of the two stages is made common in the laminated package except the chip.

22. The duplexer as claimed in claim 12, further comprising:
a first chip that forms the one of the two surface acoustic wave filters; and
a second chip that form the other one of the two surface acoustic wave filters,
wherein:
the other one of the two surface acoustic wave filters has two stages cascaded, each of which has the plurality of dual-mode type surface acoustic wave filters; and
a ground of each of the two stages is made common in the laminated package except the chips.

23. The duplexer as claimed in claim 12, wherein:
the laminated package contains a layer that forms a common ground; and
the common ground is connected to external connection terminals formed on outer surfaces of the laminated package through connection paths formed on side surfaces of the laminated package and vias formed in the laminated package.

24. The duplexer as claimed in claim 12, wherein:
the other one of the two surface acoustic wave filters has two stages cascaded, each of which has the plurality of dual-mode type surface acoustic wave filters;
the laminated package contains a common ground layer; and
the common ground layer has a first common ground pattern that forms a ground surface for a first one of the the stages, and a second common ground pattern that forms a ground surface for a second one of the two stages.

25. The duplexer as claimed in claim 12, wherein:
the laminated package contains a first layer that has wire bonding pads formed thereon, and a second layer that is formed over the first layer and has a ring-like ground pattern; and
pads to serve as grounds among the wire bonding pads and the ring-like ground pattern are connected with vias formed in the laminated package.

26. The duplexer as claimed in claim 12, wherein:
the laminated package contains a first layer that has wire bonding pads formed thereon, and a second layer on which the phase matching circuit is formed;
the first layer also has a phase matching circuit formed thereon; and
the phase matching circuit formed on the first layer is connected to the phase matching circuit formed on the second layer through a via formed in the laminated package.

27. The duplexer as claimed in claim 26, wherein the phase matching circuit formed on the first layer is connected to and interposed between a common terminal of the duplexer and the two surface acoustic wave filters.

28. The duplexer as claimed in claim 26, wherein:
the phase matching circuit formed on the first layer has a line pattern; and
the via is formed in the line pattern.

29. The duplexer as claimed in claim 12, wherein:
the laminated package contains a first layer on which the phase matching circuit is formed, and a second layer on which a common ground is formed; and
the common ground is arranged in such a position as to cover the entire surface of the phase matching circuit.

30. The duplexer as claimed in claim 12, wherein:
the laminated package contains a first layer that has wire bonding pads formed thereon, and a second layer on which a phase matching line pattern for forming the phase matching circuit is formed; and
the wire bonding pads include wire bonding pads that are connected to both ends of the phase matching line pattern through vias formed in the laminated package.

31. The duplexer as claimed in claim 12, wherein:
the laminated package contains a layer on which a die-attach unit is formed, the two surface acoustic wave filters being mounted on the die-attach unit; and
the die-attach unit has a large area than that of at least one chip that forms the two surface acoustic wave filters.

32. The duplexer as claimed in claim 31, wherein:
the die-attach unit has leading patterns; and
the leading patterns are connected to connection paths formed on side surfaces of the laminated package, each of the leading patterns having a width of 200 um or greater.

33. The duplexer as claimed in claim 12, wherein:
the laminated package contains a first layer that has wire bonding pads formed thereon, and a second layer on which a die-attach unit is formed, the two surface acoustic wave filters being mounted on the die-attach unit;
the die-attach unit is connected to wire bonding pads serving as grounds among the wire bonding pads, through vias formed in the laminated package and connection paths formed on side surfaces of the laminated package.

34. The duplexer as claimed in claim 12, wherein:
the laminated package contains a first layer on which a die-attach unit is formed, with the two surface acoustic wave filters being mounted on the die-attach unit, and a second layer on which a common ground is formed; and
the die-attach unit is connected to the common ground through vias formed in the laminated package and connection paths formed on side surfaces of the laminated package.

35. The duplexer as claimed in claim 12, wherein the last one of the dual-mode type surface acoustic wave filters in the other one of the two surface acoustic wave filters has a balanced output.

36. An electronic device comprising:
an antenna;
a duplexer that is connected to the antenna; and a transmission system and a reception system that are connected to the duplexer, the duplexer including two surface acoustic wave filters that is commonly connected to the antenna and has different band center frequencies, and a phase matching circuit for matching the phases of the two surface acoustic wave filters to each other, and one of the two surface acoustic wave filters being a ladder type surface acoustic wave filter, while the other one of the two surface acoustic wave filters including a plurality of dual-mode type surface acoustic wave filters equal to three or more connected in parallel.

* * * * *